US008379000B2

(12) United States Patent
Tsuchi

(10) Patent No.: US 8,379,000 B2
(45) Date of Patent: Feb. 19, 2013

(54) DIGITAL-TO-ANALOG CONVERTING CIRCUIT, DATA DRIVER AND DISPLAY DEVICE

(75) Inventor: Hiroshi Tsuchi, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 832 days.

(21) Appl. No.: 12/453,818

(22) Filed: May 22, 2009

(65) Prior Publication Data

US 2009/0295767 A1 Dec. 3, 2009

(30) Foreign Application Priority Data

May 23, 2008 (JP) ................................. 2008-135449

(51) Int. Cl.
*G09G 5/00* (2006.01)
(52) U.S. Cl. ........ 345/204; 345/207; 345/209; 345/211; 345/213
(58) Field of Classification Search .................... 345/55, 345/87, 89, 100, 531, 174, 204–212; 341/116, 341/121, 134, 144, 145, 153, 156, 164, 154; 365/185.16, 189.12, 230.06; 348/630, 692, 348/695
See application file for complete search history.

(56) References Cited

U.S. PATENT DOCUMENTS

| | | | | |
|---|---|---|---|---|
| 5,278,785 A * | 1/1994 | Hazani | ..................... | 365/185.16 |
| 5,731,774 A | 3/1998 | Fujii et al. | | |
| 6,373,419 B1 | 4/2002 | Nakao | | |
| 6,441,763 B1 | 8/2002 | Nakao | | |
| 6,967,691 B2 * | 11/2005 | Keen | .............................. | 348/695 |
| 7,236,422 B2 * | 6/2007 | Kageyama et al. | ....... | 365/230.06 |
| 7,369,075 B2 * | 5/2008 | Ishii et al. | ....................... | 341/144 |
| 7,504,979 B1 * | 3/2009 | Knausz et al. | ................. | 341/154 |
| 7,812,752 B2 * | 10/2010 | Tsuchi et al. | ................. | 341/144 |
| 7,872,645 B2 * | 1/2011 | Myers | ............................ | 345/207 |
| 8,111,184 B2 * | 2/2012 | Tsuchi | .......................... | 341/145 |
| 2004/0027493 A1 * | 2/2004 | Keen | .............................. | 348/692 |
| 2006/0120203 A1 * | 6/2006 | Kageyama et al. | ....... | 365/230.06 |

(Continued)

FOREIGN PATENT DOCUMENTS

| | | |
|---|---|---|
| JP | 4-358418 A | 12/1992 |
| JP | 9-064746 A | 3/1997 |

(Continued)

OTHER PUBLICATIONS

Japanese Notice of Grounds for Rejection dated Aug. 7, 2012 with a partial English translation.

*Primary Examiner* — Prabodh M Dharia
(74) *Attorney, Agent, or Firm* — McGinn IP Law Group, PLLC

(57) ABSTRACT

A digital-to-analog converter, in which a plurality of reference voltages that differ from one another are grouped into first to (S+1)th reference voltage groups, includes a decoder and an amplifying circuit. The decoder includes: first to (S+1) th subdecoders for selecting respective ones of reference voltages corresponding to a value of a first bit group on an upper bit side of an input digital signal from the reference voltages of the first to (S+1)th reference voltage groups; and an (S+1)-input and 2-output type subdecoder for selecting and outputting two reference voltages out of reference voltages selected by the first to (S+1)th subdecoders, in accordance with a value of a second bit group on a lower side of the input digital signal. The amplifying circuit receives the two reference voltages as inputs and outputs a voltage level obtained by interpolation at a prescribed ratio.

20 Claims, 40 Drawing Sheets

U.S. PATENT DOCUMENTS

| | | | |
|---|---|---|---|
| 2006/0132344 A1* | 6/2006 | Ishii et al. | 341/144 |
| 2008/0143658 A1* | 6/2008 | Ishii et al. | 345/87 |
| 2009/0109077 A1* | 4/2009 | Tsuchi et al. | 341/144 |
| 2009/0213051 A1* | 8/2009 | Tsuchi | 345/87 |
| 2011/0181578 A1* | 7/2011 | Ohta et al. | 345/211 |
| 2011/0234571 A1* | 9/2011 | Tsuchi | 345/211 |
| 2012/0026154 A1* | 2/2012 | Tsuchi | 345/212 |
| 2012/0050206 A1* | 3/2012 | Welland | 345/174 |

FOREIGN PATENT DOCUMENTS

| | | |
|---|---|---|
| JP | 2000-183747 | 6/2000 |
| JP | 2002-43944 | 2/2002 |

* cited by examiner

FIG. 14

⟨NUMBER OF TRANSISTOR SWITCHES OF DECODER 10⟩

| | 8 BITS | 10 BITS |
|---|---|---|
| PRESENT INVENTION: FIGS. 3, 7 (S=4) | 329 | 1289 |
| PRESENT INVENTION: FIGS. 9, 12 (S=8) | 289 | 1153 |

INTERPOLATING AMPLIFIER OUTPUT:
$V_{out} = \{V(T1) + V(T2) + 2 \times V(T3)\}/4$

FIG. 21 m = 8

| level | REFERENCE VOLTAGES Vref | (Vo1,Vo2) T2 | T1 | D7 | D6 | D5 | D4 | D3 | D2 | D1 | D0 |
|---|---|---|---|---|---|---|---|---|---|---|---|
| 0 | Vrd1 | Vrd1 | Vrd1 | 0 | 0 | 0 | 0 | 0 | 0 | 0 | 0 |
| 1 | Vrd2 | Vrd2 | Vrd2 | 0 | 0 | 0 | 0 | 0 | 0 | 0 | 1 |
| 2 | Vrd3 | Vrd3 | Vrd3 | 0 | 0 | 0 | 0 | 0 | 0 | 1 | 0 |
| 3 | Vrd4 | Vrd4 | Vrd4 | 0 | 0 | 0 | 0 | 0 | 0 | 1 | 1 |
| 4 | Vr3 | Vr3 | Vr3 | 0 | 0 | 0 | 0 | 0 | 1 | 0 | 0 |
| 5 | Vr4 | Vr4 | Vr4 | 0 | 0 | 0 | 0 | 0 | 1 | 0 | 1 |
| 6 | Vr4 | Vr4 | Vr4 | 0 | 0 | 0 | 0 | 0 | 1 | 1 | 0 |
| 7 | Vr5 | Vr5 | Vr5 | 0 | 0 | 0 | 0 | 0 | 1 | 1 | 1 |
| 8 | Vr6 | Vr6 | Vr6 | 0 | 0 | 0 | 0 | 1 | 0 | 0 | 0 |
| 9 | Vr6 | Vr6 | Vr6 | 0 | 0 | 0 | 0 | 1 | 0 | 0 | 1 |
| 10 | Vr7 | Vr7 | Vr7 | 0 | 0 | 0 | 0 | 1 | 0 | 1 | 0 |
| 11 | Vr7 | Vr7 | Vr7 | 0 | 0 | 0 | 0 | 1 | 0 | 1 | 1 |
| 12 | Vr8 | Vr8 | Vr8 | 0 | 0 | 0 | 0 | 1 | 1 | 0 | 0 |
| 13 | Vr8 | Vr8 | Vr8 | 0 | 0 | 0 | 0 | 1 | 1 | 0 | 1 |
| 14 | Vr9 | Vr9 | Vr9 | 0 | 0 | 0 | 0 | 1 | 1 | 1 | 0 |
| 15 | Vr9 | Vr9 | Vr9 | 0 | 0 | 0 | 0 | 1 | 1 | 1 | 1 |
| 16 | Vr9 | Vr9 | Vr9 | 0 | 0 | 0 | 1 | 0 | 0 | 0 | 0 |
| 239 | Vr121 | Vr120 | Vr121 | 1 | 1 | 1 | 0 | 1 | 1 | 1 | 1 |
| 240 | Vr121 | Vr121 | Vr121 | 1 | 1 | 1 | 1 | 0 | 0 | 0 | 0 |
| 241 | Vr122 | Vr122 | Vr121 | 1 | 1 | 1 | 1 | 0 | 0 | 0 | 1 |
| 242 | Vr122 | Vr122 | Vr122 | 1 | 1 | 1 | 1 | 0 | 0 | 1 | 0 |
| 243 | Vr123 | Vr123 | Vr122 | 1 | 1 | 1 | 1 | 0 | 0 | 1 | 1 |
| 244 | Vr123 | Vr123 | Vr123 | 1 | 1 | 1 | 1 | 0 | 1 | 0 | 0 |
| 245 | Vr124 | Vr124 | Vr123 | 1 | 1 | 1 | 1 | 0 | 1 | 0 | 1 |
| 246 | Vr124 | Vr124 | Vr124 | 1 | 1 | 1 | 1 | 0 | 1 | 1 | 0 |
| 247 | Vr125 | Vr125 | Vr124 | 1 | 1 | 1 | 1 | 0 | 1 | 1 | 1 |
| 248 | Vr125 | Vr125 | Vr125 | 1 | 1 | 1 | 1 | 1 | 0 | 0 | 0 |
| 249 | Vr126 | Vr126 | Vr125 | 1 | 1 | 1 | 1 | 1 | 0 | 0 | 1 |
| 250 | Vr126 | Vr126 | Vr126 | 1 | 1 | 1 | 1 | 1 | 0 | 1 | 0 |
| 251 | Vr127 | Vr127 | Vr126 | 1 | 1 | 1 | 1 | 1 | 0 | 1 | 1 |
| 252 | Vr127(Vrd5) | Vrd5 | Vrd5 | 1 | 1 | 1 | 1 | 1 | 1 | 0 | 0 |
| 253 | Vrd6 | Vrd6 | Vrd6 | 1 | 1 | 1 | 1 | 1 | 1 | 0 | 1 |
| 254 | Vrd7 | Vrd7 | Vrd7 | 1 | 1 | 1 | 1 | 1 | 1 | 1 | 0 |
| 255 | Vrd8 | Vrd8 | Vrd8 | 1 | 1 | 1 | 1 | 1 | 1 | 1 | 1 |

UPPER SIDE ← → LOWER SIDE

DBLK1: levels 0–3
DBLK2: levels 4–251
DBLK3: levels 252–255

FIG. 30 m = 8

| level | Vref | (Vo,Vg2) T1 | T2 | D7 | D6 | D5 | D4 | D3 | D2 | D1 | D0 |
|---|---|---|---|---|---|---|---|---|---|---|---|
| 0 | Vrd1 | Vrd1 | Vrd1 | 0 | 0 | 0 | 0 | 0 | 0 | 0 | 0 |
| 1 | Vrd2 | Vrd1 | Vrd2 | 0 | 0 | 0 | 0 | 0 | 0 | 0 | 1 |
| 2 | Vrd3 | Vrd3 | Vrd3 | 0 | 0 | 0 | 0 | 0 | 0 | 1 | 0 |
| 3 | Vr3(=Vrd4) | Vrd4 | Vrd4 | 0 | 0 | 0 | 0 | 0 | 0 | 1 | 1 |
| 4 | Vr4 | Vr4 | Vr4 | 0 | 0 | 0 | 0 | 0 | 1 | 0 | 0 |
| 5 | Vr5 | Vr4 | Vr5 | 0 | 0 | 0 | 0 | 0 | 1 | 0 | 1 |
| 6 | Vr6 | Vr5 | Vr5 | 0 | 0 | 0 | 0 | 0 | 1 | 1 | 0 |
| 7 | Vr7 | Vr5 | Vr6 | 0 | 0 | 0 | 0 | 0 | 1 | 1 | 1 |
| 8 | Vr8 | Vr6 | Vr6 | 0 | 0 | 0 | 0 | 1 | 0 | 0 | 0 |
| 9 | Vr9 | Vr7 | Vr7 | 0 | 0 | 0 | 0 | 1 | 0 | 0 | 1 |
| 10 | Vr10 | Vr7 | Vr8 | 0 | 0 | 0 | 0 | 1 | 0 | 1 | 0 |
| 11 | Vr11 | Vr8 | Vr8 | 0 | 0 | 0 | 0 | 1 | 0 | 1 | 1 |
| 12 | Vr12 | Vr8 | Vr9 | 0 | 0 | 0 | 0 | 1 | 1 | 0 | 0 |
| 13 | Vr13 | Vr9 | Vr9 | 0 | 0 | 0 | 0 | 1 | 1 | 0 | 1 |
| 14 | Vr14 | Vr9 | Vr10 | 0 | 0 | 0 | 0 | 1 | 1 | 1 | 0 |
| 15 | Vr15 | Vr10 | Vr10 | 0 | 0 | 0 | 0 | 1 | 1 | 1 | 1 |
| 16 | Vr16 | Vr10 | Vr11 | 0 | 0 | 0 | 1 | 0 | 0 | 0 | 0 |
| ... | ... | ... | ... | | | | | | | | |
| 239 | Vr121 | Vr121 | Vr121 | 1 | 1 | 1 | 0 | 1 | 1 | 1 | 1 |
| 240 | Vr122 | Vr121 | Vr122 | 1 | 1 | 1 | 1 | 0 | 0 | 0 | 0 |
| 241 | Vr122 | Vr122 | Vr122 | 1 | 1 | 1 | 1 | 0 | 0 | 0 | 1 |
| 242 | Vr123 | Vr122 | Vr123 | 1 | 1 | 1 | 1 | 0 | 0 | 1 | 0 |
| 243 | Vr123 | Vr123 | Vr123 | 1 | 1 | 1 | 1 | 0 | 0 | 1 | 1 |
| 244 | Vr124 | Vr123 | Vr124 | 1 | 1 | 1 | 1 | 0 | 1 | 0 | 0 |
| 245 | Vr124 | Vr124 | Vr124 | 1 | 1 | 1 | 1 | 0 | 1 | 0 | 1 |
| 246 | Vr125 | Vr124 | Vr125 | 1 | 1 | 1 | 1 | 0 | 1 | 1 | 0 |
| 247 | Vr125 | Vr125 | Vr125 | 1 | 1 | 1 | 1 | 0 | 1 | 1 | 1 |
| 248 | Vr126 | Vr125 | Vr126 | 1 | 1 | 1 | 1 | 1 | 0 | 0 | 0 |
| 249 | Vr126 | Vr126 | Vr126 | 1 | 1 | 1 | 1 | 1 | 0 | 0 | 1 |
| 250 | Vr127 | Vr126 | Vr127 | 1 | 1 | 1 | 1 | 1 | 0 | 1 | 0 |
| 251 | Vr127 | Vr127 | Vr127 | 1 | 1 | 1 | 1 | 1 | 0 | 1 | 1 |
| 252 | Vrd5 | Vrd5 | Vrd5 | 1 | 1 | 1 | 1 | 1 | 1 | 0 | 0 |
| 253 | Vrd6 | Vrd6 | Vrd6 | 1 | 1 | 1 | 1 | 1 | 1 | 0 | 1 |
| 254 | Vrd7 | Vrd7 | Vrd7 | 1 | 1 | 1 | 1 | 1 | 1 | 1 | 0 |
| 255 | Vrd8 | Vrd8 | Vrd8 | 1 | 1 | 1 | 1 | 1 | 1 | 1 | 1 |
| 256 | | | | | | | | | | | |

REFERENCE VOLTAGES

UPPER SIDE ↔ LOWER SIDE

DBLK1: levels 0–3
DBLK2: levels 4–251
DBLK3: levels 252–256

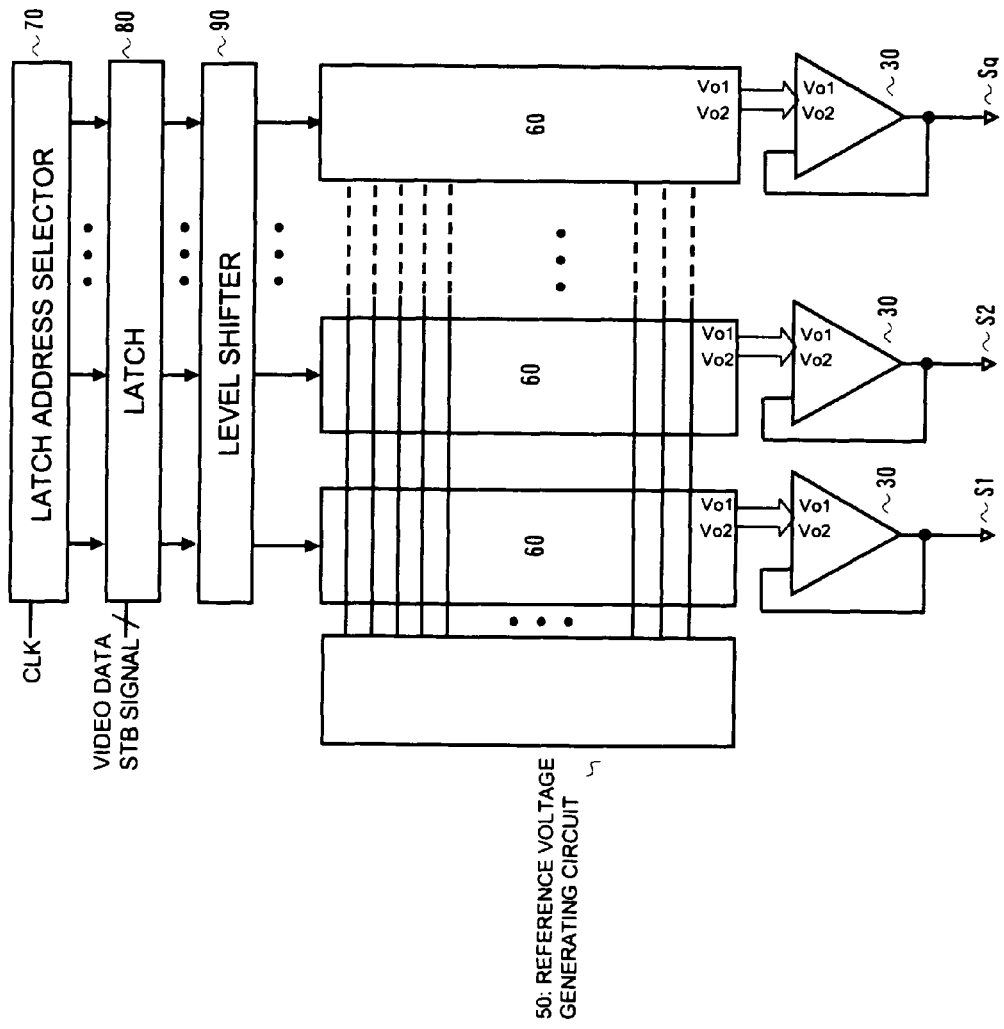

FIG. 33

| REFERENCE VOLTAGE GROUPS | ORDERING OF REFERENCE VOLTAGES IN EACH REFERENCE VOLTAGE GROUP | | | | | | | | |
|---|---|---|---|---|---|---|---|---|---|
| | 1 | 2 | 3 | ~ | j | ~ | h-1 | h |
| 1 | Vr1 | Vr(S+1) | Vr(2S+1) | ~ | Vr((j-1)S+1) | ~ | Vr((h-2)S+1) | Vr((h-1)S+1) |
| 2 | Vr2 | Vr(S+2) | Vr(2S+2) | ~ | Vr((j-1)S+2) | ~ | Vr((h-2)S+2) | Vr((h-1)S+2) |
| 3 | Vr3 | Vr(S+3) | Vr(2S+3) | ~ | Vr((j-1)S+3) | ~ | Vr((h-2)S+3) | Vr((h-1)S+3) |
| ... | ... | ... | ... | ... | ... | ... | ... | ... |
| i | Vr(i) | Vr(S+i) | Vr(2S+i) | ~ | Vr((j-1)S+i) | ~ | Vr((h-2)S+i) | Vr((h-1)S+i) |
| ... | ... | ... | ... | ... | ... | ... | ... | ... |
| S | VrS | Vr(2S) | Vr(3S) | ~ | Vr(jS) | ~ | Vr((h-1)S) | Vr(hS) |
| S+1 | Vr(S+1) | Vr(2S+1) | Vr(3S+1) | ~ | Vr(jS+1) | ~ | Vr((h-1)S+1) | Vr(hS+1) |

FIG. 34A

ORDERING OF REFERENCE VOLTAGES IN EACH REFERENCE VOLTAGE GROUP

| REFERENCE VOLTAGE GROUPS | 1 | 2 | 3 | ... | j | ... | h−1 | h |
|---|---|---|---|---|---|---|---|---|
| 1 | | Vr(S+1) | Vr(2S+1) | ... | Vr((j−1)S+1) | ... | Vr((h−2)S+1) | Vr((h−1)S+1) |
| 2 | | Vr(S+2) | Vr(2S+1) | ... | Vr((j−1)S+2) | ... | Vr((h−2)S+2) | Vr((h−1)S+2) |
| 3 | | Vr(S+3) | Vr(2S+1) | ... | Vr((j−1)S+3) | ... | Vr((h−2)S+3) | Vr((h−1)S+3) |
| ... | | ... | ... | ... | ... | ... | ... | ... |
| X−1 | | Vr(S+X−1) | Vr(2S+X−1) | ... | Vr((j−1)S+X−1) | ... | Vr((h−2)S+X−1) | Vr((h−1)S+X−1) |
| X | VrX | Vr(S+X) | Vr(2S+X) | ... | Vr((j−1)S+X) | ... | Vr((h−2)S+X) | ... |
| ... | ... | ... | ... | ... | ... | ... | ... | ... |
| Y | VrY | Vr(S+Y) | Vr(2S+Y) | ... | Vr((j−1)S+Y) | ... | Vr((h−2)S+Y) | Vr((h−1)S+Y) |
| Y+1 | Vr(Y+1) | Vr(S+Y+1) | Vr(2S+Y+1) | ... | Vr((j−1)S+Y+1) | ... | | |
| ... | ... | ... | ... | ... | ... | ... | | |
| S | VrS | Vr(2S) | Vr(3S) | ... | Vr(jS) | ... | Vr((h−1)S) | |
| S+1 | Vr(S+1) | Vr(2S+1) | Vr(3S+1) | ... | Vr(jS+1) | ... | Vr((h−1)S+1) | |

FIG. 34B jth REFERENCE VOLTAGE OF EACH REFERENCE VOLTAGE GROUP

| REFERENCE VOLTAGE GROUPS | 1 | 2 | 3 | ... | j | ... | h−1 | h |
|---|---|---|---|---|---|---|---|---|
| 1 | | Vr(S+1) | Vr(2S+1) | ... | Vr((j−1)S+1) | ... | Vr((h−2)S+1) | Vr((h−1)S+1) |
| 2 | | Vr(S+2) | Vr(2S+1) | ... | Vr((j−1)S+2) | ... | Vr((h−2)S+2) | Vr((h−1)S+2) |
| 3 | | Vr(S+3) | Vr(2S+1) | ... | Vr((j−1)S+3) | ... | Vr((h−2)S+3) | Vr((h−1)S+3) |
| ... | | ... | ... | ... | ... | ... | ... | ... |
| Y | | Vr(S+Y) | Vr(2S+Y) | ... | Vr((j−1)S+Y) | ... | Vr((h−2)S+Y) | Vr((h−1)S+Y) |
| Y+1 | | Vr(S+Y+1) | Vr(2S+Y+1) | ... | Vr((j−1)S+Y+1) | ... | | |
| ... | | ... | ... | ... | ... | ... | ... | ... |
| X−1 | | Vr(S+X−1) | Vr(2S+X−1) | ... | Vr((j−1)S+X−1) | ... | Vr((h−2)S+X−1) | Vr((h−1)S+X−1) |
| X | VrX | Vr(S+X) | Vr(2S+X) | ... | Vr((j−1)S+X) | ... | Vr((h−2)S+X) | |
| ... | ... | ... | ... | ... | ... | ... | ... | |
| S | VrS | Vr(2S) | Vr(3S) | ... | Vr(jS) | ... | Vr((h−1)S) | |
| S+1 | Vr(S+1) | Vr(2S+1) | Vr(3S+1) | ... | Vr(jS+1) | ... | Vr((h−1)S+1) | |

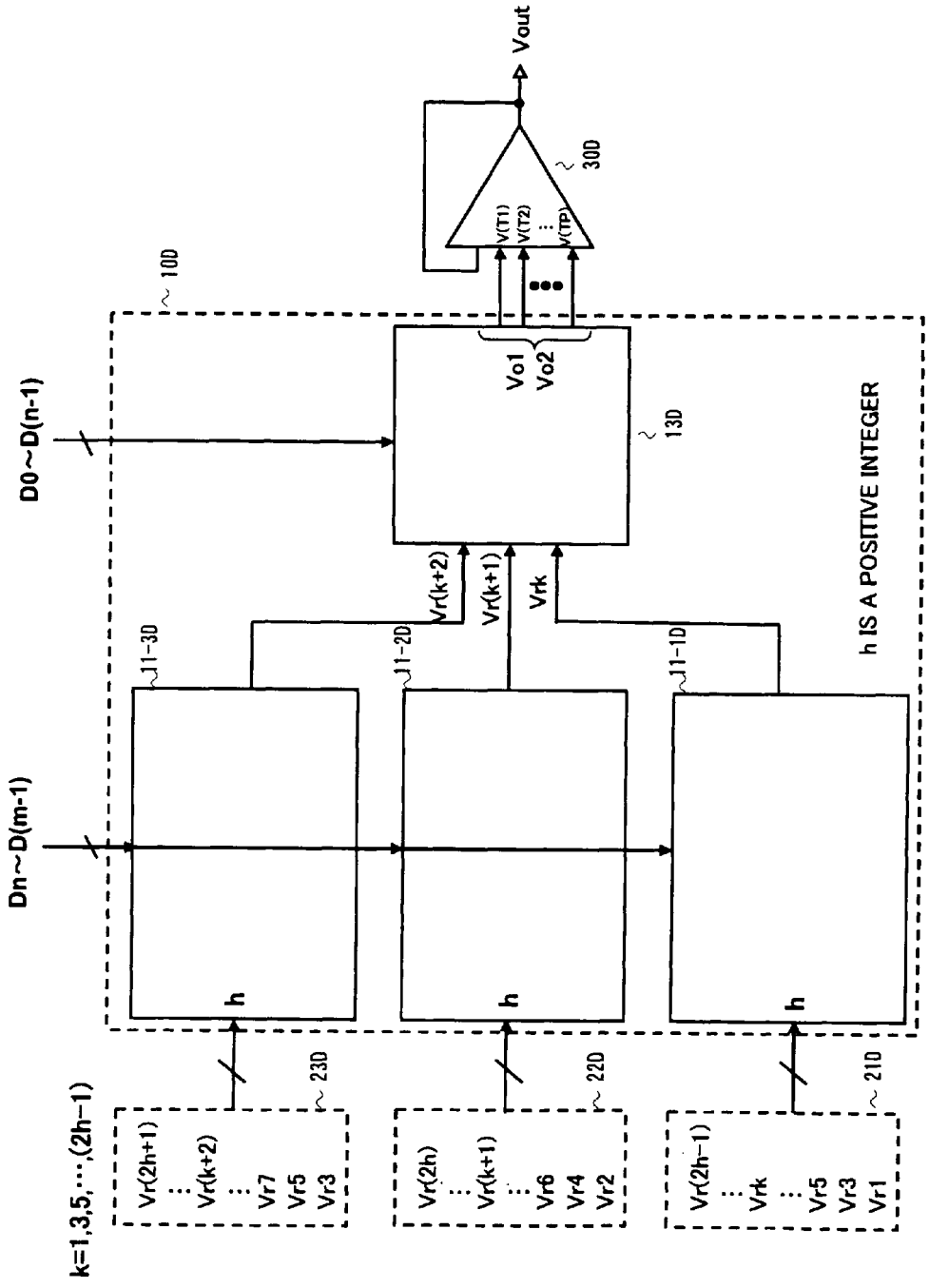
FIG. 35 REFERENCE CASE

US 8,379,000 B2

DIGITAL-TO-ANALOG CONVERTING CIRCUIT, DATA DRIVER AND DISPLAY DEVICE

FIELD OF THE INVENTION

Reference to Related Application

This application is based upon and claims the benefit of the priority of Japanese patent application No. 2008-135449, filed on May 23, 2008, the disclosure of which is incorporated herein in its entirety by reference thereto.

This invention relates to a digital-to-analog converting circuit, a data driver having this circuit and a display device having the data driver.

DESCRIPTION OF THE RELATED ART

Liquid crystal display devices (LCDs) characterized by their thin design, light weight and low power consumption have come into widespread use in recent years and are utilized in the display units of mobile devices such as portable telephones (mobile telephones or cellular telephones), PDAs (Personal Digital Assistants) and laptop personal computers. Recently, liquid crystal display devices provided with large-size screens and techniques for dealing with moving pictures have become more advanced, thus making it possible to realize not only mobile applications but also stay-at-home large-screen display devices and large-screen liquid crystal televisions. Liquid crystal display devices that rely upon active matrix drive scheme and are capable of presenting a high-definition display are being utilized as these liquid crystal display devices.

First, reference will be had to FIG. 38 to describe the typical configuration of a liquid crystal display device that employs active-matrix drive scheme. The principal components connected to one pixel of a liquid crystal display unit are illustrated schematically by equivalent circuits in FIG. 38.

In general, a display unit 960 of an active-matrix liquid crystal display device comprises a semiconductor substrate on which transparent pixel electrodes 964 and thin-film transistors (TFTs) 963 are laid out in the form of a matrix (e.g., 1280×3 pixel columns×1024 pixels rows in the case of a color SXGA panel); an opposing substrate on the entire surface of which a single transparent electrode 967 is formed; and a liquid crystal material sealed between these two substrates arranged to oppose each other. The liquid crystal has capacitance and forms a capacitor 965 between the pixel electrode 964 and the electrode 967. Often an auxiliary capacitor 966 for assisting the capacitance of the liquid crystal is provided.

In this liquid crystal display device, the TFT 963, which has a switching function, is turned on and off under the control of a scan signal. When the TFT 963 is on, a gray-level signal voltage that corresponds to a video data signal is applied to the pixel electrode 964, and the transmittance of the liquid crystal changes owing to a potential difference between each pixel electrode 964 and opposing-substrate electrode 967. This potential difference is held for a fixed period of time by the liquid-crystal capacitor 965 and auxiliary capacitor 966 even after the TFT 963 is turned off, as a result of which an image is displayed.

A data line 962 that sends a plurality of level voltages (gray-level signal voltages) applied to each pixel electrode 964 and a scan line 961 that sends the scan signal are arranged on the semiconductor substrate in the form of a grid (the data lines are 1280×3 in number and the scan lines are 1024 in number in the case of the above-mentioned color SXGA panel). The scan line 961 and data line 962 constitute a large capacitive load owing to the capacitance produced at the intersection of these lines and capacitance, etc., of the liquid crystal sandwiched between the pixel electrode and an opposing-substrate electrode.

It should be noted that the scan signal is supplied to the scan line 961 from a gate driver 970, and that the supply of gray-level signal voltage to each pixel electrode 964 is performed by a data driver 980 via the data line 962. Further, the gate driver 970 and data driver 980 are controlled by a display controller 950, a required clock CLK and control signals, etc., are supplied from the display controller 950, and video data is supplied to the data driver 980. At the present time, video data is principally digital data. A power-supply circuit 940 supplies driving power to the gate driver 970 and data driver 980.

Rewriting of one screen of data is carried out over one frame (1/60 of a second), data is selected successively every pixel row (every line) by each scan line, and a gray-level signal voltage is supplied from each data line within the selection interval.

Although the gate driver 970 need only supply at least a bi-level scan signal, it is required that the data driver 980 drive the data lines by gray-level signal voltages of multiple levels that conform to the number of gray levels. To this end, the data driver 980 has a digital-to-analog converter (DAC) comprising a decoder for converting video data to a gray-level signal voltage and an operational amplifier for amplifying the gray-level signal voltage and outputting the amplified signal to the data line 962.

Progress has been made in raising image quality (increasing the number of colors) in portable telephone terminals, laptop personal computers and liquid crystal TVs, etc. However, there is now growing demand for video data of six bits per each of the colors R, G, B (260,000 colors) and preferably 8-bit video data (26,800,000 colors) or higher.

For this reason, a data driver that outputs a gray-level signal voltage corresponding to multiple-bit video data is now required to output multiple gray-level voltages and, in addition, to produce highly accurate voltage outputs corresponding to tones. If the number of reference voltages generated in correspondence with multiple gray-level voltages is increased, then this causes an increase in the number of elements in a reference voltage generating circuit and in the number of switching transistors in the decoder circuit that selects reference voltages conforming to input video signals.

That is, progress in raising the number of gray levels (represented by eight to ten bits or more) used invites an increase in the area of the decoding circuitry and an increase in the cost of the driver. The area of a multiple-bit DAC depends greatly upon the decoder configuration.

A technique for reducing the number of reference voltages as well as the number of switching transistors in the decoder configuration by utilizing interpolation (an interpolating amplifier) is known in the art. A DAC having a configuration of the kind shown in FIG. 39 is disclosed in Patent Document 1 (Japanese Patent Kokai Publication No. 2000-183747) as related art of this type (see FIG. 1 in Patent Document 1). In accordance with digital data, a selecting circuit (decoder) 802 outputs a voltage obtained by selectively outputting two voltages out of a number of reference voltages that is one-half plus one the number of outputs of a reference voltage generating circuit 801 and interpolating the two voltages selected using an interpolating circuit (interpolating amplifier) 803. The selecting circuit (decoder) 802 successively selects bits from the most significant bit (MSB: bit 5) toward the least significant bit (LSB: bit 0) of input digital data. The numbers of switches in the selecting circuit (decoder) 802 are 74, 270 and 1042 if the input digital data is composed of six bits, eight bits and 10 bits, respectively.

FIG. 40 is a diagram illustrating a configuration disclosed in Patent Document 2 (Japanese Patent Kokai Publication No. JP-P2002-43944A). Here a DA converter 310 converts an N-bit digital signal to $2^N$ (where an operator ^ indicates a power) analog signals and includes a reference voltage generating circuit 318 for generating reference voltages of $2^A+1$ voltage levels; a reference voltage selecting circuit 316a for selecting two reference voltages having adjacent voltage levels in accordance with A bits of the digital signal; a generated-voltage selecting circuit 316b which, in accordance with N−A bits of the digital signal, selects one interpolated voltage out of $2^{(N-A)}$ interpolated voltages set in advance between the voltage levels of the two reference voltages; and a voltage follower circuit 317 for generating the interpolated voltage by linear interpolation based upon the two reference voltages.

According to the disclosure, the reference voltage selecting circuit 316a, in accordance with digital data, selects two voltages out of $\frac{1}{4}+1(=2^{(N-2)}+1)$ reference voltages with respect to $2^N$ outputs when A=N−2 holds, and the generated-voltage selecting circuit 316b receives the two voltages selected by the reference voltage selecting circuit 316a, controls the on/off operation of switches in accordance with lower order bits Bit0 and Bit1 of the digital signal and outputs the voltages to three terminals (IN1, IN2, IN3) of the voltage follower circuit 317. The reference voltage selecting circuit 316a of a selecting circuit 316 selects reference voltage successively from a upper bit (Bit5) toward lower order bits. The voltage follower circuit 317 receives the two voltages, which have been selected by the reference voltage selecting circuit 316a, at the three terminals and outputs a voltage level that is the result of dividing (internally) the two voltages into four by a weighting computation.

[Patent Document 1] Japanese Patent Kokai Publication No. JP-P2000-183747A

[Patent Document 2] Japanese Patent Kokai Publication No. JP-P2002-43944A

The entire disclosures of Patent Documents 1 and 2 are incorporated herein by reference thereto.

An analysis of the related art according to the present invention is given below.

With the configuration of the related art (Patent Document 1) described above with reference to FIG. 39, there are many wiring intersections between switches and the wiring area is large on the side of upper bits of the input digital data. For example, in FIG. 39, between switch pairs SW (5,1) to SW (5,17) controlled by Bit 5 and switch pairs SW (4,1) to SW (4,9) controlled by Bit 4, output line from SW (5,2) to SW (4,2) intersects output line from SW (5,9) to SW (4,1) (intersection at one location). Output wiring from SW (5,3) to SW (4,3) intersects output line from SW (5,9) to SW (4,1) and output line from SW (5,10) to SW (4,2) (intersection at two locations). Output wiring from SW (5,4) to SW (4,4) has intersections at three locations. Similarly, there are intersections at up to eight locations for the output line from SW (5,9) to SW (4,9), for a total of 36 intersections. Even though the number of these wiring intersections differs depending upon the placement of the switch pairs, a large number of wiring intersections is produced. If there is an increase in the number of bits, the number of wiring intersections increases even more on the side of the upper bits. For example, if a switch pair controlled by a Bit 6 as a bit of upper than Bit 5 is added on in FIG. 39, the number of wiring intersections between the switch pairs controlled by Bit 6 and Bit 5 is 136. In an actual device such as an LSI chip, there is a limit upon the number of layers that can be used for wiring (e.g., metal wiring layers). If the number of layers is increased, process cost rises. On the other hand, in cases where a circuit is formed using a small number of wiring layers, the larger the number of wiring intersections, the larger the layout area and the higher the chip cost. (The foregoing is an analysis by the inventor.)

The configuration of the selecting circuit in FIG. 40 also has a large number of wiring intersections between switching transistors at upper bits. The number of wiring intersections of the N-bit selecting circuit in FIG. 40 is about the same as the number of wiring intersections of the (N−2)-bit selecting circuit in FIG. 30. In the case of a multiple-bit selecting circuit such as an 8- or 10-bit selecting circuit (N=8, 10), the wiring area is large. (The foregoing is an analysis by the inventor.)

Thus, in the related art illustrated in FIGS. 39 and 40, the number of switching transistors in the decoder (selecting circuit) can be reduced. Owing to the wiring intersections, however, a problem encountered is that if there is an increase in the number of bits, there is a marked increase in locations where wiring intersects and an increase in layout area.

SUMMARY

Accordingly, an object of the present invention is to provide a digital-to-analog converting circuit, driver and display device in which it is possible to reduce area by reducing the number of reference voltages and in which an increase in number of wiring intersections is suppressed.

The invention, which seeks to solve one or more of the foregoing problems, is summarized as follows:

According to a first aspect of the present invention, there is provided a digital-to-analog converting circuit in which a plurality of reference voltages that differ from one another are grouped into first to (S+1)th reference voltage groups (where S is an integer that is a power of 2 and greater than or equal to 4), the first to (S+1)th reference voltage groups are assigned to rows and the orderings of the reference voltages, which belong to each of the reference voltage groups, within the reference voltage groups are assigned to columns, thereby forming a two-dimensional array of (S+1) rows and h columns (where h is an integer greater than or equal to 2), an array element of an ith row and jth column [where i is an integer greater than or equal to 1 and less than or equal to (S+1), and j is an integer greater than or equal to 1 and less than or equal to h)] corresponds to a [(j−1)×S+i]th reference voltage.

The digital-to-analog converting circuit comprises a decoder that includes:

first to (S+1)th subdecoders provided in correspondence with the first to (S+1)th reference voltage groups, respectively, for selecting reference voltages that have been assigned to a column, which corresponds to a value of a first bit group on an upper bit side of an input digital signal, in the two-dimensional array, the selection being made from the reference voltages of the first to (S+1)th reference voltage groups; and an (S+1)-input and 2-output type subdecoder, to which outputs from the first to (S+1)th subdecoders are input, for selecting and outputting two reference voltages, inclusive of redundant selection of the same reference voltage, out of reference voltages selected by the first to (S+1)th subdecoders, in accordance with a value of a second bit group on a lower side of the input digital signal.

The digital-to-analog converting circuit further comprises an amplifying circuit that receives the two reference voltages selected by the decoder and that outputs an output voltage level obtained by interpolating the two reference voltages.

In the present invention, an arrangement may be adopted in which the first to (S+1)th reference voltage groups each include reference voltages corresponding to first to hth columns in the first to (S+1)th rows of the two-dimensional array, as the plurality of reference voltages.

In the present invention, an arrangement may be adopted in which first to (X−1)th reference voltage groups [where X is an integer greater than or equal to 2 and less than or equal to (S+1)] each include reference voltages corresponding to respective ones of second to hth columns in first to (X−1)th rows of the two-dimensional array, as the plurality of reference voltages.

In the present invention, an arrangement may be adopted in which (Y+1)th (where Y is an integer greater than or equal to 1 and less than or equal to S) to (S+1)th reference voltage groups each include reference voltages corresponding to respective ones of first to (h−1)th columns in (Y+1)th to (S+1)th rows of the two-dimensional array, as the plurality of reference voltages.

In the present invention, an arrangement may be adopted in which first to (X−1)th reference voltage groups [where X is an integer greater than or equal to 2 and less than or equal to (S+1)] each include reference voltages corresponding to respective ones of second to hth columns in first to (X−1)th rows of the two-dimensional array, as the plurality of reference voltages, and (Y+1)th (where Y is an integer greater than or equal to X and less than or equal to S) to (S+1)th reference voltage groups each include reference voltages corresponding to respective ones of first to (h−1)th columns in (Y+1)th to (S+1)th rows of the two-dimensional array, as the plurality of reference voltages.

Alternatively, in the present invention, an arrangement may be adopted in which first to Yth reference voltage groups (where Y is an integer greater than or equal to 1 and less than or equal to S) each include reference voltages corresponding to respective ones of second to hth columns in first to Yth rows of the two-dimensional array, as the plurality of reference voltages; (Y+1)th to (X−1)th reference voltage groups [where X is greater than Y and less than or equal to (S+1)] each include reference voltages corresponding to respective ones of second to (h−1)th columns in (Y+1)th to (X−1)th rows of the two-dimensional array; and Xth to (S+1)th reference voltage groups each include reference voltages corresponding to respective ones of first to (h−1)th columns in Xth to (S+1)th rows of the two-dimensional array.

In the present invention, the first to (S+1)th subdecoders select of reference voltages, which have been assigned to the corresponding column of the two-dimensional array, in accordance with values of the first bit group of (m−n) bits (where m>n holds) on an upper side out of m bits (where m is a prescribed positive integer) of digital data; the first to (S+1)th subdecoders output a maximum of (S+1) reference voltages; and the (S+1)-input and 2-output type subdecoder selects and outputs two reference voltages, inclusive of redundant selection of the same reference voltage, out of reference voltages selected by the first to (S+1)th subdecoders, in accordance with values of the second bit group of n lower order bits. In the present invention, the first to (S+1)th subdecoders decode the (m−n) bits in order from the lower side toward the upper side thereof. Further, the (S+1)-input and 2-output type subdecoder decodes n bits in order from the most significant bit. Furthermore, the (S+1)-input and 2-output type subdecoder may switch the order of decoding to decoding from the lower side of the n bits.

In the present invention, the amplifying circuit, to which the two reference voltages selected by the decoder are input to at least two input terminals, outputs an interpolated voltage that is the result of taking the weighted mean of the reference voltages at the at least two input terminals at a prescribed ratio. Specifically, the digital-to-analog converting circuit comprises an amplifying circuit, to which the two reference voltages selected by the decoder are input to first and second input terminals, for outputting an interpolated voltage that is the result of taking the weighted mean of the reference voltages, which have been received at the first and second input terminals, at a predetermined ratio. Alternatively, the digital-to-analog converting circuit comprises an amplifying circuit, to which the two reference voltages selected by the decoder are input to first, second and third input terminals, for outputting an interpolated voltage that is the result of taking the weighted mean of the reference voltages, which have been received at the first, second and third input terminals, at a predetermined ratio.

In accordance with the digital-to-analog converting circuit of the present invention, the arrangement is such that the number of input reference voltages is reduced in systems having larger numbers of bits, the number of switching transistors in a decoder (selecting circuit) is reduced and an increase in wiring intersections is suppressed, thereby making it possible to reduce circuit area.

Further, in accordance with a data driver according to the present invention, an increase in the number of reference voltages and in the number of switching transistors of a decoder (selecting circuit) is suppressed in systems having larger numbers of bits, and a reduction in area (lower cost) can be achieved. Furthermore, in accordance with a display device according to the present invention, it is possible to reduce cost by using the above-mentioned data driver.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 14 is a diagram illustrating numbers of switching transistors in a decoder in second to fifth exemplary embodiments;

FIG. 21 is a diagram useful in describing third specifications of the exemplary embodiment shown in FIG. 19;

FIG. 30 is a diagram useful in describing fourth specifications of the exemplary embodiment shown in FIG. 19;

FIG. 32 is a diagram illustrating the configuration of an exemplary embodiment of a data driver according to a tenth exemplary embodiment of the present invention;

FIG. 33 is a diagram illustrating the details of grouping of reference voltages in FIGS. 1 and 20;

FIG. 34A is a diagram illustrating an example of grouping of reference voltages in FIG. 33, and FIG. 34B is a diagram illustrating another example of FIG. 34A;

FIG. 35 is a diagram illustrating the configuration of a case related to the present invention (comparative example);

PREFERRED MODES

Figure 1:
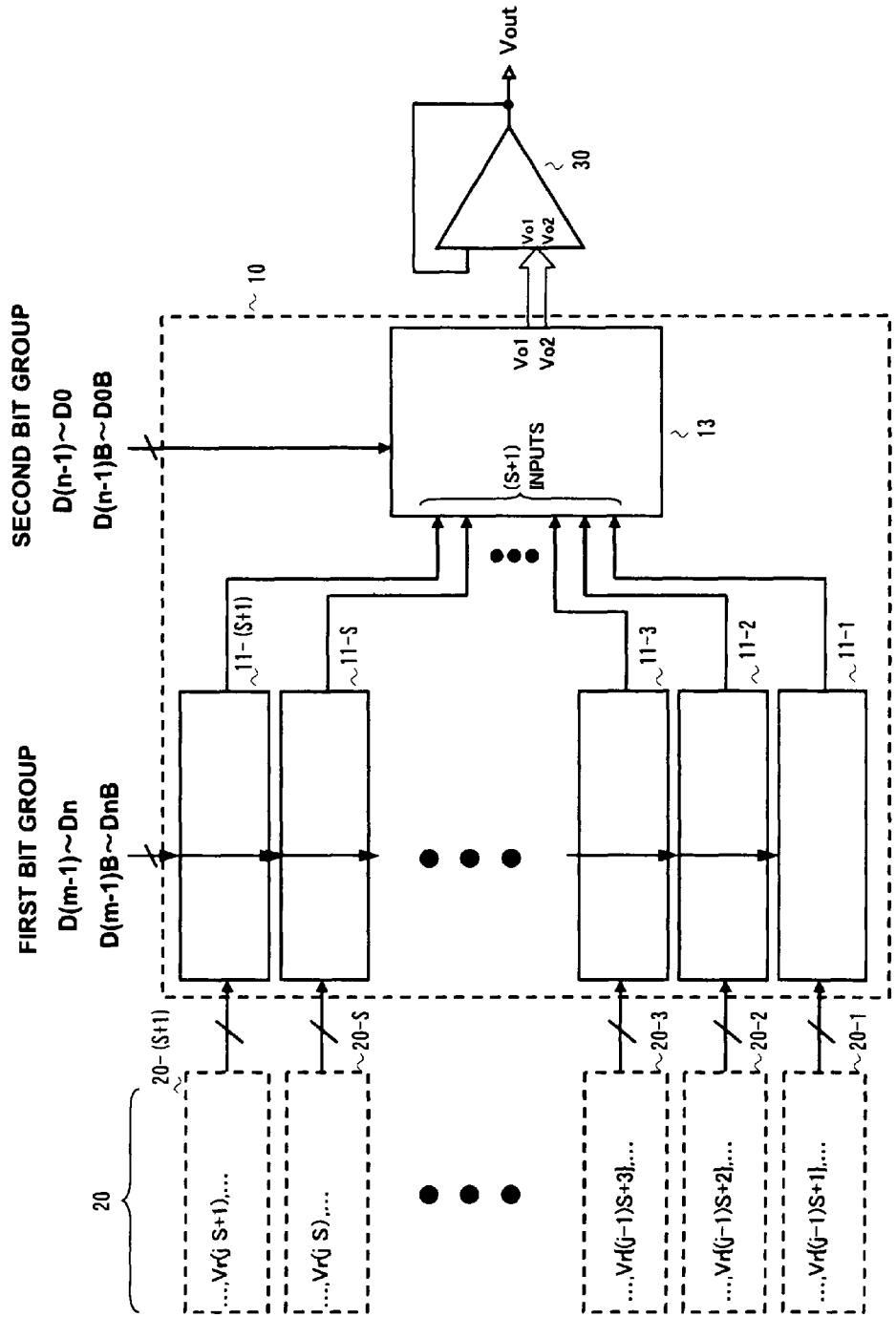
FIG. 1 is a diagram illustrating the configuration of a first exemplary embodiment of the present invention.

The present invention will now be described in detail with reference to the accompanying drawings. In an aspect of the present invention, a digital-to-analog converting circuit (DAC) selects, in accordance with an input digital signal of a prescribed number of bits (m bits), two reference voltages, inclusive of the selection in which the two reference voltages are the same, out of a plurality of a maximum of (h×S+1) (where S is an integer that is a power of 2 and greater than or equal to 4, and h is an integer greater than or equal to 2) reference voltages that differ from one another, and outputs a voltage level obtained by interpolating it from the two selected reference voltages. In the DAC, the maximum of (h×S+1) of ordered reference voltages are grouped into first to (S+1)th reference voltage groups [20-1 to 20-(S+1)]. In the grouping of the plurality of reference voltages, the first to (S+1)th reference voltage groups are assigned to rows and the orderings of the reference voltages, which belong to each of the reference voltage groups, within the reference voltage groups are assigned to columns, thereby forming a two-dimensional array of (S+1) rows and h columns (where h is an integer greater than or equal to 2). An array element of an ith row and jth column [where i is an integer greater than or equal to 1 and is less than or equal to (S+1), and j is an integer greater than or equal to 1 and less than or equal to h)] is set so as to correspond to a [(j−1)×S+i]th reference voltage among the plurality of reference voltages.

An arrangement may be adopted in which the first to (S+1)th reference voltage groups [20-1 to 20-(S+1)] each include reference voltages corresponding to first to hth columns in the first to (S+1)th rows of the two-dimensional array, as the plurality of reference voltages. More specifically, when the plurality of reference voltages are (h×S+1)-number of reference voltages [Vr1, Vr2, . . . Vr(S+1), Vr(S+2), . . . Vr(2×S+1), . . . Vr(3×S+1), . . . Vr(h×S+1)], each reference voltage group includes reference voltages at intervals of S. The first reference voltage group comprises {Vr1, Vr(S+1), Vr(2×S+1), . . . , Vr[(h−1)×S+1]}. The second reference voltage group comprises {Vr2, Vr(S+2), Vr(2×S+2), . . . , Vr[(h−1)×S+2]}. The (S+1)th reference voltage group comprises [Vr(S+1), Vr(2×S+1), Vr(3×S+1), . . . , Vr(h×S+1)]. In the ordering of the plurality of reference voltages, it is assumed that the magnitude relationship between the kth and (k+1)th reference voltages Vr(k) and Vr(k+1) in regard to the integer k (1≦k≦h×S) is such that Vr(k)<Vr((k+1) holds, although this does not impose any particular limitation.

It should be noted that an arrangement in which first to (X−1)th reference voltage groups [where X is an integer greater than or equal to 2 and less than or equal to (S+1)] in the first to (S+1)th reference voltage groups [20-1 to 20-(S+1)] exclude [Vr1 to Vr(X−1)] of the first column of the two-dimensional array may be adopted as an arrangement of reference voltages in which the plurality of reference voltages is smaller than (h×S+1). Alternatively, an arrangement in which (Y+1)th (where Y is an integer greater than or equal to 1 and less than or equal to S) to (S+1)th reference voltage groups exclude {Vr[(h−1)×S+Y+1] to Vr(h×S−1)} of the hth column of the two-dimensional array.

In this aspect of the present invention, the analog-to-digital converting circuit comprises a decoder (10, 10F) that includes: first to (S+1)th subdecoders [11-1 to 11-(S+1), 11-1F to 11-(S+1)F] provided in correspondence with the first to (S+1)th reference voltage groups, for selecting, in accordance with values of a first bit group [D(m−1) to Dn and their complementary signals D(m−1)B to DnB] on an upper bit side of an input digital signal, reference voltages that have been assigned to a column corresponding to the values of the first bit group from among the columns of the two-dimensional array, the selection being made from the reference voltages of the first to (S+1)th reference voltage groups; and an (S+1)-input and 2-output type subdecoder (13), to which outputs from the first to (S+1)th subdecoders[11-1 to 11-(S+1), 11-1F to 11-(S+1)F] are input, for selecting and outputting two reference voltages, inclusive of redundant selection of the same reference voltage, out of a maximum of up to (S+1) reference voltages selected by the first to (S+1)th subdecoders, in accordance with a value of a second bit group [D(n−1) to D0 and complementary signals D(n−1)B to D0B] on a lower side of the input digital signal. The digital-to-analog converting circuit further comprises an amplifying circuit (30), to which the two reference voltages selected by the decoder (10) are input to at least two input terminals, for outputting an interpolated voltage that is the result of taking the weighted mean of the reference voltages at the at least two input terminals at a prescribed ratio. An arrangement in which the two reference voltages selected by the decoder (10A, 10A', 10B, 10B', 10FA, 10FB) are input to first and second input terminals and an interpolated voltage that is the result of taking the weighted mean of the reference voltages, which have been received at the at first and second input terminals, at a prescribed ratio is output may be adopted as the amplifying circuit (30A). Alternatively, an arrangement in which the two reference voltages selected by the decoder (10C) are input to first, second and third input terminals and an interpolated voltage that is the result of taking the weighted mean of the reference voltages, which have been received at the first, second and third terminals, at a prescribed ratio is output may be adopted as the amplifying circuit (30C). Exemplary embodiments of the present invention will now be described.

FIG. 1 is a diagram illustrating the configuration of a first exemplary embodiment of the present invention. As shown in FIG. 1, a digital-to-analog converting circuit (DAC) selects two adjacent reference voltages in accordance with m-bit digital data (where m is a prescribed positive integer such as 8) and interpolates the two selected reference voltages with a prescribed ratio to output the so interpolated signal.

A maximum of (h×S+1) (where S is an integer that is a power of 2 and greater than or equal to 4 and h is an integer greater than or equal to 2) reference voltages [Vr1, Vr2, . . . Vr(S+1), Vr(S+2), . . . Vr(2×S+1), . . . Vr(3×S+1), . . . , Vr(h×S+1)] [where the following holds: Vr1<Vr2<Vr3<Vr4, . . . , Vr(S)<Vr(S+1)<Vr(S+2), . . . Vr(2×S)×Vr(2×S+1), . . . , Vr(3×S)<Vr (3×S+1), . . . , <Vr(h×S+1)] that are output from a reference voltage generating circuit (not shown) are grouped into first to (S+1)th reference voltage groups 20-1 to 20-(S+1). FIG. 33 illustrates a detailed example of grouping of a plurality of reference voltages.

With reference to FIG. 33, first to (S+1)th reference voltage groups and orderings of the reference voltages, which belong to each of the reference voltage groups, within each of the reference voltage group are assigned to rows and columns, respectively, of a two-dimensional array of (S+1) rows and h columns, and an element of an ith row and jth column [where i is an integer greater than or equal to 1 and less than or equal to (S−1), and j is an integer greater than or equal to 1 and less than or equal to h] corresponds to a reference voltage Vr[(j−1)×S+i].

That is, the first reference voltage group 20-1 comprises reference voltages {Vr1, Vr(S+1), Vr(2×S+1), . . . , Vr[(h−1)×S+1]} at intervals of S assigned to the first row of the two-dimensional array.

The second reference voltage group 20-2 comprises reference voltages {Vr2, Vr(S+2), Vr(2×S+2), . . . , Vr[(h−1)×S+2]} at intervals of S assigned to the second row of the two-dimensional array.

The ith [where 1≦i≦(S+1)] reference voltage group 20-i comprises reference voltages {Vr(i), Vr(S+i), Vr(2×S+i), . . . , Vr[((h−1)×S+i]} at intervals of S assigned to the ith row of the two-dimensional array.

The (S+1)th reference voltage group 20-(S+1) comprises reference voltages [Vr(S+1), Vr(2×S+1), Vr(3×S+1), . . . , Vr(h×S+1)] at intervals of S assigned to the (S+1)th row of the two-dimensional array.

The second reference voltage in the first reference voltage group 20-1 and the first reference voltage in the (S+1)th reference voltage group 20-(S+1) are the same, namely Vr(S+1). That is, the reference voltages, which belong to the first reference voltage group 20-1, assigned to the first row, second to hth columns of the two-dimensional array are the same as the reference voltages, which belong to the (S+1)th reference voltage group 20-(S+1), assigned to the (S+1)th row, first to (h−1)th columns of the two-dimensional array.

Such an arrangement may be adopted that excludes the reference voltages [Vr1 to Vr(X−1)], which belong to the first to (X−1)th (where 2≦X≦S) reference voltage groups, assigned to the first to (X−1)th rows, first column of the two-dimensional array (see FIGS. 34A and 34B).

Alternatively, such an arrangement may be adopted that excludes the reference voltages {Vr[(h−1)×S+Y+1] to Vr(h×S−1)}, which belong to the (Y+1)th (where 1≦Y≦S) to (S+1)th reference voltage groups, assigned to the (Y+1)th to (S+1)th rows, hth column of the two-dimensional array (see FIGS. 34A and 34B).

In accordance with the m-bit digital data, the decoder 10 selects two reference voltages, levels of which are the same or adjacent. The decoder 10 has first to (S+1)th subdecoders 11-1 to 11-(S+1) for selecting reference voltages {Vr[(j−1)×S+1] to Vr(j×S+1)}, which have been assigned to a corresponding column (e.g., the jth column, where j is an integer greater than or equal to 1 and less than or equal to h), in accordance with values of a first bit group [higher-order D(m−1) to Dn and their complementary signals D(m−1)B to DnB] among the m bits. When jth column selected is j=2, 3, 4, . . . , (h−1), each of the first to (S+1)th subdecoders 11-1 to 11-(S+1) selects and outputs one reference voltage [for a total of (S+1) adjacent reference voltages]. When the jth column selected is 1 or h (j=1 or h), there is a case (FIG. 33) where each of the first to (S+1)th subdecoders 11-1 to 11-(S+1) selects one reference voltage [for a total of (S+1) adjacent reference voltages] and a case (FIGS. 34A, 34B) where the first to (S+1)th subdecoders 11-1 to 11-(S+1) select fewer than (S+1) reference voltages. The decoder 10 further includes a subdecoder 13, to which a maximum of (S+1) voltages selected by the first to (S+1)th subdecoders 11-1 to 11-(S+1) are input in parallel, for selecting and outputting two reference voltages (Vo1, Vo2), inclusive of redundant selection of the same reference voltage, in accordance with a second bit group [lower-order D(n−1) to D0 and their complementary signals D(n−1)B to D0B] among m bits. The two reference voltages (Vo1, Vo2) selected by the decoder 10 are input to an interpolating amplifier 30, which amplifies and outputs an interpolated voltage level obtained by taking the weighted mean at a prescribed ratio.

The subdecoders 11-1 to 11-(S+1) perform decoding in order from bits (Dn, DnB) on the lower side of the first bit group D(m−1) to Dn, D(m−1)B to DnB toward bits [D(m−1), D(m−1)B] on the upper side [D(m−1) is the MSB (Most Significant Bit)].

The subdecoder 13 performs decoding in order from the most significant bit [D(n−1), D(n−1)B] of the second bit group D(n−1) to D0, D(n−1)B to D0B (where D0 is the LSB (Least Significant Bit)]. At this time it is permissible to switch the order of decoding of some of the bits on the lower side among the bits D(n−1) to D0, D(n−1)B to D0B [for example, it is possible to switch the order of (D0, D0B) and (D1, D1B)].

An invention related to the present invention will now be described. FIG. 35 is a diagram illustrating the configuration of an invention (comparative example) related to the present invention. In this digital-to-analog converting circuit, as shown in FIG. 35, first to (2×h+1)th reference voltages (where h is a prescribed positive integer) Vr1 to Vr(2×h+1) [where Vr1<Vr2, . . . <Vr(2h)<Vr(2h+1) holds, which are output from a reference voltage generating circuit (not shown), are grouped into a first reference voltage group 21D comprising h-number of (2×j−1)th (where j is a prescribed positive integer of 1 to h) reference voltages; a second reference voltage group 22D comprising h-number of (2×j)th reference voltages; and a third reference voltage group 23D comprising h-number of (2×j+1)th reference voltages. The digital-to-analog converting circuit includes a decoder 10D, which selects reference voltages based upon an input digital signal, and an amplifying circuit 30D.

The decoder 10 includes:

a first subdecoder 11-1D for receiving the h-number of reference voltages Vr1, Vr3, . . . , Vrk, . . . , and Vr(2h−1) of the first reference voltage group 21D and selecting one reference voltage Vrk based upon a first bit group [Dn to D(m−1)] of the input digital signal;

a second subdecoder 11-2D for receiving the h-number of reference voltages Vr2, Vr4, . . . , Vr(k+1), . . . , and Vr(2h) of the second reference voltage group 22D and selecting one reference voltage Vr(k+1) based upon the first bit group [Dn to D(m−1)] of the input digital signal;

a third subdecoder 11-3D for receiving the h-number of reference voltages Vr3, Vr5, . . . , Vr(k+2), . . . , and Vr(2h+1) of the third reference voltage group 23D and selecting one reference voltage Vr(k+2) based upon the first bit group [Dn to D(m−1)] of the input digital signal; and a 3-input, 2-output subdecoder 13D for receiving three adjacent reference voltages [Vrk, Vr(k+1), Vr(k+2)] selected by the first, second and third subdecoders 11-1D, 11-2D, and 11-3D, respectively, selecting two reference voltages Vo1 and Vo2 (inclusive of selecting the same voltage redundantly) based upon a second bit group [D(n−1) to D0] of the input digital signal, and outputting the selected voltages. With regard to the (2h+1) reference voltages Vr1, Vr2, Vr3, . . . , Vr(2h), and Vr(2h+1), the grouping of the reference voltages into the first to third reference voltage groups 21D, 22D, and 23D is such that the (j+1)th (j=1 to h) reference voltage Vr(2j+1) of the first reference voltage group 21D is made the same as the jth reference voltage Vr(2j+1) of the third reference voltage group 23D. It should be noted that the input digital signal forms a pair with a complementary signal, although this is not described here.

The first to third subdecoders 11-1D to 11-3D each receive h-number of input reference voltages, are identically constructed and each selects one reference voltage from a respective one of the first to third reference voltage groups 21D, 22D, and 23D in accordance with the values of the first bit group Dn to D(m−1) (where 0<n<m−1 holds) forming part of the m-bit input digital signal. The first, second and third subdecoders 11-1D, 11-2D, and 11-3D select and output three adjacent reference voltages Vrk, Vr(k+1), and Vr(k+2).

In accordance with the values of the bit sequence of the second bit group D(n−1) to D0, the subdecoder 13D selects two identical or neighboring reference voltages Vo1 and Vo2 from among the three reference voltages Vrk, Vr(k+1), and Vr(k+2) selected by the first, second and third subdecoders 11-1D, 11-2D, and 11-3D, respectively, and outputs these to P-number (where P is a prescribed integer greater than or equal to 2) of input terminals T1 . . . TP of the amplifying circuit 30D. The subdecoder 13D to which the three neighboring reference voltages [Vrk, Vr(k+1), Vr(k+2)] are input selects and outputs one pair of reference voltages as the two voltages (Vo1, Vo2), namely one pair of reference voltages from among identical reference voltage pairs (Vrk, Vrk), [Vr(k+1), Vr(k+1)], [Vr(k+2), Vr(k+2)] and mutually adjacent reference voltage pairs [Vrk, Vr(k+1)], [Vr(k+1), Vrk], [Vr(k+1), Vr(k+2)], and [Vr(k+2), Vr(k+1)].

The amplifying circuit 30D, which comprises an interpolating amplifier, accepts the voltages Vo1 and Vo2 that have been output from the subdecoder 13D, these being received at input terminals T1 to TP inclusive of identical signals being received at the input terminals, and outputs a prescribed arithmetic result (combined voltage) in relation of the voltages applied to the input terminals T1 to TP.

In this case where the plurality of reference voltages are divided into three groups, as illustrated in the arrangement of FIG. 35, there is an overlapping of reference voltages between the two reference voltage groups 21D and 23D. As a consequence, the switching transistors of the subdecoders 11-1D to 11-3D that select the reference voltages are large in number and the area occupied is large.

In the case of the arrangement of FIG. 35, the reference voltage groups 21D and 23D each include odd-numbered reference voltages and all reference voltages Vr3, Vr5, Vr7, . . . , and Vr(2h−1), with the exception of the first reference voltage Vr1 of the reference voltage group 21D and hth reference voltage Vr(2h+1) of the reference voltage group 22D, overlap between the reference voltage groups 21D and 23D. In the case of an arrangement in which the amplifying circuit 30D takes the weighted mean of the voltages Vo1 and Vo2 at a ratio of 1:1 [Vout=(Vo1+Vo2)/2], the number of switching transistors of the decoder 10D in FIG. 35 is 386 (h=64) with an 8-bit decoder and 1538 (h=256) with a 10-bit decoder.

By contrast, in the case of the first exemplary embodiment of FIG. 1 [in which the number of reference voltages is (h×s+1)], all reference voltages Vr(S+1), Vr(2×S+1), . . . , and Vr[(h−1)×S+1], with the exception of the lower-limit reference voltage Vr1 and upper-limit reference voltage Vr(h×S+1), overlap between first reference voltage group 20-1 and (S+1)th reference voltage group 20-(S+1). However, in a case where the total number (h×S+1) of the plurality of reference voltages that differ from one another is the same as in the arrangement of FIG. 35 (which corresponds to S=2), the number (h−1) of reference voltages that overlap in the arrangement of FIG. 1, decreases with an increase in the value of S and is reduced in comparison with the arrangement of FIG. 35. That is, in a case where the total number of reference voltages in FIG. 1 and FIG. 35 is the same of 129, for example. The number of groups in FIG. 35 is three. The number of reference voltages included in one reference voltage group in FIG. 35 is 64, and the number of reference voltages that overlap is 63. In FIG. 1, on the other hand, the number of groups is (S+10 (where S is a power of 2 and greater than or equal to 4, i.e., S=4, 8, 16, . . . ). The number of reference voltages included in one reference voltage group in FIG. 1 is (128/S) which is reduced in comparison with the arrangement of FIG. 35. The number of reference voltages that overlap between the first reference voltage group 20-1 and the (S+1)th reference voltage group 20-(S+1) is (128/S−1) which is reduced in comparison with the arrangement of FIG. 35. As a result, the number of switching transistors in the subdecoders 11-1 to 11-(S+1) in FIG. 1 can be reduced and it is possible to achieve a reduction in area in comparison with the arrangement of FIG. 35.

FIG. 2A is a diagram illustrating a specific example of specifications (first specifications) in the form of a table regarding the exemplary embodiment [where the number of reference voltages is (h×S+1) and the two-dimensional array is that shown in FIG. 33] described with reference to FIG. 1. FIG. 2B illustrates the amplifying circuit 30 (interpolating amplifier 30A) of FIG. 1 corresponding to the specifications of FIG. 2A. In the example of FIGS. 2A and 2B, it is assumed that m=8 holds with regard to the number of bits of the digital input signal and that the number of reference voltages is 129.

In FIG. 2A, the "level" column (0 to 256) shows the output voltage levels of the interpolating amplifier 30A. It is possible to output 256 levels of 0 to 255 in accordance with the 8-bit digital input signal D7 to D0 applied to the decoder 10. Further, the "Vref" column indicates the correspondence between output levels and reference voltages Vr1 to Vr129. Reference voltages Vr1 to Vr128 are each set to expected values of output voltages of every other two levels and correspond to even-numbered levels 0, 2, 4, ..., and 254 in FIG. 2A. The reference voltage Vr129 corresponds to the level (which corresponds to level 256) that follows level 255. Further, "T1" and "T2" stand for the two input terminals of the interpolating amplifier 30A.

With reference to FIG. 2B, the interpolating amplifier 30A is of voltage-follower construction including two non-inverting input terminals T1 and T2 and an inverting input terminal to which an output terminal is feedback-connected. Output terminal voltage Vout is given by interpolated voltage Vout=[V(T1)+V(T2)]/2 obtained by taking the weighted mean of voltages V(T1) and V(T2), which are input to the input terminals T1 and T2, respectively, at a ratio of 1:1.

Figure 2:
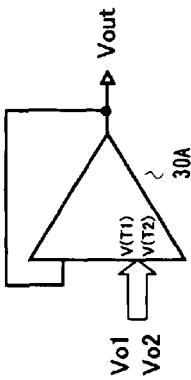
FIG. 2A is a diagram useful in describing first specifications of the exemplary embodiment.
FIG. 2B is a diagram useful in describing an amplifying circuit.
Figure 3:
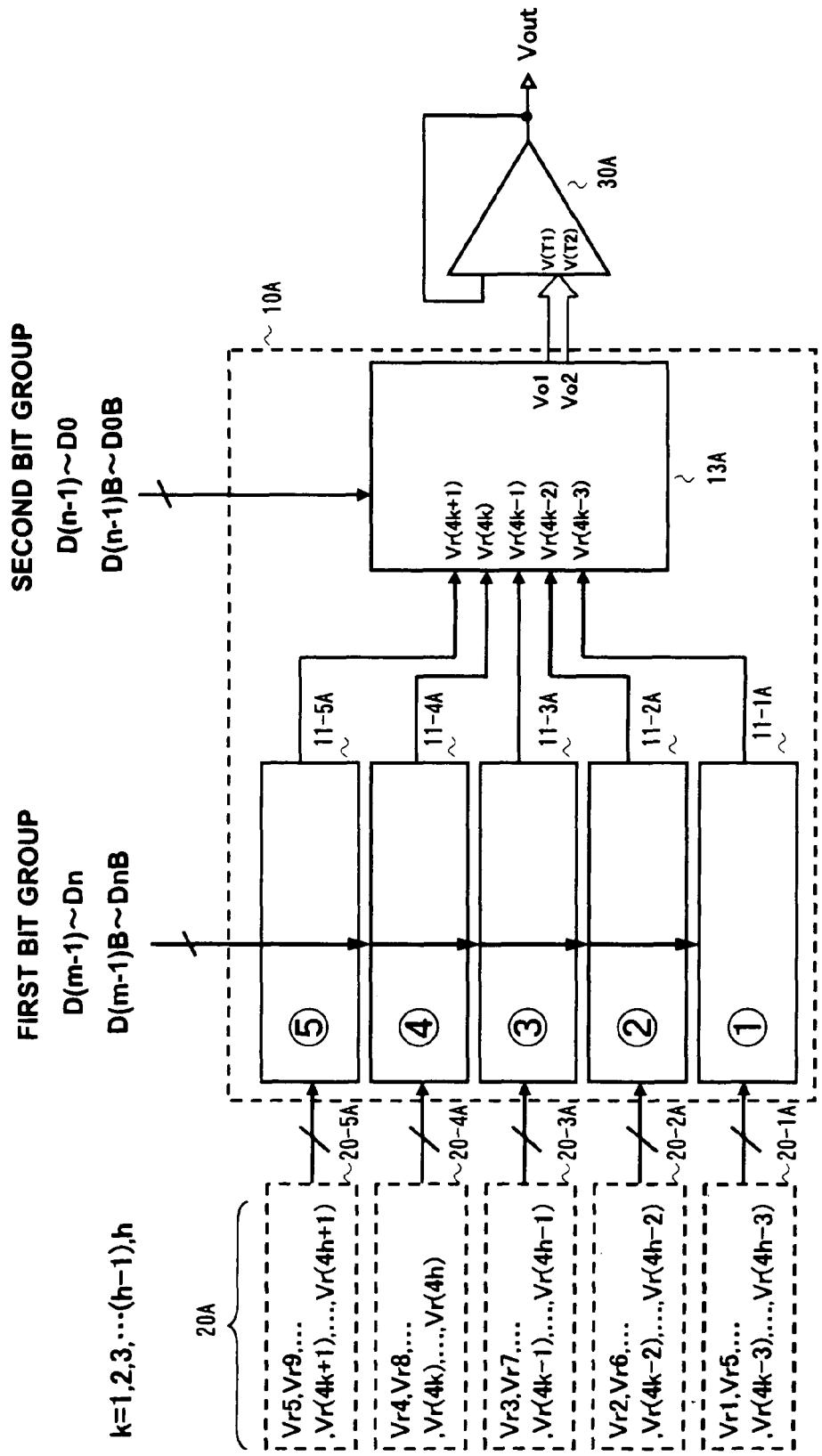
FIG. 3 is a diagram illustrating the configuration of a second exemplary embodiment (in a case where S=4 in FIG. 1) of the present invention.

FIG. 3 is a diagram illustrating the configuration of a second exemplary embodiment of the present invention. This exemplary embodiment is a diagram illustrating an example of the configuration of FIG. 1 that is in accordance with the specifications of FIG. 2. FIG. 3 is a diagram illustrating the configuration of an exemplary embodiment in which it is assumed that the number of reference voltage groups is five (S=4). The reference voltages are divided into five (S=4) reference voltage groups 20-1A to 20-5A so that the two-dimensional array in FIG. 33 becomes one having five rows and h columns.

With reference to FIG. 3, in which m=8 (the number of bits forming the input digital signal) and n=3 hold, decoder 10A includes five subdecoders 11-1A to 11-5A each for selecting and outputting one voltage [Vr(4k−3) to Vr(4k+1)] in accordance with the five upper bits (D7 to D3, D7B to D3B) of the digital signal; and subdecoder 13A for selecting and outputting two adjacent or identical reference voltages (Vo1, Vo2), in accordance with the three lower order bits (D2 to D0, D2B to D0B) of the digital signal, out of the five adjacent voltages [Vr(4k−3) to Vr(4k+1)] selected by the subdecoders 11-1A to 11-5A.

Bits D7 to D3 and their complementary signals D7B to D3B correspond to D(m−1) to Dn and D(m−1)B to DnB in FIG. 1 and form a digital signal of upper 8−3=5 bits, and D2 to D0 in FIG. 3 correspond to D(n−1) to D0 of FIG. 1 and form a digital signal of three lower order bits.

The arrangement of FIG. 3 is such that in FIG. 2A, eight consecutive levels are set as one section, four adjacent reference voltages are assigned to this section, the level at the end of this one section (namely the eighth level from the lower side) shares the one reference voltage having the lowest level in the adjacent section, a total of 256 voltage levels of levels 0 to 255 are partitioned into 32 sections and the number of reference voltages is 4×32+1=129 voltages.

More specifically, and by way of example, reference voltages Vr1, Vr2, Vr3, and Vr4 are assigned to the section (first section) of levels 0 to 7. Levels 0 to 6 are generated by interpolating them from two identical or adjacent reference voltages among the reference voltages assigned to the first section, and level 7 at the end of the first section is generated by interpolating it from the lowest-level reference voltage Vr5, which belongs to the adjacent second section (levels 8 to 15), and the fourth reference voltage Vr4 of the first section. Similarly, reference voltages Vr5, Vr6, Vr7, and Vr8 are assigned to the second section of levels 8 to 15, and level 15 at the end of this section is generated by interpolating it from reference voltage Vr9 of the adjacent third section (levels 16 to 23) and the reference voltage Vr8 of the second section. Reference voltages Vr125, Vr126, Vr127, and Vr128 are assigned to the 32nd section of levels 252 to 255, and level 255 at the end of this section is generated by interpolating it from reference voltage Vr129, which is not included in a section, and the reference voltage Vr128 of the 32nd section.

Figure 4:
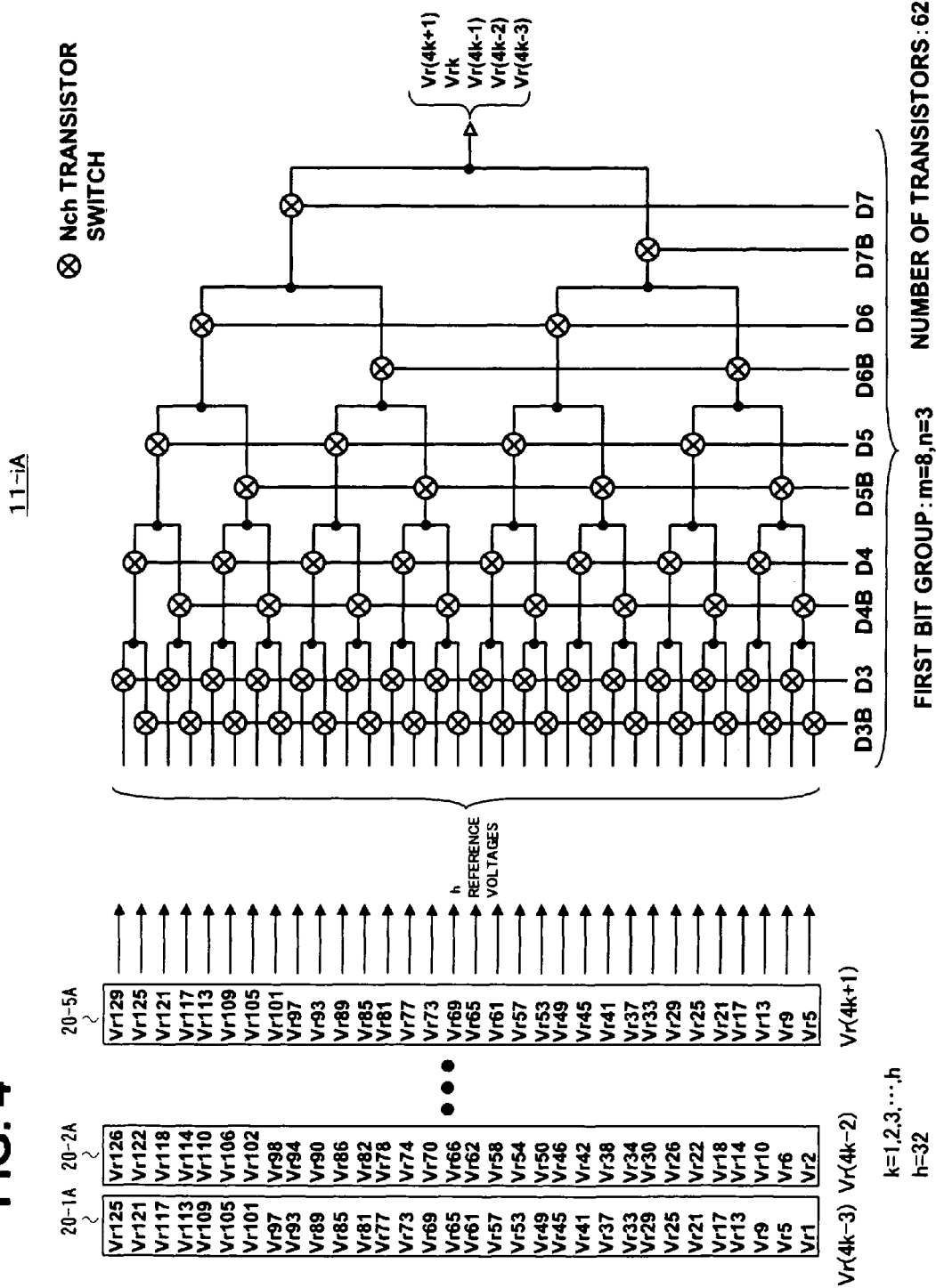
FIG. 4 is a diagram illustrating an example of the configuration of subdecoders 11-1A to 11-5A in FIG. 3.

FIG. 4 is a diagram illustrating an example of the configuration of subdecoders 11-1A to 11-5A in FIG. 3. In the case of the specifications of FIG. 2A, the subdecoders 11-1A to 11-5A are identically constructed and each subdecoder is indicated by 11-iA (i=1 to 5). Based upon the five upper bits (D3 to D7, D3B to D7B), the subdecoder 11-iA selects h (=32) reference voltages successively from the side of the lower order bits (D3, D3B) to the side of the upper bits (D7, D7B). For the sake of illustration in the drawing, the arrangement shown in FIG. 4 is such that h (=32) reference voltages are input to the subdecoder 11-iA with 32 reference voltages being adopted as one set. However, the first to fifth subdecoders 11-1A to 11-5A are provided as the subdecoders 11-iA of FIG. 4 in correspondence with respective ones of the first reference voltage group 20-1A (Vr1, Vr5, Vr9, ..., Vr121, Vr125), the second reference voltage group 20-2A (Vr2, Vr6, Vr10, ..., Vr122, Vr126), ... and the fifth reference voltage group 20-5A (Vr5, Vr9, Vr12, ..., Vr125, Vr129). These subdecoders output respective ones of five adjacent reference voltages Vr(4k−3), Vr(4k−2), Vr(4k−1), Vr(4k), and Vr(4k+1) [where k corresponds to column number j (=1, 2, ..., h, h=32) in the two-dimensional array of five rows and h columns.

More specifically, in the first subdecoder 11-1A, one of two successive reference voltages in each of the pairs (Vr1, Vr5), (Vr9, Vr13), ... (Vr113, Vr117), and (Vr121, Vr125) in the first reference voltage group 20-1A is selected by Nch transistors (pass transistors, switching transistors) whose on/off operation is controlled by lower order bits (D3, D3B) of the first bit group. One of the two reference voltages that have been selected by the Nch transistors connected to the bits (D3, D3B) is selected by Nch transistors connected to upper bits (D4, D4B). Thereafter, and in similar fashion, one of two reference voltages that have been selected by Nch transistors connected to lower order bits is selected by upper bits. Nch transistors connected to bits (D7, D7B) select and output as reference voltage Vr(4k−3) one of two reference voltages that have been selected by Nch transistors connected to bits (D6, D6B) that are one bit lower. Similarly, the second to fifth subdecoders 11-2A to 11-5A select and output Vr(4k−2), Vr(4k−1), Vr(4k), and Vr(4k+1) based upon the first bit group (D3, D3B) to (D7, D7B).

The number of transistor switches in each subdecoder 11-iA in FIG. 4 is 62, and therefore the total number of transistor switches in the five subdecoders 11-1A to 11-5A is 310.

Figure 39:
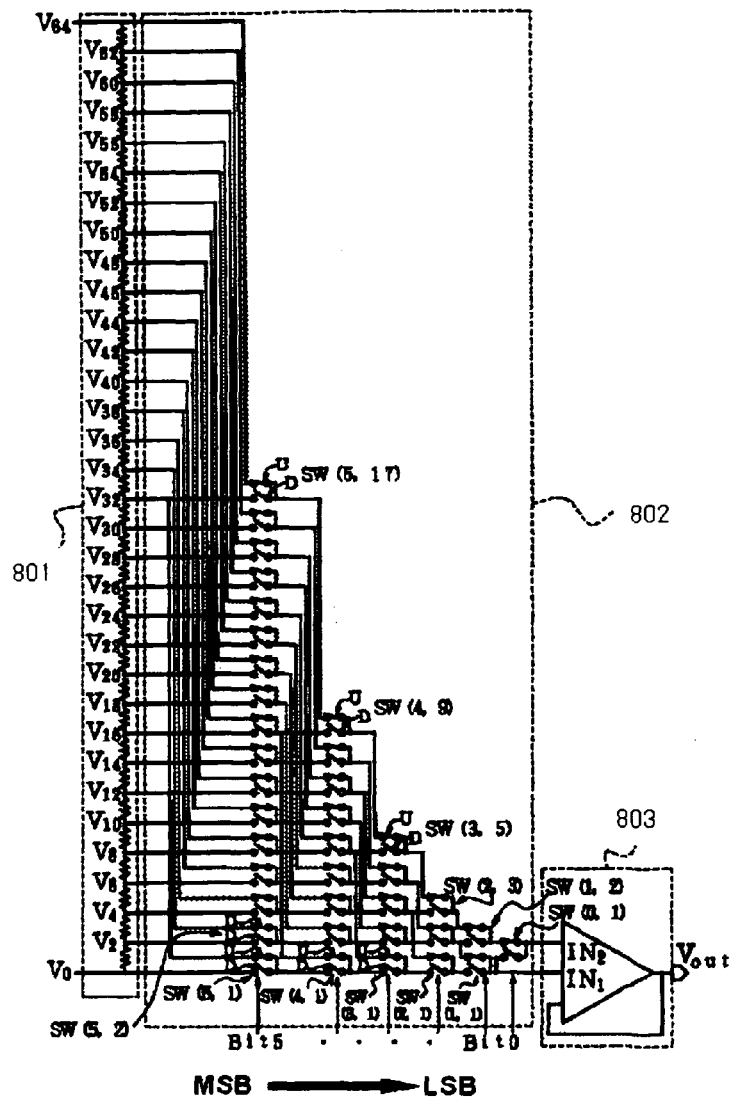
FIG. 39 is a diagram illustrating the configuration of related art (Patent Document 1)
Figure 40:
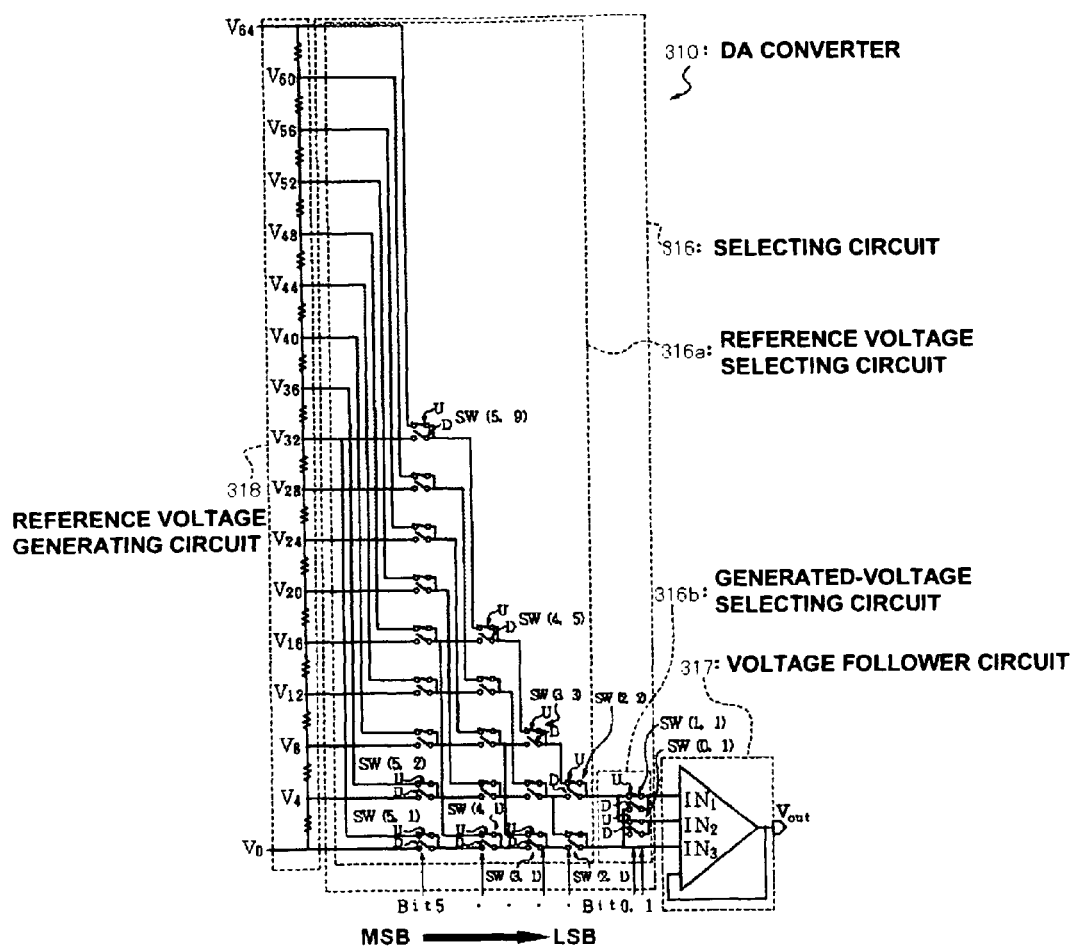
FIG. 40 is a diagram illustrating the configuration of related art (Patent Document 2).

The subdecoders 11-iA in FIG. 4 are in a tournament-type configuration in which h (=32) reference voltages are selected successively from bits (D3, D3B) on the lower side to bits (D7, D7B) on the upper side by the five upper bits (D3, D3B) to (D7, D7B). As a result, wiring intersections of the kind shown in FIG. 39 do not occur. It should be noted that although the subdecoders 11-iA in FIG. 4 are illustrated as being composed of Nch transistor switches, a similar arrangement is possible using Pch transistor switches as well. In the case where Pch transistor switches are used, the subdecoders can be constructed in simple fashion by changing the transistor polarity in the Nch transistor arrangement from Nch to Pch and interchanging the normal and complementary signals of the bit signal (e.g., normal signal D0 and complementary signal D0B). Accordingly, in the present invention, the Nch transistor arrangement is illustrated as the representative arrangement and drawings for the Pch transistor arrangement are omitted. The same holds true for the other drawings of the present invention mentioned below.

Figure 5:
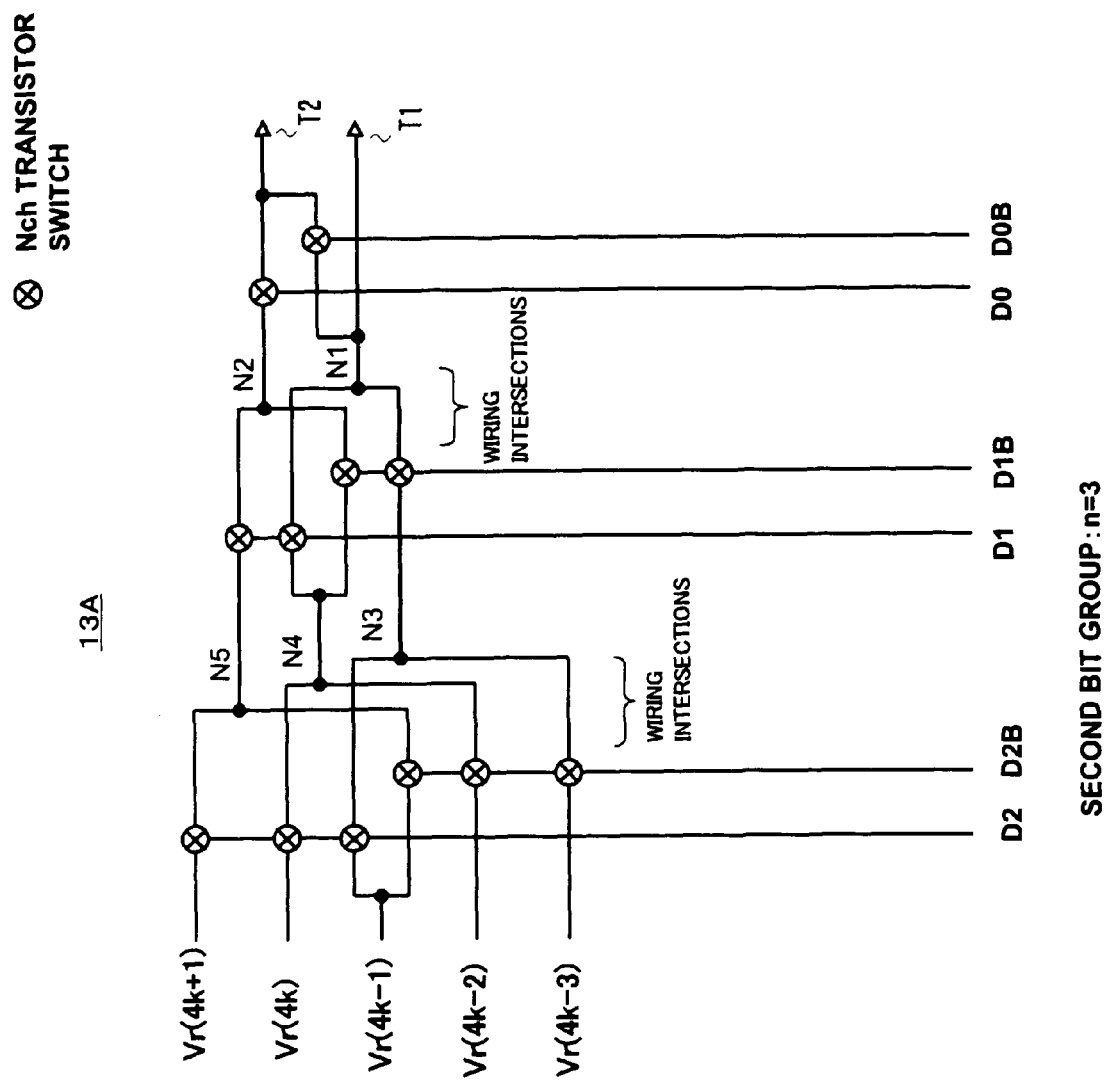
FIG. 5 is a diagram illustrating the configuration of subdecoder 13A in FIG. 3.

FIG. 5 is a diagram illustrating an example of the configuration of subdecoder 13A in FIG. 3. With reference to FIG. 5, Vr(4k−3) is connected to a node N3 via an Nch transistor (pass transistor, switching transistor) whose on/off operation is controlled by the 1/0 logic of D2B.

Vr(4k−2) is connected to a node N4 via an Nch transistor whose on/off operation is controlled by the 1/0 logic of D2B.

Vr(4k−1) is connected to a node N5 via an Nch transistor whose on/off operation is controlled by the 1/0 logic of D2B and to a node N3 via an Nch transistor whose on/off operation is controlled by the 1/0 logic of D2.

Vr(4k) is connected to node N4 via an Nch transistor whose on/off operation is controlled by the 1/0 logic of D2.

Vr(4k+1) is connected to node N5 via an Nch transistor whose on/off operation is controlled by the 1/0 logic of D2.

The node N3 is connected to a node N1 via an Nch transistor whose on/off operation is controlled by the 1/0 logic of D1B.

The node N4 is connected to a node N2 via an Nch transistor whose on/off operation is controlled by the 1/0 logic of D1B and to node N1 via an Nch transistor whose on/off operation is controlled by the 1/0 logic of D1.

The node N5 is connected to a node N2 via an Nch transistor whose on/off operation is controlled by the 1/0 logic of D1.

The node N1 is connected to terminal T1 and to terminal T2 via an Nch transistor whose on/off operation is controlled by the 1/0 logic of D0B.

The node N2 is connected to terminal T2 via an Nch transistor whose on/off operation is controlled by the 1/0 logic of D0. The lower order bits D2 to D0 and the reference voltages that are output to the terminals T1 and T2 are as shown below.

(T1, T2)=[Vr(4k−3), Vr(4k−3)] when (D2, D1, D0)=(0,0, 0) holds;

(T1, T2)=[Vr(4k−3), Vr(4k−2)] when (D2, D1, D0)=(0,0, 1) holds;

(T1, T2)=[Vr(4k−2), Vr(4k−2)] when (D2, D1, D0)=(0,1, 0) holds;

(T1, T2)=[Vr(4k−2), Vr(4k−1)] when (D2, D1, D0)=(0,1, 1) holds;

(T1, T2)=[Vr(4k−1), Vr(4k−1)] when (D2, D1, D0)=(1,0, 0) holds;

(T1, T2)=[Vr(4k−1), Vr(4k)] when (D2, D1, D0)=(1,0,1) holds;

(T1, T2)=[Vr(4k), Vr(4k)] when (D2, D1, D0)=(1,1,0) holds; and (T1, T2)=[Vr(4k), Vr(4k+1)] when (D2, D1, D0)=(1,1,1) holds.

The subdecoder 13A of FIG. 5 selects voltages successively from the upper bits (D2, D2B) toward the side of the lower order bits in the three lower order bits (D0 to D2, D0B to D2B). As illustrated in FIG. 5, wiring intersections occur in the wiring between switching transistors (Nch transistors). However, the intersections are only four in number, which is a small figure, and therefore there is little influence upon layout area.

Figure 6:
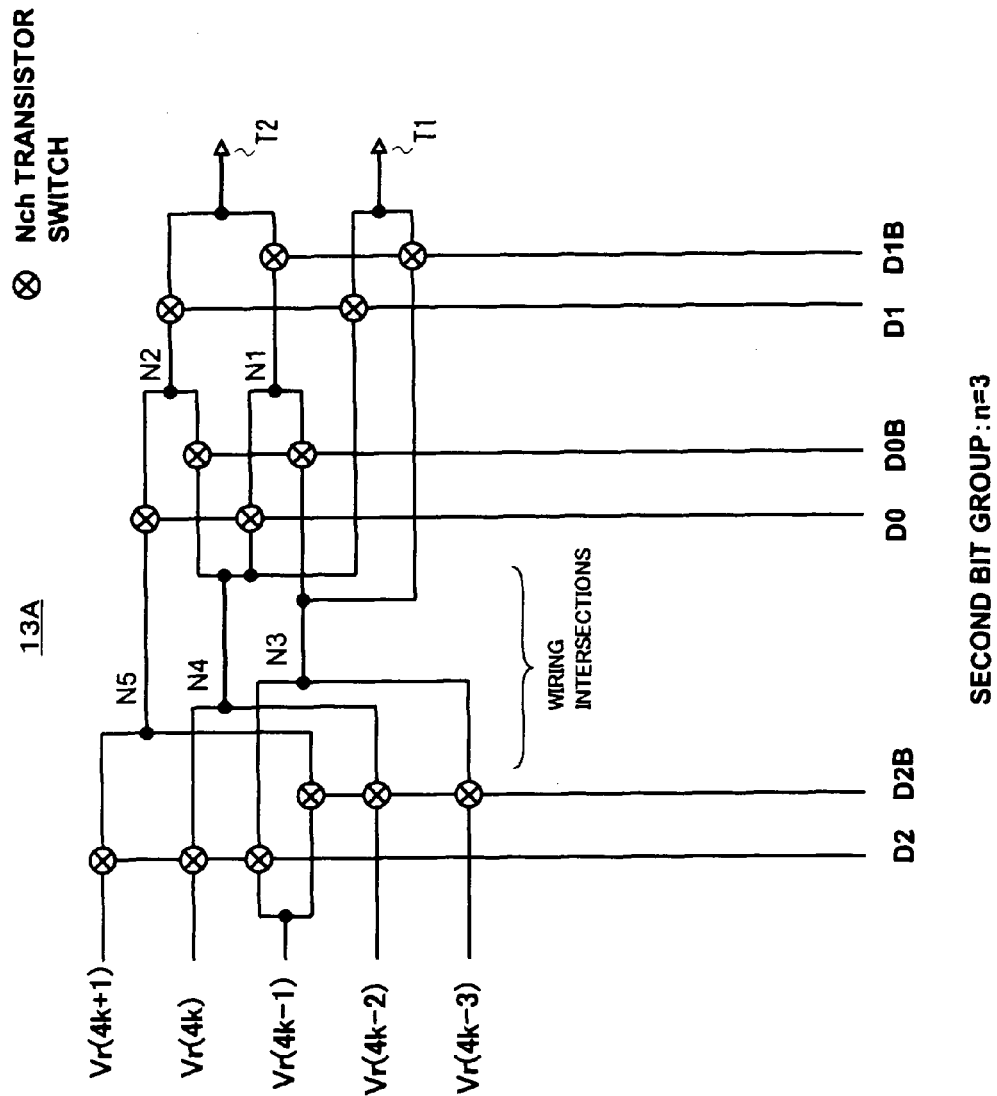
FIG. 6 is a diagram illustrating another example of the configuration of subdecoder 13A in FIG. 3.

FIG. 6 is a diagram illustrating another example of the configuration of subdecoder 13A in FIG. 3. In FIG. 6, the order in which (D1, D1B) and (D0, D0B) is switched in the selection order to (D2, D2B), (D1, D1B) and (D0, D0B) of FIG. 5. In this case, the number of switching transistors (Nch transistors) increases by just two in comparison with the arrangement of FIG. 5 and there is almost no effect upon area (an increase in area). The number of wiring intersections is four.

However, if the order of selection is such that (D2, D2B) comes after (D1, D1B) and (D0, D0B), the number of switching transistors (Nch transistors) increases greatly over the arrangements of FIGS. 5 and 6 (12 in FIG. 5 and 14 in FIG. 6) and there is an increase in area.

Specifically, it is preferred that the subdecoder 13 of FIG. 1 or subdecoder 13A of FIG. 3 adopt a selection order at least from the most significant [D(n−1), D(n−1)B] among the lower order n bits (n>2) of D0 to D(n−1), D0B to D(n−1). It is possible to avoid an increase in area even if there is a partial switching of the selection order in bits (D0, D0B) and (D1, D1B) on the lower side.

Figure 36:
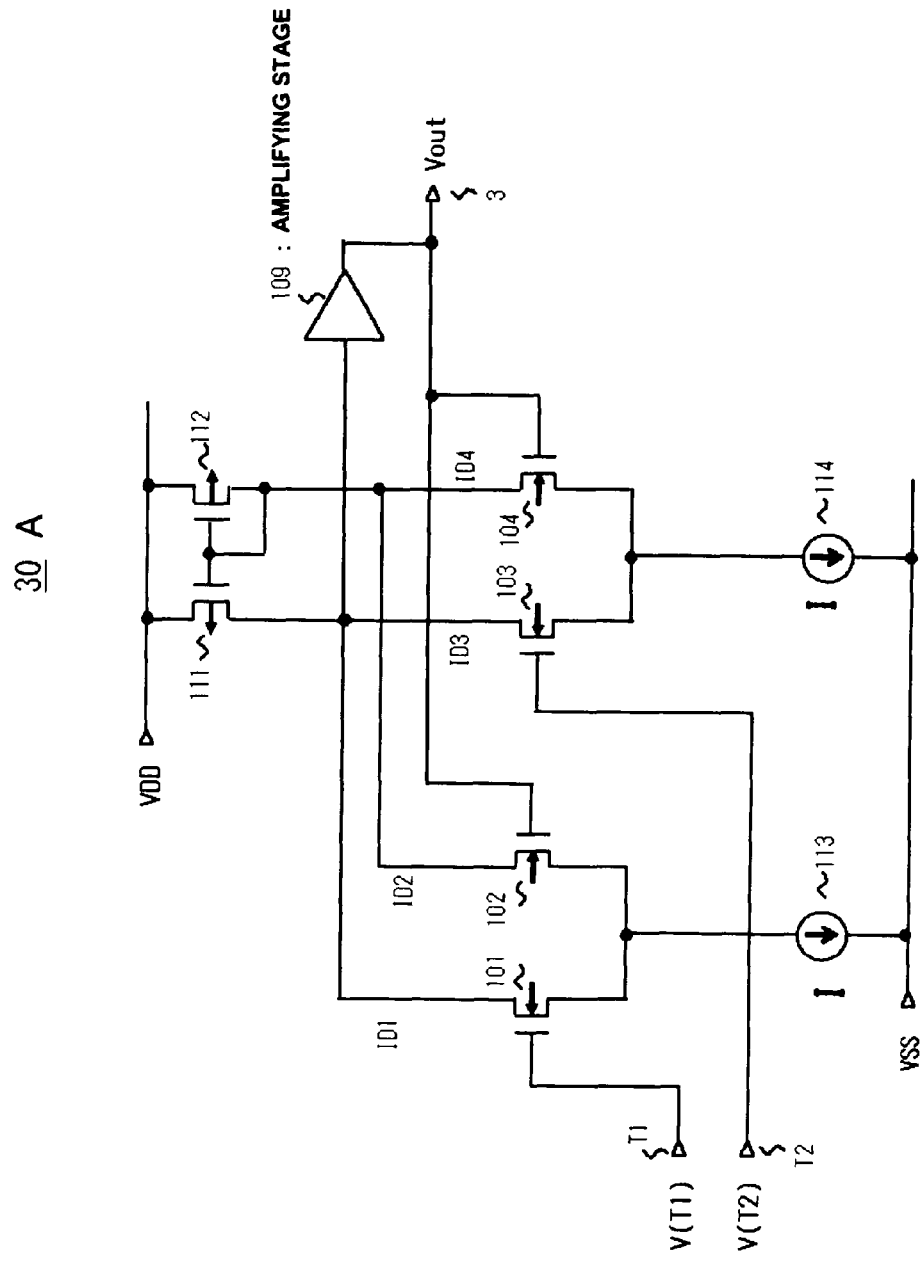
FIG. 36 is a diagram illustrating the configuration of an amplifying circuit in FIG. 3.

FIG. 36 is a diagram illustrating an example of the configuration of the amplifying circuit 30A (interpolating amplifier) in FIGS. 2B and 3. As illustrated in FIG. 36, the amplifying circuit includes a first differential pair comprising Nch transistors 101 and 102 having commonly connected sources connected to a current source 113 and gates connected to terminal T1 [voltage V(T1)] and to output terminal 3 (output terminal voltage Vout), respectively; a second differential pair comprising Nch transistors 103 and 104 having commonly connected sources connected to a current source 114 and gates connected to terminal T2 [voltage V(T2)] and to output terminal 3, respectively; a Pch transistor 111 connected between the commonly connected drains of the Nch transistors 101 and 103 and power supply VDD; a Pch transistor 112 connected between commonly connected drains of the Nch transistors 102 and 104 and the power supply VDD and having its gate and drain connected together and its gate connected to the gate of the Pch transistor 111; and an amplifying stage 109 in which a node of connection between the drain of the Pch transistor 111 and the commonly connected drains of the Nch transistors 101 and 103 is connected to the input end, and which has its output end connected to the output terminal 3. The Pch transistors 111 and 112 compose a current mirror.

The Nch transistors 101, 102, 103 and 104 are of the same size, and the current values of the current sources 113 and 114 are equal. The drain currents ID1, ID2, 1D3 and ID4 of the Nch transistors 101, 102, 103 and 104 are given by the following:

$$ID1=(\beta/2)[V(T1)-VTH]^2 \quad (1)$$

$$ID2=(\beta/2)(Vout-VTH)^2 \quad (2)$$

$$ID3=(\beta/2)[V(T2)-VTH]^2 \quad (3)$$

$$ID4=(\beta/2)(Vout-VTH)^2 \quad (4)$$

Here β is a gain coefficient and VTH is a threshold voltage. β is given by $$\beta=[\mu(W/L)(\in x/tox)],$$

where
μ is a effective mobility of electron,
∈x is a dielectric constant of a gate insulating film,
tox is a film thickness of the gate insulating film,
W is a channel width, and
L is a channel length.

A current ID2+ID4 is a current (input current) that flows into the Pch transistor 112 on the input side of the current mirror circuit, and a current ID1+ID3 is a current (output current) that flows into the Pch transistor 111 on the output side of the current mirror circuit. Control is exercised in such a manner that the input current of the current mirror circuit will equal the output current.

$$ID1+ID3=ID2+ID4 \quad (5)$$

The expressions within the parentheses of Equations (1) to (4) are expanded and substituted into Equation (5), both sides are assumed to be equal with regard to linear terms of VTH, and V(T1)+V(T2)=2×Vout, namely $$Vout=[V(T1)+V(T2)]/2 \quad (6)$$

is obtained. Alternatively, Equation (6) is derived by substituting $$ID1-ID2=gm[V(T1)-Vout],$$

$$ID3-ID4=gm[V(T2)-Vout]$$

into Equation (5), where gm is a mutual conductance of the first and second differential pairs.

It should be noted that FIG. 36 is a diagram illustrating an example of the amplifying circuit 30A and that any interpolating amplifier that operates Equation (6) can be used besides the arrangement of FIG. 36.

Figure 7:
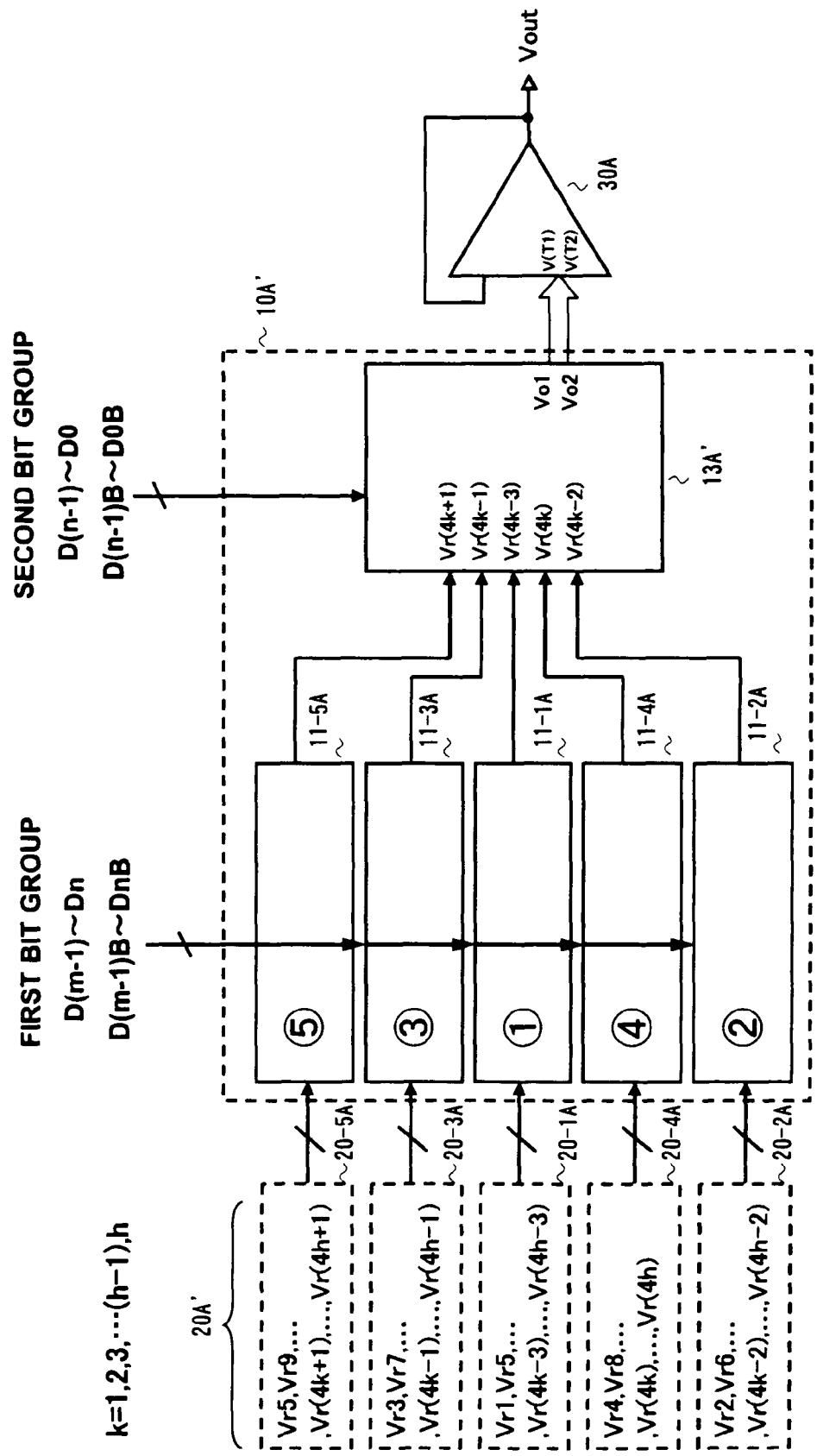
FIG. 7 is a diagram illustrating the configuration of a third exemplary embodiment of the present invention.

FIG. 7 is a diagram illustrating the configuration of a third exemplary embodiment of the present invention. FIG. 7 is a diagram illustrating a modification of the exemplary embodiment shown in FIG. 3. In this exemplary embodiment, the wiring intersections between the switching transistors of the subdecoder 13A' are reduced by changing the placement of the first to fifth subdecoders 11-1A to 11-5A of FIG. 3.

In the placement of the first to fifth subdecoders 11-1A to 11-5A, the third subdecoder 11-3A is placed adjacent to the first and fifth subdecoders 11-1A and 11-5A, and the second and fourth subdecoders 11-2A and 11-4A are placed side by side. As a result, reference voltages Vr(4k−2) and Vr(4k) are input to the subdecoder 13A' side by side, and reference voltage Vr(4k−1) is input to the subdecoder 13A' adjacent to Vr(4k−3) and Vr(4k+1). The subdecoder 13A' selects two reference voltages, inclusive of redundant selection of the same reference voltage, in accordance with the second bit group D(n−1) to D0, D(n−1)B to D0B and outputs these reference voltages to terminals T1 and T2 of amplifying circuit 30A.

Figure 8:
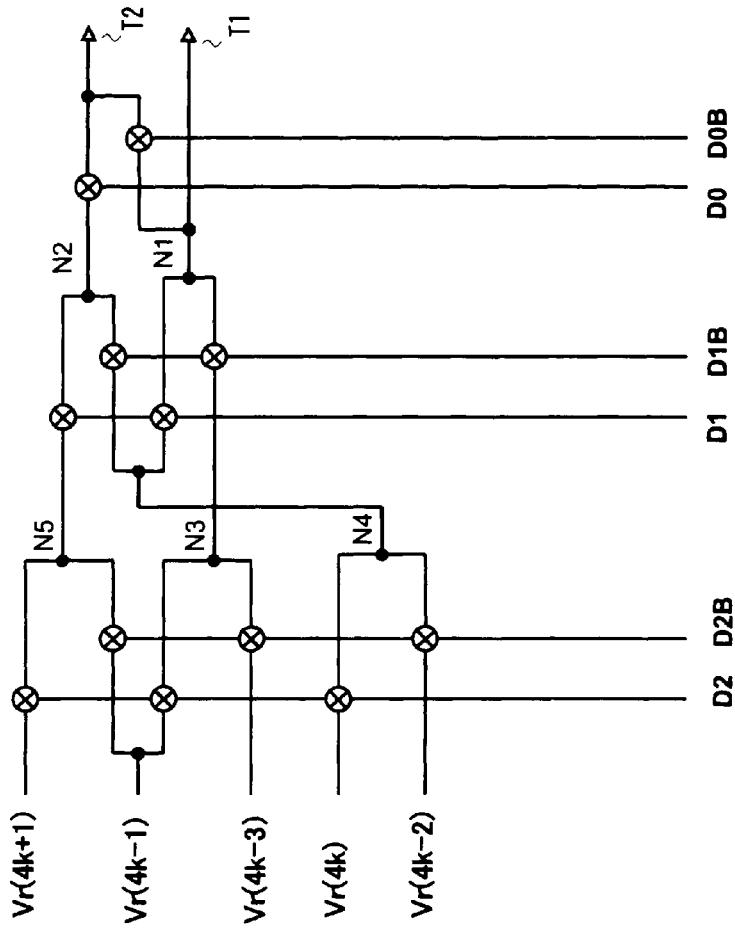
FIG. 8 is a diagram illustrating an example of the configuration of subdecoder 13A' in FIG. 7.

FIG. 8 is a diagram illustrating an example of the configuration of subdecoder 13A' in FIG. 7. The wiring intersections between the switching transistors of the subdecoder 13A' becomes a single intersection by changing the placement of the subdecoders 11-1A to 11-5A from the place shown in FIG. 3 to the placement shown in FIG. 7. Thus the number is reduced from the arrangement of FIG. 5 (four wiring intersections) and the influence of the wiring intersections on layout area can be reduced. It should be noted that in the circuit arrangement of FIG. 8, the number of switching transistors is the same as in the arrangement of FIG. 5.

Figure 9:
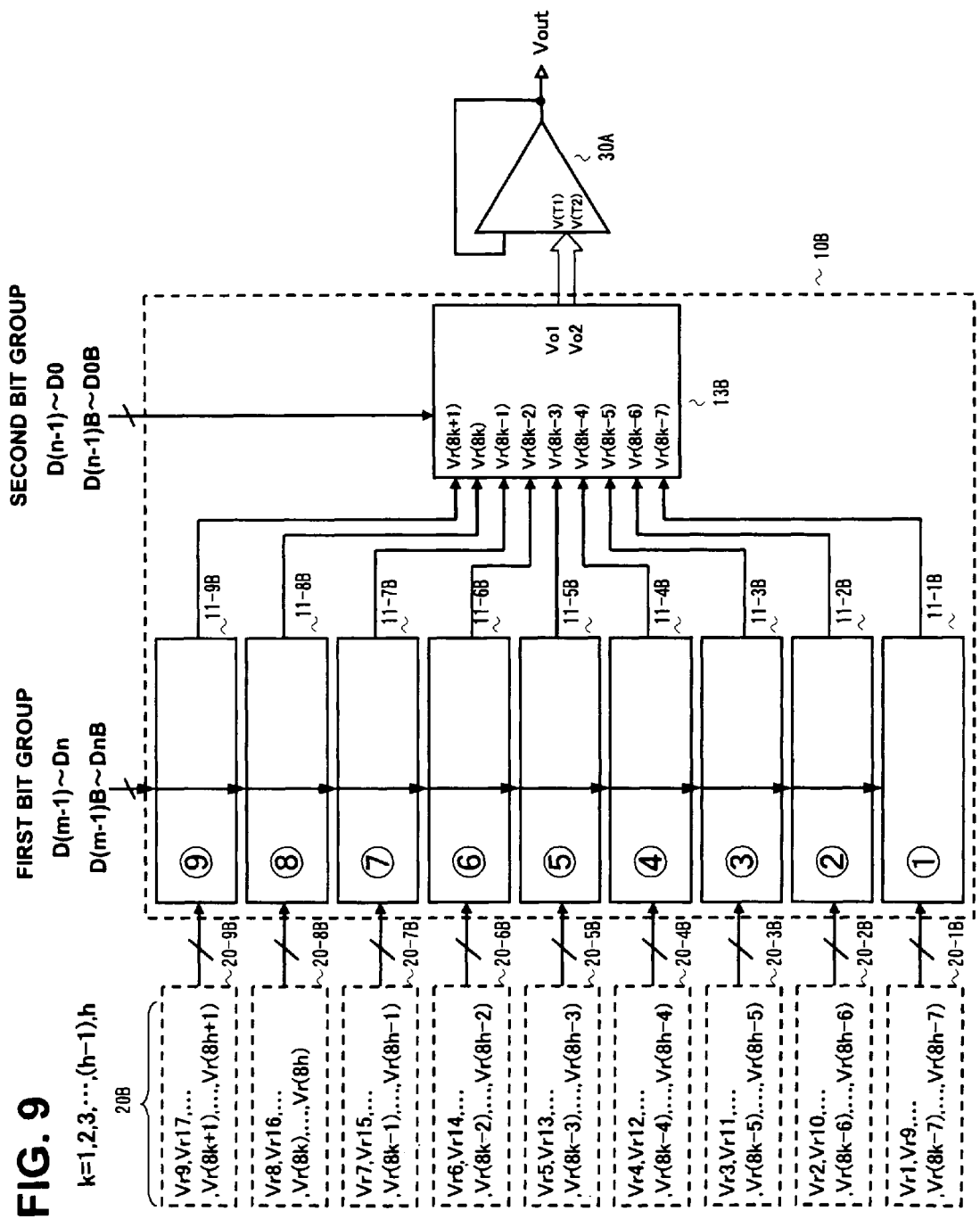
FIG. 9 is a diagram illustrating the configuration of a fourth exemplary embodiment (in a case where S=8 in FIG. 1) of the present invention.

FIG. 9 is a diagram useful in describing the configuration of a fourth exemplary embodiment according to the present invention. This exemplary embodiment is a separate exemplary embodiment in accordance with the specifications of FIG. 2. This is an arrangement for a case where S=8 holds in FIG. 1. The reference voltages are grouped into (S+1)=nine reference voltage groups 20-1B to 20-9B so that the two-dimensional array in FIG. 33 becomes one having nine rows and h columns. In FIG. 9, in which m=8 (the number of bits forming the input digital signal) and n=4 hold, first to ninth subdecoders 11-1B to 11-9B provided in correspondence with reference voltage groups 20-1B to 20-9B, respectively, each select and output one voltage [Vr(8k−7) to Vr(8k+1)] in accordance with the four upper bits (D7 to D4, D7B to D4B) of the digital signal. A subdecoder 13B of decoder 10B, which receives nine adjacent reference voltages Vr(8k−7), Vr(8k−6), Vr(8k−5), Vr(8k−4), Vr(8k−3), Vr(8k−2), Vr(8k−1), Vr(8k), and Vr(8k+1) from the first to ninth subdecoders 11-1B to 11-9B, selects and outputs two reference voltages (Vo1, Vo2), inclusive of redundant selection of the same reference voltage, in accordance with the four lower order bits (D3 to D0, D3B to D0B) of the digital signal. The amplifying circuit 30A comprises an interpolating amplifier for interpolating the two voltages (Vo1, Vo2) in a manner similar to that of FIGS. 1 and 3.

Figure 16:
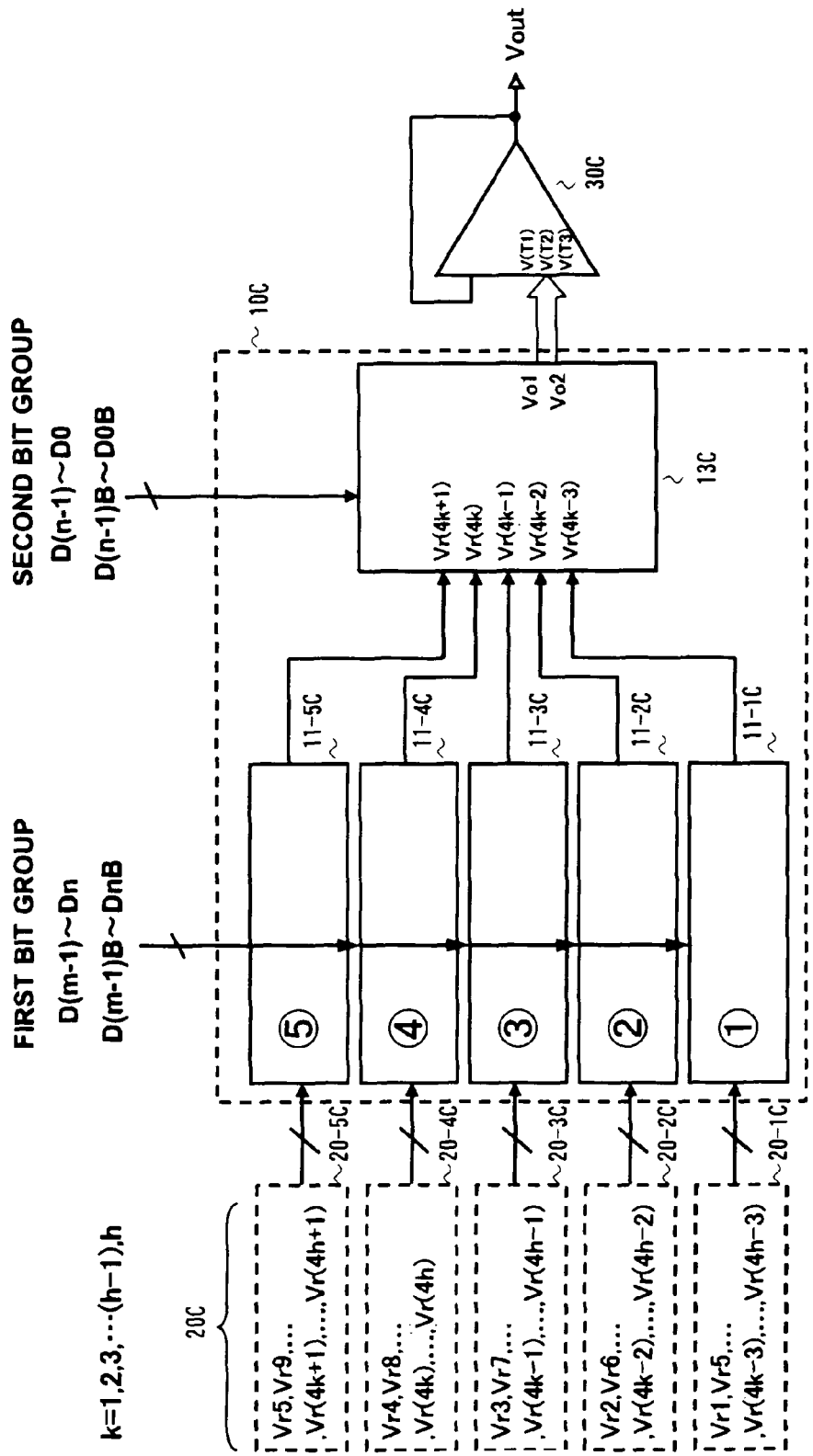
FIG. 16 is a diagram illustrating the configuration of a sixth exemplary embodiment (in a case where S=4 in FIG. 1) of the present invention.

The arrangement of FIG. 9 is such that in FIG. 2A, 16 consecutive levels are set as one section, eight adjacent reference voltages are assigned to this section, the level at the end of this one section (namely the 16th level from the lower side) shares the one reference voltage having the lowest level in the adjacent section, a total of 256 voltage levels of levels 0 to 255 are partitioned into 16 sections and the number of reference voltages is 8×16+1=129 voltages.

More specifically, and by way of example, reference voltages Vr1 to Vr8 are assigned to the section (first section) of levels 0 to 15. Levels 0 to 14 are generated by interpolating them from two identical or adjacent reference voltages among the reference voltages assigned to the first section, and level 15 at the end of the first section is generated by interpolating it from the lowest-level reference voltage Vr9, which belongs to the adjacent second section (levels 16 to 31), and the eighth reference voltage Vr8 of the first section. Similarly, reference voltages Vr9 to Vr16 are assigned to the second section of levels 16 to 31, and level 31 at the end of this section is generated by interpolating it from reference voltage Vr17 of the adjacent third section (levels 32 to 47) and the reference voltage Vr16 of the second section. Reference voltages Vr121 to Vr128 are assigned to the 16th section of levels 244 to 255, and level 255 at the end of this section is generated by interpolating it from the adjacent reference voltage Vr129 and the reference voltage Vr128 of the 16th section.

Figure 10:
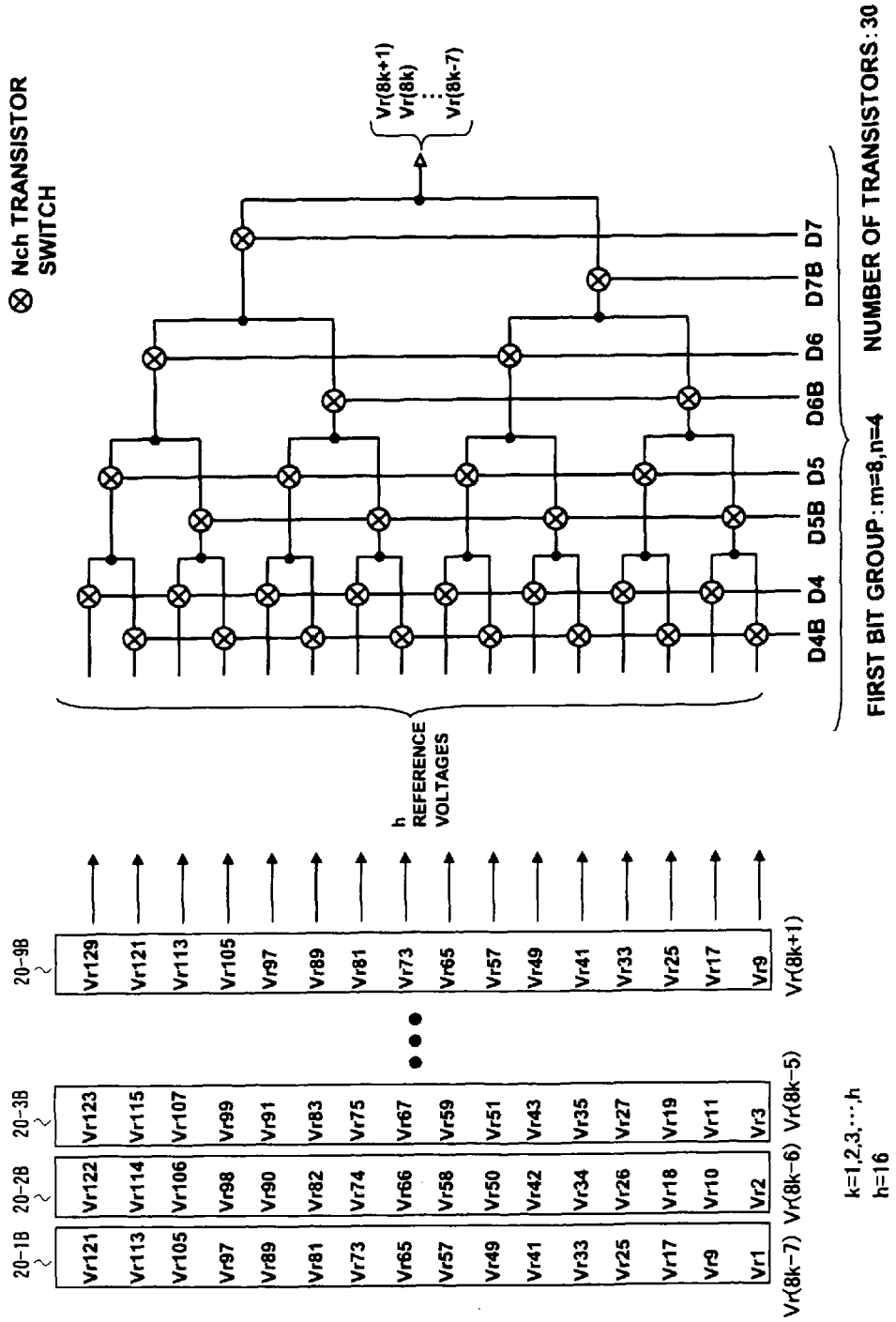
FIG. 10 is a diagram illustrating an example of configuration of subdecoders 11-1B to 11-9B in FIG. 9.

FIG. 10 is a diagram illustrating an example of the configuration of subdecoders 11-1B to 11-9B in FIG. 9. In the case of the specifications of FIG. 2A, the subdecoders 11-1B to 11-9B are identically constructed and each subdecoder is indicated by 11-*i*B (i=1 to 9). In subdecoder 11-*i*B, the reference voltages are the 129 voltages Vr1 to Vr129 as illustrated in FIG. 2, and the reference voltages are divided into nine reference voltage groups 20-1B to 20-9B. For the sake of illustration in the drawing, the arrangement shown in FIG. 10 is such that h (=16) reference voltages are input to subdecoders 11-iB (i=1 to 9) with 16 reference voltages being adopted as one set. However, the first to ninth subdecoders 11-1B to 11-9B are provided as the subdecoders 11-iB of FIG. 10 in correspondence with respective ones of:

the first reference voltage group 20-1B (Vr1, Vr9, ..., Vr112, Vr121), the second reference voltage group 20-2B (Vr2, Vr10, ..., Vr114, Vr122), ... and the ninth reference voltage group 20-9B (Vr9, Vr17, ..., Vr121, Vr129). These subdecoders output respective ones of nine adjacent reference voltages Vr(8k−7), Vr(8k−6), Vr(8k−5), Vr(8k−4), Vr(8k−3), Vr(8k−2), Vr(8k−1), Vr(8k), Vr(8k+1) [where k corresponds to column number j (=1, 2, ..., h, h=16) in the two-dimensional array of nine rows and h columns.

More specifically, in the first subdecoder 11-1B, one of two successive reference voltages in each of the pairs (Vr1, Vr9), (Vr17, Vr25), ..., and (Vr113, Vr121) in the first reference voltage group 20-1B is selected by Nch transistors (pass transistors, switching transistors) connected to lower order bits (D4, D4B) of the first bit group. One of the two reference voltages that have been selected by the Nch transistors connected to the bits (D4, D4B) is selected by Nch transistors connected to upper bits (D5, D5B). Thereafter, and in similar fashion, one of two reference voltages that have been selected by Nch transistors connected to lower order bits is selected by upper bits. Nch transistors connected to bits (D7, D7B) select and output as reference voltage Vr(8k−7) one of two reference voltages that have been selected by Nch transistors connected to bits (D6, D6B) that are one bit lower. Similarly, the second to ninth subdecoders 11-2B to 11-9B select and output Vr(8k−6), Vr(8k−5), Vr(8k−4), Vr(8k−3), Vr(8k−2), Vr(8k−1), Vr(8k), and Vr(8k+1) based upon the first bit group (D4, D4B) to (D7, D7B).

The number of transistor switches (Nch transistors) in each subdecoder 11-iB in FIG. 10 is 30, and therefore the total number of transistor switches in the nine subdecoders 11-1B to 11-9B is 270. In this exemplary embodiment, 16 reference voltages are selected successively from bits (D4, D4B) on the lower side to bits (D7, D7B) on the upper side by the four upper bits (D4 to D4B to D7B). Owing to this tournament-type configuration, wiring intersections of the kind shown in FIG. 39 do not occur.

Figure 11:
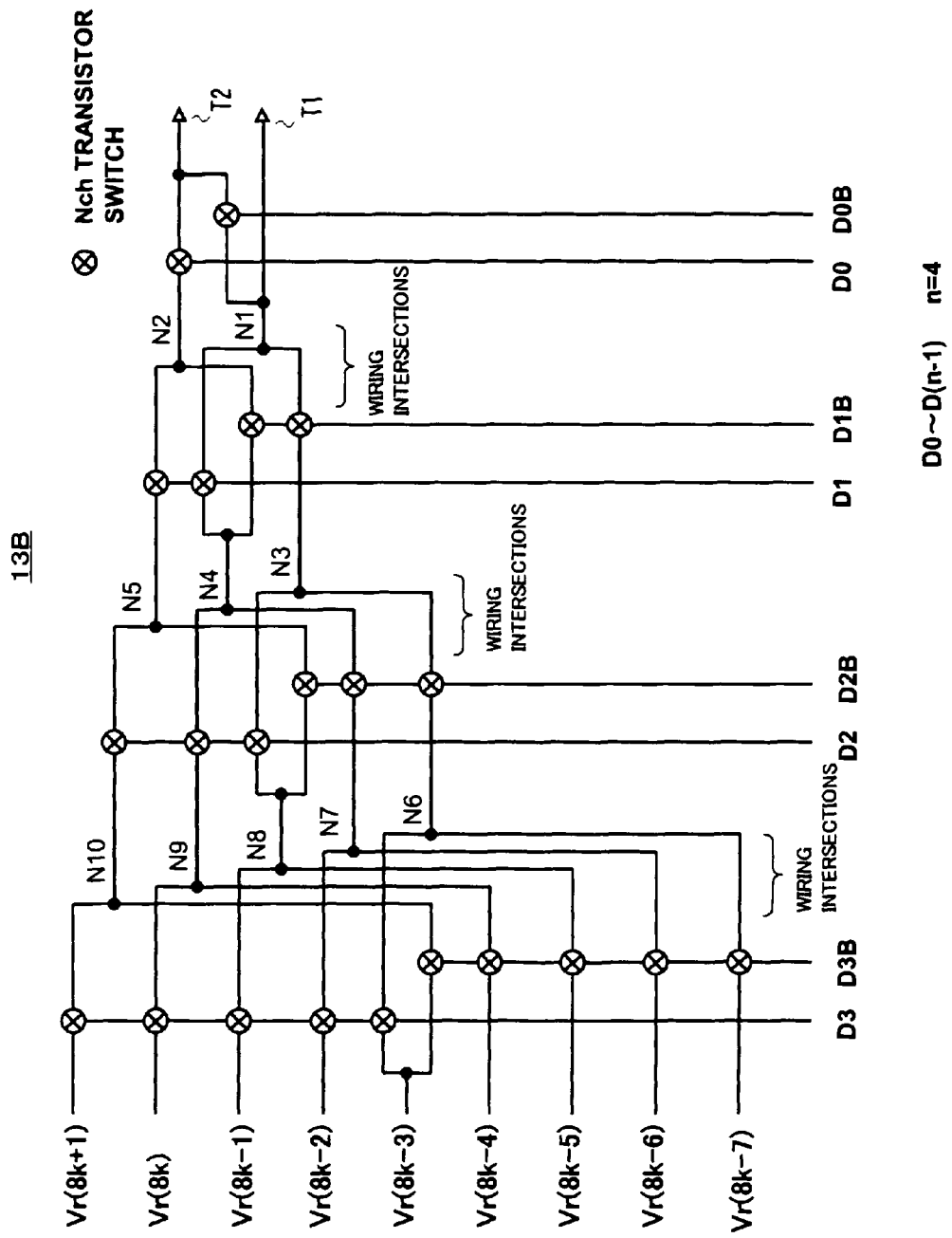
FIG. 11 is a diagram illustrating an example of the configuration of subdecoder 13B in FIG. 9.

FIG. 11 is a diagram illustrating an example of the configuration of subdecoder 13B in FIG. 9. The subdecoder selects voltages successively from the upper bits (D3, D3B) toward the side of the lower order bits among the four lower order bits (D0 to D3, D0B to D3B) of the second bit group.

Vr(8k−7), Vr(8k−6), Vr(8k−5), Vr(8k−4), and Vr(8k−3) are connected to a nodes N6, N7, N8, N9, and N11, respectively, via Nch transistors (pass transistors, switching transistors) whose on/off operation is controlled by the 1/0 logic of D3B.

Vr(8k−3), Vr(8k−2), Vr(8k−1), Vr(8k), and Vr(8k+1) are connected to a nodes N6, N7, N8, N9, and N10, respectively, via Nch transistors whose on/off operation is controlled by the 1/0 logic of D3.

Nodes N6, N7, and N8 are connected to nodes N3, N4, and N5, respectively, via Nch transistors whose on/off operation is controlled by the 1/0 logic of D2B.

Nodes N8, N9, and N10 are connected to nodes N3, N4, and N5, respectively, via Nch transistors whose on/off operation is controlled by the 1/0 logic of D2.

Nodes N3 and N4 are connected to nodes N1 and N2, respectively, via Nch transistors whose on/off operation is controlled by the 1/0 logic of D1B.

Nodes N4 and N5 are connected to nodes N1 and N2, respectively, via Nch transistors whose on/off operation is controlled by the 1/0 logic of D1.

Node N1 is connected to terminal T1 as well as to terminal T2 via an Nch transistor whose on/off operation is controlled by the 1/0 logic of D0B.

Node N2 is connected to terminal T2 via an Nch transistor whose on/off operation is controlled by the 1/0 logic of D0.

In FIG. 11, the arrangement of on/off control by (D2, D2B) to (D0, D0B) is similar to that shown in FIG. 5. Accordingly, an arrangement may be adopted in which the decoding orderings of (D1, D1B) to (D0, D0B) are switched, as shown in FIG. 6.

Although wiring intersections occur in the circuit shown in FIG. 11, the number of wiring intersections is seven, which is comparatively small, and hence there is little influence upon the layout area (increase in area).

Figure 12:
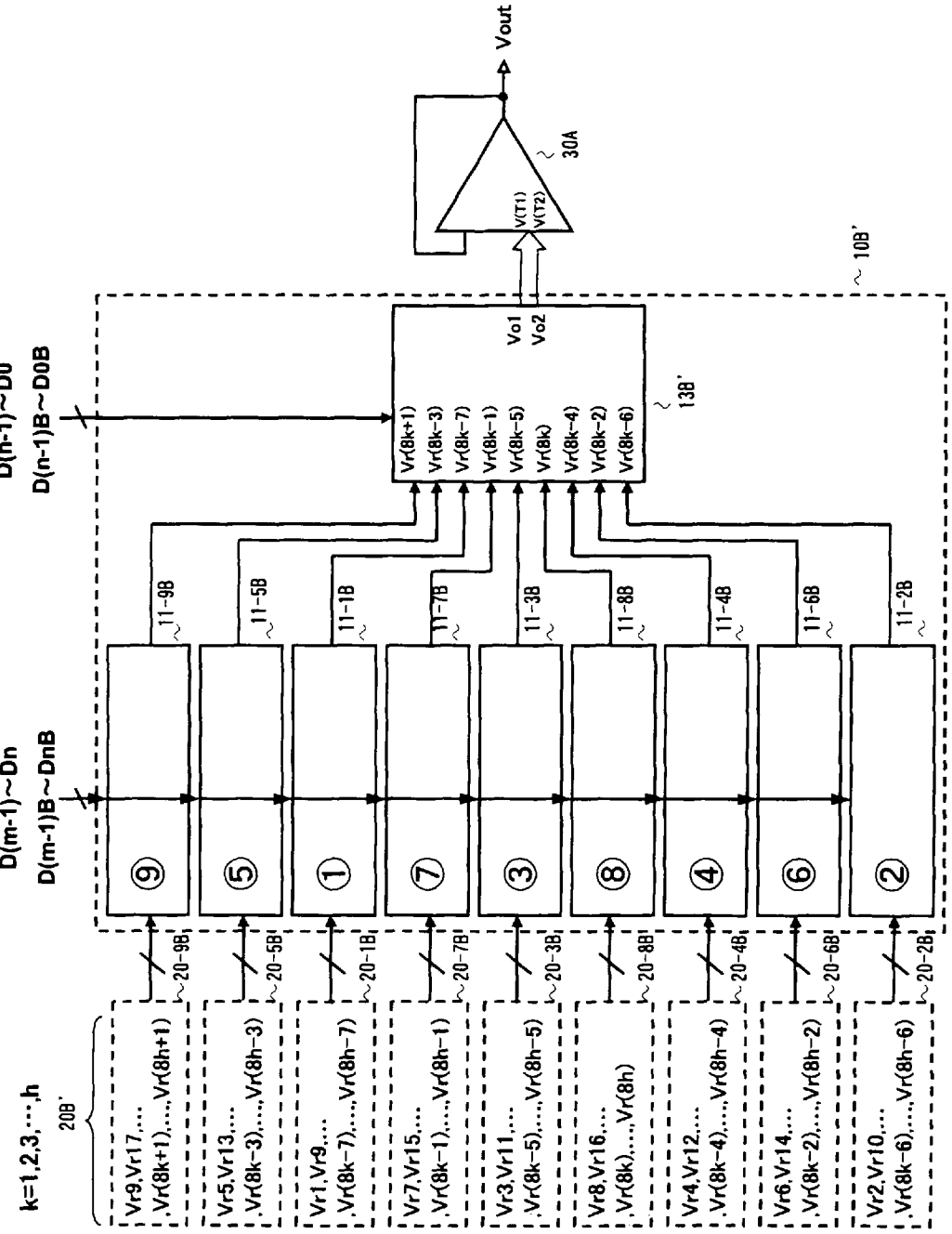
FIG. 12 is a diagram illustrating the configuration of a fifth exemplary embodiment of the present invention.

FIG. 12 is a diagram useful illustrating the configuration of a fifth exemplary embodiment according to the present invention and shows a modification of FIG. 9. The placement of the first to ninth subdecoders 11-1B to 11-9B is such that the first subdecoder 11-1B that selects and outputs Vr(8k−7), and the ninth subdecoder 11-9B that selects and outputs Vr(8k+1) are placed adjacent to the fifth subdecoder 11-5B that selects and outputs Vr(8k−3).

The third subdecoder 11-3B that selects and outputs Vr(8k−5) and the seventh subdecoder 11-7B that selects and outputs Vr(8k−1) are placed side by side.

The fourth subdecoder 11-4B that selects and outputs Vr(8k−4) and the eighth subdecoder 11-8B that selects and outputs Vr(8k) are placed side by side.

The second subdecoder 11-2B that selects and outputs Vr(8k−6) and the sixth subdecoder 11-6B that selects and outputs Vr(8k−2) are placed side by side.

As a result, reference voltage Vr(8k−3) is input to subdecoder 13B' adjacent to Vr(8k−7) and Vr(8k+1). Each pair of Vr(8k−1) and Vr(8k−5), Vr(8k) and Vr(8k−4), and Vr(8k−2) and Vr(8k−6) are input to subdecoder 13B' adjacent to each other.

Figure 13:
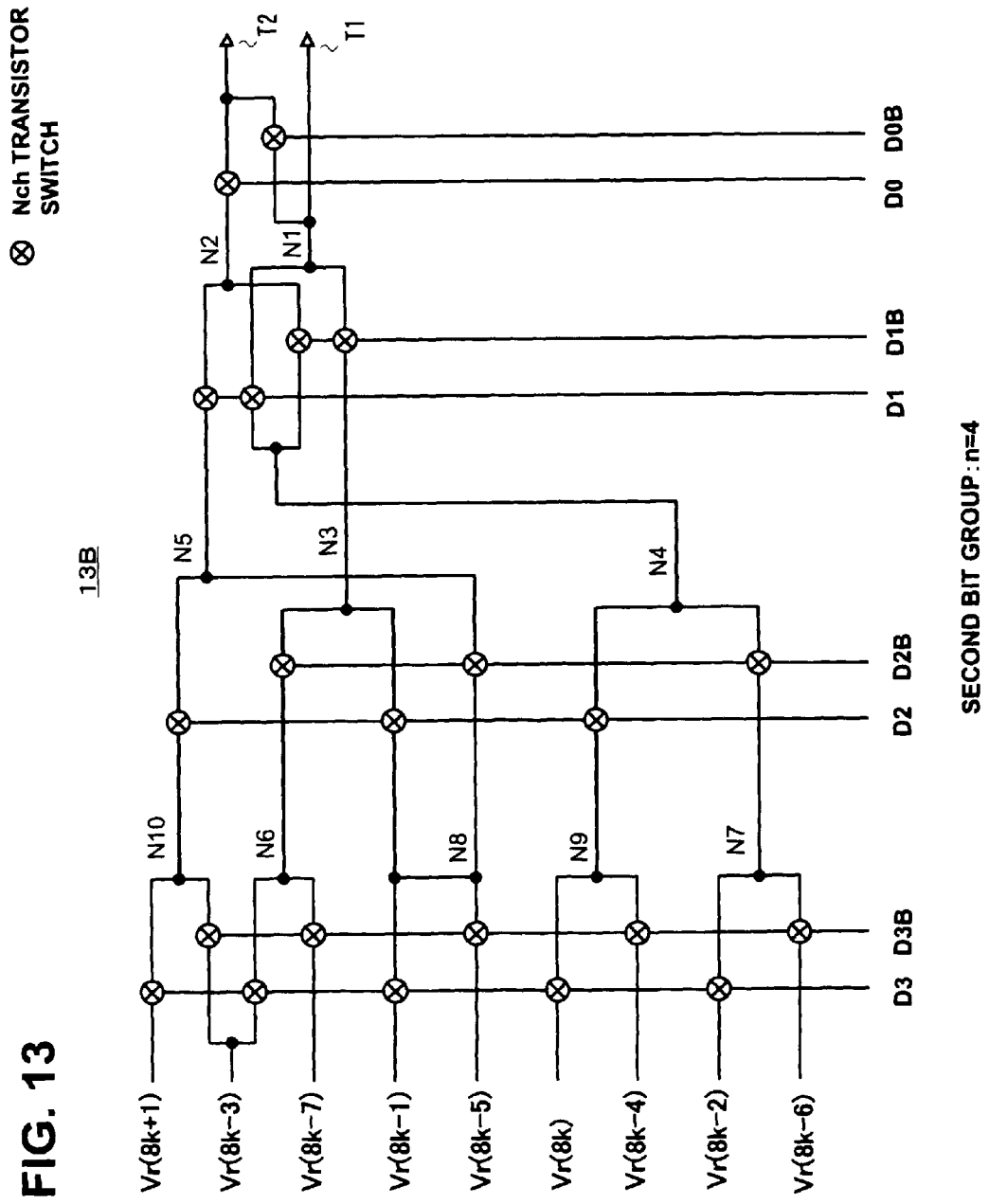
FIG. 13 is a diagram illustrating the configuration of subdecoder 13B' in FIG. 12.

FIG. 13 is a diagram illustrating an example of the configuration of subdecoder 13B' in FIG. 12. As illustrated in FIG. 13, Vr(8k−7), Vr(8k−6), Vr(8k−5), Vr(8k−4), and Vr(8k−3) are connected to a nodes N6, N7, N8, N9, and N10, respectively, via Nch transistors (pass transistors, switching transistors) whose on/off operation is controlled by the 1/0 logic of D3B.

Vr(8k−3), Vr(8k−2), Vr(8k−1), Vr(8k), and Vr(8k+1) are connected to a nodes N6, N7, N8, N9, and N11, respectively, via Nch transistors whose on/off operation is controlled by the 1/0 logic of D3.

Nodes N6, N7, and N8 are connected to nodes N3, N4, and N5, respectively, via Nch transistors whose on/off operation is controlled by the 1/0 logic of D2B.

Nodes N8, N9, and N10 are connected to nodes N3, N4, and N5, respectively, via Nch transistors whose on/off operation is controlled by the 1/0 logic of D2.

Nodes N3 and N4 are connected to nodes N1 and N2, respectively, via Nch transistors whose on/off operation is controlled by the 1/0 logic of D1B.

Nodes N4 and N5 are connected to nodes N1 and N2, respectively, via Nch transistors whose on/off operation is controlled by the 1/0 logic of D1.

Node N1 is connected to terminal T1 as well as to terminal T2 via an Nch transistor whose on/off operation is controlled by the 1/0 logic of D0B.

Node N2 is connected to terminal T2 via an Nch transistor whose on/off operation is controlled by the 1/0 logic of D0.

By optimizing the placement of the subdecoders 11-1B to 11-9B, the wiring intersections [especially between the switching transistors of (D3, D3B) and (D2, D2B)] of the subdecoder 13B' can be reduced greatly in comparison with the arrangement of FIG. 11, and the layout area of the decoder 10B' can be reduced. The number of switching transistors is the same as in the arrangement of FIG. 11.

FIG. 14, which uses the specifications of FIG. 2, illustrates the numbers of switching transistors of decoders 10A and 10A' in exemplary embodiments (FIGS. 3 and 7) in which S is 4 and of decoders 10B, 10B' in an exemplary embodiment (FIGS. 9 and 11) in which S is 8 in regard to eight bits (m=8) and ten bits (m=10). The 10-bit arrangement in FIG. 14 is an extension of eight bits.

In accordance with this exemplary embodiment, the numbers of switching transistors are reduced greatly in comparison with the numbers of switching transistors (386 in the case of eight bits and 1538 in the case of 10 bits) in the decoder 10D of FIG. 35. This makes it possible to achieve a reduction in area. Further, the larger the value of S (an integer that is a power of 2 and greater than or equal to 4), the greater the effect of reducing area. Furthermore, the wiring intersections are few. Accordingly, there is no increase in layout area owing to wiring intersections.

It should be noted that in the case of an arrangement in which S is made large, the wiring intersections within the subdecoder 13 are reduced, thereby making it possible to suppress an increase in layout area.

Figures 15A, 15B:
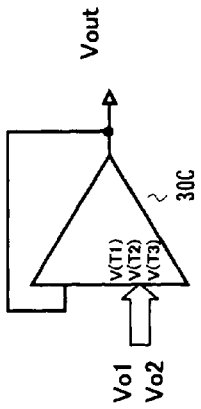
FIG. 15A is a diagram useful in describing second specifications in an exemplary embodiment.
FIG. 15B is a diagram useful in describing an amplifying circuit.

FIG. 15A is a diagram useful in describing second specifications, different from those of FIG. 2A, regarding the exemplary embodiment of FIG. 1 [in which the number of reference voltages is (h×S+1) and the two-dimensional array is that shown in FIG. 33]. The specifications shown in FIG. 15A are for a case where the number m of bits of the digital input signal in FIG. 1 is m=8, n=3 holds and the reference voltages are Vr1 to Vr65. FIG. 15B illustrates the configuration of amplifying circuit 30 (interpolating amplifier 30C) of FIG. 1 corresponding to the specifications of FIG. 15A.

Levels (0 to 255) in FIG. 15A are the output voltage levels of the interpolating amplifier 30C, and it is possible to output 0 to 256 levels. Further, the "Vref" column indicates the correspondence between levels (output voltage levels of the interpolating amplifier 30C) and reference voltages Vr1 to Vr65. Reference voltages Vr1 to Vr64 are each set to every other four levels and correspond to even-numbered levels 0, 4, 8, . . . , and 252 in FIG. 15A. The reference voltage Vr65 corresponds to the level (which corresponds to level 256) that follows level 255. Further, "T1", "T2", and "T3" in FIG. 15A stand the three input terminals of the amplifying circuit 30.

The interpolating amplifier 30C of FIG. 15B outputs $$[V(T1)+V(T2)+2\times V(T3)]/4$$

with the voltages at the three terminals T1, T2, and T3 being V(T1), V(T2), and V(T3). The output voltage Vout is an interpolated voltage obtained by taking the weighted mean with respect to the input voltages V(T1), V(T2), and V(T3) at a ratio of 1:1:2. In this exemplary embodiment, the two reference voltages (Vo1, Vo2) selected by the decoder 10 of FIG. 1 are input to the input terminals T1, T2, and T3 of the interpolating amplifier 30C in combinations indicated by T1, T2, and T3 in FIG. 15A, and the corresponding level is output from the interpolating amplifier 30C.

More specifically, when the reference voltages (Vo1, Vo2) are the same, $$Vout=Vo1(=Vo2) \text{ holds.}$$

When the reference voltages (Vo1, Vo2) are the different, $$Vout=(Vo1+Vo2)/4, \text{ or}$$

$$Vout=(Vo1+Vo2)\times 2/4, \text{ or}$$

$$Vout=(Vo1+Vo2)\times 3/4$$

holds.

FIG. 16 is a diagram useful in describing the configuration of a sixth exemplary embodiment of the present invention. This exemplary embodiment is a diagram illustrating the configuration of the exemplary embodiment of FIG. 1 that is in accordance with the specifications of FIG. 15A. It is assumed here that S=4 holds in FIG. 1.

With reference to FIG. 16, the reference voltages are divided into five (S=4) reference voltage groups 20-1C to 20-5C, and the two-dimensional array in FIG. 33 is an array of five rows and h columns. Decoder 10C, in which m=8, n=4 holds, includes five subdecoders 11-1C to 11-5C each for selecting and outputting one voltage [Vr(4k−3) to Vr(4k+1)] in accordance with four upper bits (D7 to D4, D7B to D4B) of the digital signal; and a subdecoder 13C for selecting and outputting two adjacent or identical reference voltages (Vo1, Vo2), in accordance with the four lower order bits (D3 to D0, D3B to D0B) of the digital signal, out of the five adjacent voltages [Vr(4k−3), Vr(4k−2), Vr(4k−1), Vr(4k), Vr(4k+1)].

The arrangement of FIG. 16 is such that in FIG. 15A, 16 consecutive levels are set as one section, four adjacent reference voltages are assigned to this section, the three upper levels of this section share the one reference voltage having the lowest level in the adjacent section, a total of 256 voltage levels of levels 0 to 255 are partitioned into 16 sections and the number of reference voltages is 4×16+1=65 voltages.

More specifically, and by way of example, reference voltages Vr1, Vr2, Vr3, and Vr4 are assigned to the section (first section) of levels 0 to 15. Levels 0 to 12 are generated by interpolating them from two identical or adjacent reference voltages among the reference voltages assigned to the first section, and the three upper levels 13, 14, and 15 of the first section are generated by interpolating them from the lowest-level reference voltage Vr5 of the second section (levels 16 to 32) and the reference voltage Vr4 of the first section. Similarly, reference voltages Vr61, Vr62, Vr63, and Vr64 are assigned to the 16th section of levels 240 to 255, and the three upper levels 253, 254, and 255 of the 16th section are generated by interpolating them from the reference voltage Vr65, which is not included in a section, and the reference voltage Vr64 of the 16th section.

Figure 17:
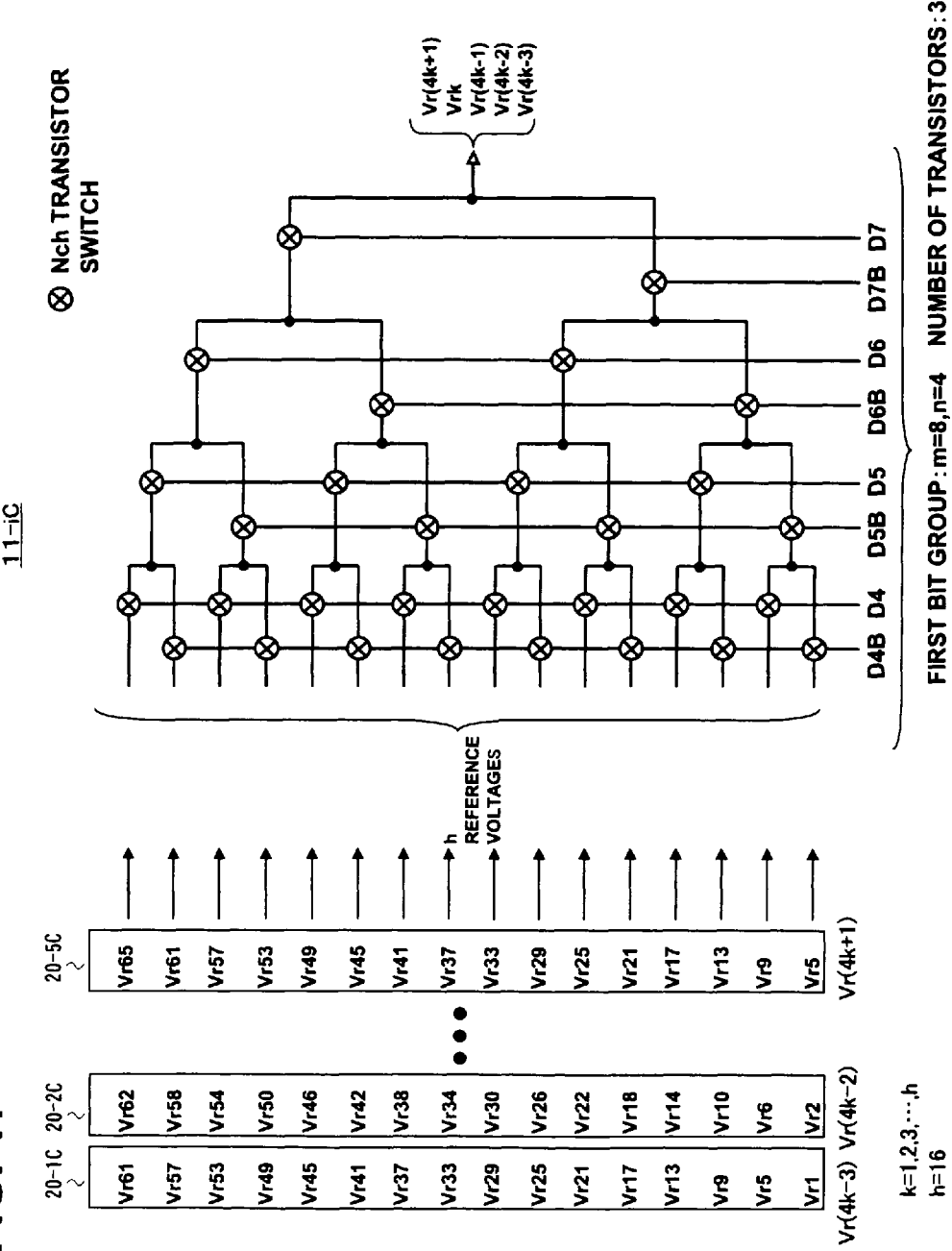
FIG. 17 is a diagram illustrating an example of the configuration of subdecoders 11-1C to 11-5C in FIG. 16.

FIG. 17 is a diagram illustrating an example of the configuration of subdecoders 11-1C to 11-5C in FIG. 16. In the case of the specifications of FIG. 15A, the subdecoders 11-1C to 11-5C are identically constructed and each subdecoder is indicated by 11-iC (i=1 to 5). Based upon the four upper bits (D4 to D7, D4B to D7B), the subdecoder 11-iC selects h (=16) reference voltages successively from the side of the lower order bits (D4, D4B) to the side of the upper bits (D7, D7B). For the sake of illustration in the drawing, the arrangement shown in FIG. 17 is such that h (=16) reference voltages are input to the subdecoder 11-iC with 16 reference voltages being adopted as one set. However, subdecoders 11-1C to 11-5C are provided as the subdecoders 11-iC of FIG. 17 in correspondence with respective ones of the first reference voltage group 20-1C (Vr1, Vr5, Vr9, . . . , Vr57, Vr61), the second reference voltage group 20-2C (Vr2, Vr6, Vr10, . . . , Vr58, Vr62), . . . and the fifth reference voltage group 20-5C (Vr5, Vr9, Vr12, . . . , Vr61, Vr65). These subdecoders output respective ones of five adjacent reference voltages Vr(4k−3), Vr(4k−2), Vr(4k−1), Vr(4k), and Vr(4k+1) [where k corresponds to column number j (=1, 2, . . . , h, h=16) in the two-dimensional array of five rows and h columns.

In the first subdecoder 11-1C, one of two successive reference voltages in each of the pairs (Vr1, Vr5), (Vr9, Vr13), . . . (Vr49, Vr53), and (Vr57, Vr61) in the first reference voltage group 20-1C is selected by Nch transistors (pass transistors, switching transistors) connected to lower order bits (D4, D4B) of the first bit group. One of the two reference voltages that have been selected by the Nch transistors connected to the bits (D4, D4B) is selected by Nch transistors connected to upper bits (D5, D5B). Thereafter, and in similar fashion, one of two reference voltages that have been selected by Nch transistors connected to lower order bits is selected by upper bits. Nch transistors connected to bits (D7, D7B) select and output as reference voltage Vr(4k−3) one of two reference voltages that have been selected by Nch transistors connected to bits (D6, D6B) that are one bit lower. Similarly, the second to fifth subdecoders 11-2C to 11-5C select and output Vr(4k−2), Vr(4k−1), Vr(4k), and Vr(4k+1) based upon the first bit group (D4 to D7, D4B to D7B).

The number of transistor switches in each subdecoder 11-iC in FIG. 17 is 30, and therefore the total number of transistor switches in the five subdecoders 11-1C to 11-5C is 150. Further, the subdecoders 11-iC are in a tournament-type configuration in which 16 reference voltages are selected successively from bits (D4, D4B) on the lower side to bits (D7, D7B) on the upper side by the four upper bits (D4 to D7, D4B to D7B). As a result, wiring intersections of the kind shown in FIG. 39 do not occur.

Figure 18:
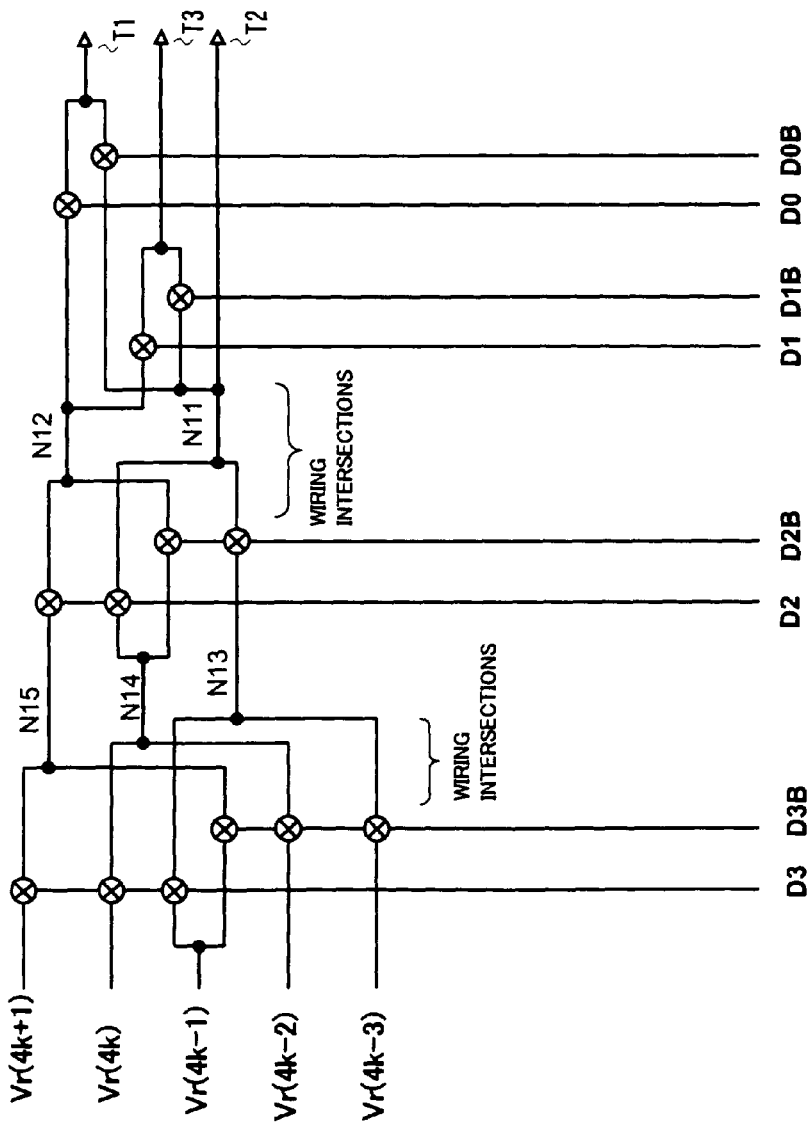
FIG. 18 is a diagram illustrating the configuration of subdecoder 13C in FIG. 16.

FIG. 18 is a diagram illustrating an example of the configuration of subdecoder 13C in FIG. 16. With reference to FIG. 18, Vr(4k−3), Vr(4k−2), and Vr(4k−1) are connected to nodes N13, N14, N15, respectively, via Nch transistors whose on/off operation is controlled by the 1/0 logic of D3B.

Voltages Vr(4k−1), Vr(4k), and Vr(4k+1) are connected to nodes N13, N14, and N15, respectively, via Nch transistors whose on/off operation is controlled by the 1/0 logic of D3.

Nodes N13 and N14 are connected to nodes N11 and N12, respectively, via Nch transistors whose on/off operation is controlled by the 1/0 logic of D2B.

Nodes N14 and N15 are connected to nodes N11 and N12, respectively, via Nch transistors whose on/off operation is controlled by the 1/0 logic of D2.

Node N11 is connected to terminal T2 as well as to terminals T3, T1 via Nch transistors whose on/off operation is controlled by the 1/0 logic of D1B, D0B.

Node N12 is connected to terminals T3, T1 via Nch transistors whose on/off operation is controlled by the 1/0 logic of D1, D0, respectively.

The arrangement of the subdecoder 13C of FIG. 18 is such that the subdecoder 13C selects voltages successively from the upper bits (D3, D3B) toward the side of the lower order bits in the four lower order bits (D0 to D3, D0B to D3B). Although wiring intersections occur, the intersections are few and hence there is little effect upon layout area.

Figure 37:
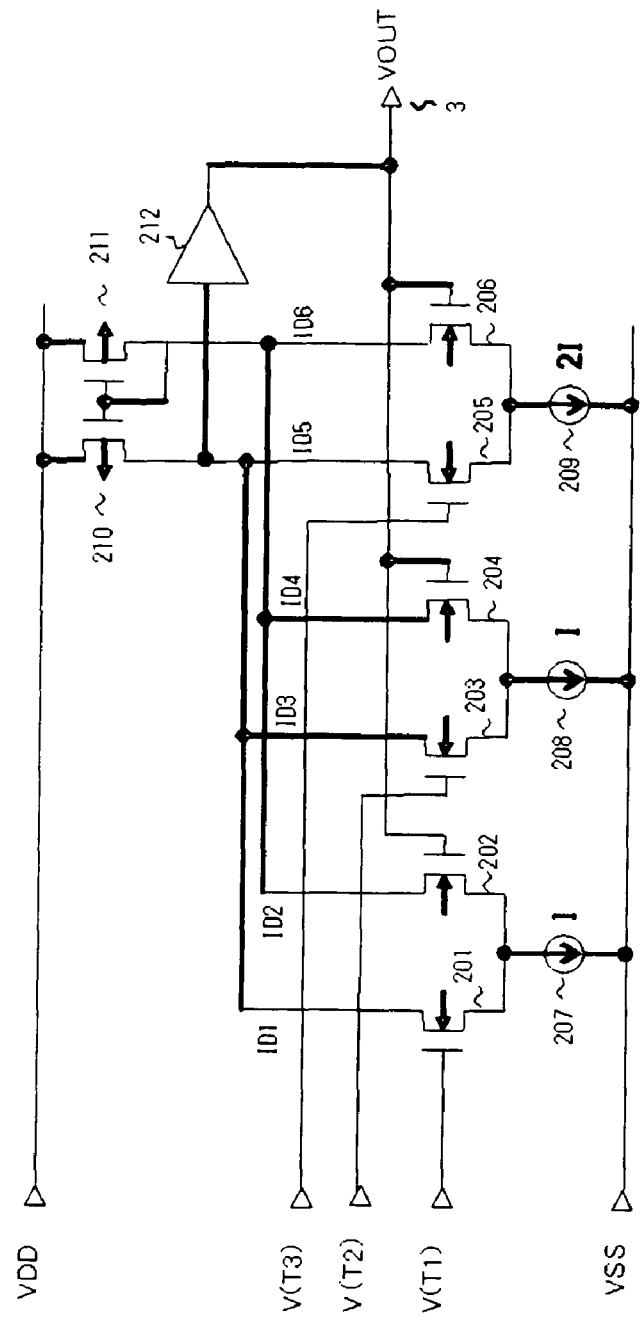
FIG. 37 is a diagram illustrating the configuration of an amplifying circuit in FIG. 16.
Figure 38:
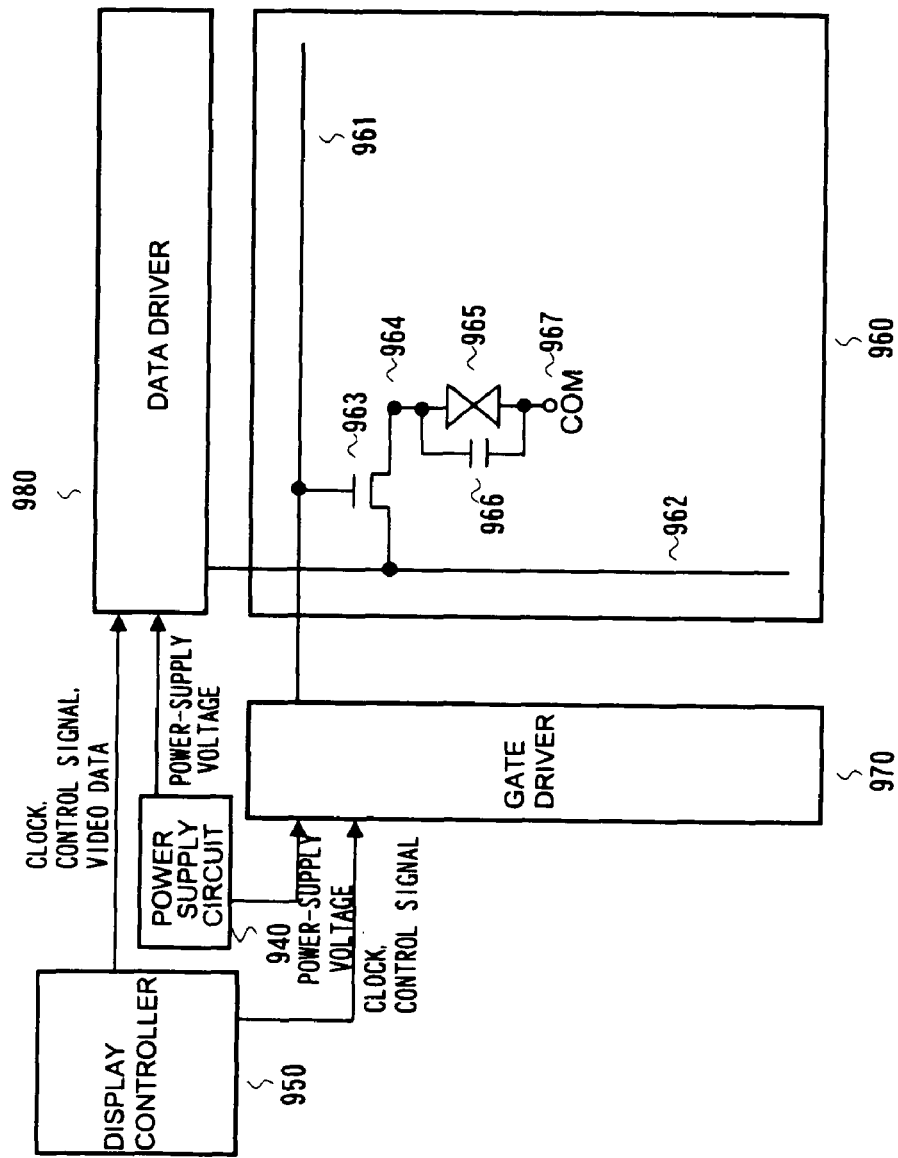
FIG. 38 is a diagram illustrating the configuration of an active-matrix liquid crystal display device.

FIG. 37 is a diagram illustrating the configuration of the amplifying circuit 30C shown in FIGS. 15B and 16. The amplifying circuit includes a first differential pair comprising Nch transistors 201 and 202 having commonly connected sources connected to a current source 207 and gates connected to terminal T1 [voltage V(T1)] and output terminal 3 (output terminal voltage Vout), respectively; a second differential pair comprising Nch transistors 203 and 204 having commonly connected sources connected to a current source 208 (the current value of which is equal to current value I of the current source 207) and gates connected to terminal T2 [voltage V(T2)] and to output terminal 3, respectively; a third differential pair comprising Nch transistors 205 and 206 (the gate width of which is 2 W) having commonly connected sources connected to a current source 209 (the current value of which is twice the current value I of the current source 207) and gates connected to T3 [voltage V(T3)] and to output terminal 3, respectively; a Pch transistor 210 connected between the commonly connected drains of the Nch transistors 201, 203 and 205 and power supply VDD; a Pch transistor 211 connected between commonly connected drains of the Nch transistors 202, 204 and 206 and the power supply VDD and having its gate and drain connected together and its gate connected to the gate of the Pch transistor 210; and an amplifying stage 212 in which a node of connection between the drain of the Pch transistor 210 and the commonly connected drains of the Nch transistors 201, 203 and 205 is connected to the input end, and which has its output end connected to the output terminal 3. The Pch transistors 210 and 211 construct a current mirror. If the gain coefficient of the Nch transistors 201, 202, 203 and 204 is β, then the gain coefficient of the Nch transistors 205 and 206 will be 2β. Accordingly, the drain currents ID1, ID2, ID3, ID4, ID5 and ID6 of the Nch transistors 201 to 206 are given by the following:

$$ID1=(\beta/2)[V(T1)-VTH]^2 \qquad (7)$$

$$ID2=(\beta/2)(Vout-VTH)^2 \qquad (8)$$

$$ID3=(\beta/2)[V(T2)-VTH]^2 \qquad (9)$$

$$ID4=(\beta/2)(Vout-VTH)^2 \qquad (10)$$

$$ID5=2(\beta/2)[V(T3)-VTH]^2 \qquad (11)$$

$$ID6=2(\beta/2)(Vout-VTH)^2 \qquad (12)$$

A current ID2+ID4+ID6 is a current (input current) that flows into the Pch transistor 211 on the input side of the current mirror circuit, and a current ID1+ID3+ID5 is a current (output current) that flows into the Pch transistor 111 on the output side of the current mirror circuit. The input current of the current mirror circuit becomes equal to the output current.

$$ID1+ID3+ID5=ID2+ID4+ID6 \qquad (13)$$

The expressions within the parentheses of Equations (7) to (12) are expanded and substituted into Equation (13), both sides are assumed to be equal with regard to linear terms of VTH, and V(T1)+V(T2)+2×V(T3)=4×Vout, namely $$Vout=[V(T1)+V(T2)+2\times V(T3)]/4 \qquad (14)$$

is obtained.

Figure 19:
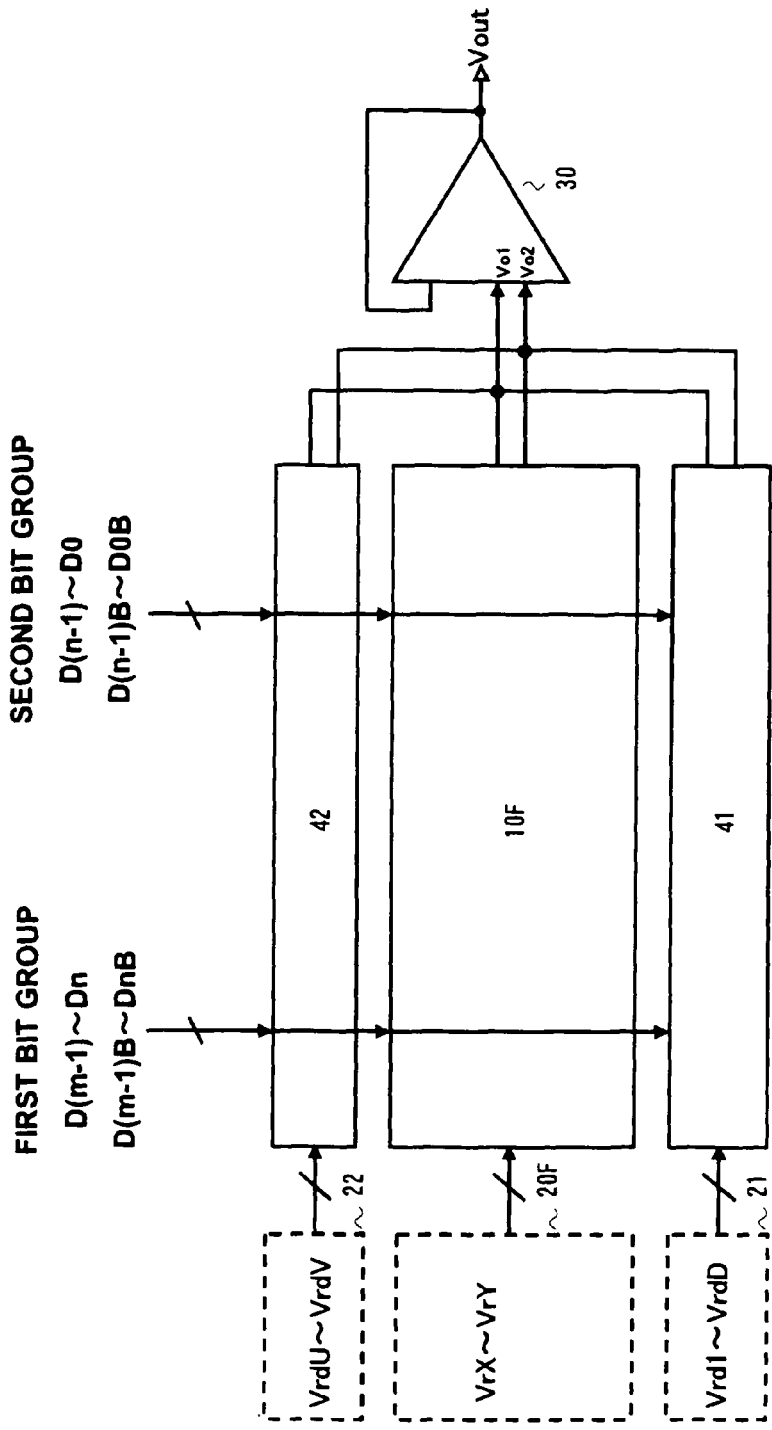
FIG. 19 is a diagram illustrating the configuration of a seventh exemplary embodiment of the present invention.

FIG. 19 is a diagram illustrating the configuration of a seventh exemplary embodiment of the present invention. FIG. 19 shows a further DAC configuration. This exemplary embodiment is an example in which a decoder according to the present invention is applied to a specific section of gray levels. The DAC of this exemplary embodiment is an example of an ideal configuration with respect to an input/output characteristic corresponding to a non-linear γ characteristic of a display device.

It should be noted that FIG. 37 is a diagram illustrating an example of the amplifying circuit 30C and that any interpolating amplifier that is adapted to operate to satisfy Equation (14) can be used besides the arrangement of FIG. 37.

With reference to FIG. 19, the DAC includes three decoders 41, 42, 10F and the interpolating amplifier 30 in an arrangement in which the DAC selects two reference voltages in accordance with the m-bit (where m is a prescribed positive integer such as 8) digital data and outputs a voltage level that is the result of interpolating these at a prescribed ratio.

The decoder 41 receives a plurality of reference voltages Vrd1 to VrdD that are output from a reference voltage generating circuit (not shown), and selects identical reference voltages as the two reference voltages (Vo1, Vo2) in accordance with the m-bit digital data.

The decoder 42 receives a plurality of reference voltages VrdU to VrdV and, in a manner similar to the decoder block 41, selects identical reference voltages as the two reference voltages (Vo1, Vo2) in accordance with the m-bit digital data.

The decoder 10F receives a plurality of reference voltages Vrx to Vr[(h−1)×S+Y] and selects adjacent reference voltages or identical reference voltages as the two reference voltages (Vo1, Vo2) in accordance with the m-bit digital data.

The two reference voltages (Vo1, Vo2) that are respectively output from the three decoders 41, 42, and 10F in response to the digital data are input to the interpolating amplifier 30, and the amplifier amplifies and outputs an interpolated voltage level obtained by taking the weighted mean at a prescribed ratio.

In this exemplary embodiment, decoders of different types can be combined using the interpolating amplifier 30 in common. The decoder 10F of this exemplary embodiment for the specific gray-level section (DBLK2 in FIG. 21) will be described in detail below.

Figure 20:
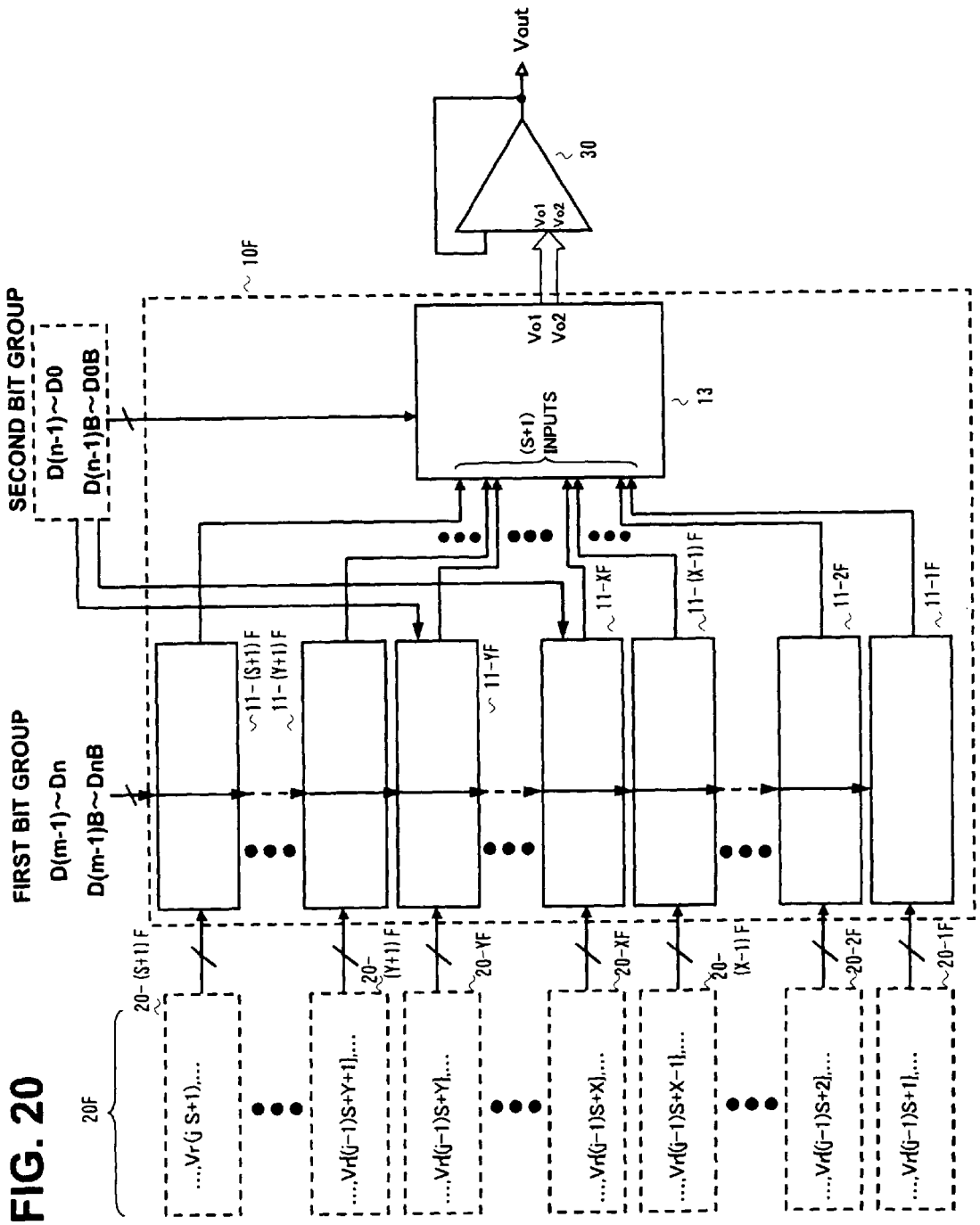
FIG. 20 is a diagram illustrating an example of the configuration of subdecoder 10F in FIG. 19.

FIG. 20 is a diagram illustrating an example of the DAC configuration of decoder 10F in FIG. 19. The interpolating amplifier 30 is shared by the decoder 10F and decoders 41 and 42 (see FIG. 19). It should be noted that FIG. 20 is an example of the configuration of the DAC of FIG. 1 in a case where the plurality of reference voltages is fewer than (h×S+1).

With reference to FIG. 20, a plurality of reference voltages Vrx to Vr[(h−1)×S+Y] fewer than (h×S+1) are divided into first to (S+1)th reference voltage groups 20-1F to 20-(S+1)F groups. More specifically, the plurality of reference voltages Vrx to Vr[(h−1)×S+Y] are obtained by omitting the following reference voltages from (h×S+1) reference voltages (where S is an integer that is a power of 2 and greater than or equal to 4 and h is an integer greater than or equal to 2) assigned to the two-dimensional array of (S+1) rows and h columns shown in FIG. 33:

the reference voltages [Vr1 to Vr(X−1)] assigned to the first to (X−1)th rows, first column of the two-dimensional array belonging to first to (X−1)th (where 1≦X≦S holds) reference voltage groups, and reference voltages {Vr[(h−1)×S+Y+1] to Vr(h×S+1)} assigned to the (Y+1)th to (S+1)th rows, hth column of the two-dimensional array belonging to (Y+1)th (where 1≦Y≦S holds) to (S+1)th reference voltage groups.

FIGS. 34A and 34B are diagrams illustrating examples of grouping of reference voltages in FIG. 20. These are examples of two-dimensional arrays for a plurality of reference voltages {VrX, Vr(X+1), . . . , Vr(S+1), . . . , Vr(2×S+1), . . . , Vr[(h−1)×S+1], . . . , Vr[(h−1)×S+Y]} fewer than (h×S+1) reference voltages. In the example of grouping shown in FIG. 34A, Y≧X holds and first to (X−1)th reference voltage groups 20-1F to 20-(X−1)F comprise (h−1) reference voltages assigned to respective ones of second to hth columns on first to (X−1)th rows of the two-dimensional array; Xth to Yth reference voltage groups 20-XF to 20-YF comprise h reference voltages assigned to respective ones of second to hth columns on Xth to Yth rows of the two-dimensional array; and (Y+1)th to (S+1)th reference voltage groups 20-(Y+1)F to 20-(S+1)F comprise (h−1) reference voltages assigned to respective ones of first to (h−1)th columns on (Y+1)th to (S+1)th rows of the two-dimensional array.

In the example of grouping shown in FIG. 34B, Y<X holds and first to Yth reference voltage groups 20-1F to 20-YF comprise (h−1) reference voltages assigned to respective ones of second to hth columns on first to Yth rows of the two-dimensional array; (Y+1)th to (X−1)th reference voltage groups 20-(Y+1)F to 20-(X−1)F comprise (h−2) reference voltages assigned to respective ones of second to (h−1)th columns on (Y+1)th to (X−1)th rows of the two-dimensional array; and Xth to (S+1)th reference voltage groups 20-XF to 20-(S+1)F comprise (h−1) reference voltages assigned to respective ones of first to (h−1)th columns on Xth to (S+1)th rows of the two-dimensional array.

In FIG. 20, the first to (S+1)th reference voltage groups 20-1F to 20-(S+1)F correspond to the grouping shown in FIG. 34A.

In FIG. 20, decoder 10F selects two identical or adjacent reference voltages in accordance with m-bit digital data. The decoder 10F includes first to (S+1)th subdecoders 11-1F to 11-(S+1)F for selecting a maximum of (S+1) voltages, which have been assigned to a corresponding column of the two-dimensional array, in accordance with values of a first bit group [upper bits D(m−1) to Dn and their complementary signals D(m−1)B to DnB] (where m>n holds) among m bits; and subdecoder 13, to which a maximum of (S+1) reference voltages that have been selected by the first to (S+1)th subdecoders 11-1F to 11-(S+1)F are input in parallel, for selecting two reference voltages (Vo1, Vo2), inclusive of redundant selection of the same reference voltage, in accordance with a value of a second bit group [lower order bits D(n−1) to D0 and their complementary signals D(n−1)B to D0B] among the m bits.

The interpolating amplifier 30, to which the two reference voltages (Vo1, Vo2) selected by the decoder 10F are input, for amplifying and outputting an interpolate voltage level obtained by taking the weighted mean at a prescribed ratio.

Further, in the decoder 10F, at least a signal of one bit from the second bit group [D(n−1) to D0, D(n−1)B to D0B] may be input to the Xth subdecoder 11-XF, and selection of reference voltage VrX of the minimum level among the plurality of reference voltages VrX to Vr[(h−1)×S+Y] is controlled.

Alternatively, at least a signal of one bit from the second bit group [D(n−1) to D0, D(n−1)B to D0B] may be input to the Yth subdecoder 11-YF, and selection of reference voltage Vr[(h−1)×S+Y] of the maximum level among the plurality of reference voltages VrX to Vr[(h−1)×S+Y] is controlled.

It should be noted that with regard to control of the selection of reference voltage Vrx or Vr[(h−1)×S+Y], an arrangement in which selection is made by each signal of the first bit group [D(m−1) to Dn, D(m−1)B to DnB] after selection is performed by a signal of at least one bit of the second bit group [D(n−1) to D0, D(n−1)B to D0B] is simple.

The subdecoders 11-1F to 11-(S+1) perform decoding in order from bits (Dn, DnB) on the lower side of the first bit group D(m−1) to Dn, D(m−1)B to DnB toward bits [D(m−1), D(m−1)B] on the upper side.

The subdecoder 13, in a manner similar to the subdecoder 13 of FIG. 1, performs decoding in order from the most significant bit [D(n−1), D(n−1)B] of the second bit group [D(n−1) to D0, D(n−1)B to D0B]. It should be noted that it is permissible to switch the decoding order of some of the bits on the lower side among the bits D(n−1) to D0, D(n−1)B to D0B [for example, it is possible to switch the decoding order of (D1, D1B) and (D0, D0B)].

In the decoder 10F of FIG. 20, in a manner similar to FIG. 1, the number of groups of reference voltages is (S+1) (where S is a power of 2 and greater than or equal to 4) and the larger the value of S, the greater the reduction in the number of reference voltages that overlap between the first reference voltage group 10-1F and (S+1)th reference voltage group 20-(S+1)F. As a result, the number of switching transistors in subdecoders 11-1F to 11-(S+1)F is reduced and a reduction in area is possible.

FIG. 21 is a diagram useful in describing an example of detailed specifications (third specifications) relating to the exemplary embodiment of FIGS. 19 and 20. The interpolating amplifier 30A of FIG. 2B is used as the interpolating amplifier 30 of FIG. 19 corresponding to the specifications of FIG. 21.

The specifications shown in FIG. 21 are for a case where the number m of bits of the digital input signal in FIG. 19 is m=8, n=3 holds and the reference voltages are Vrd1 to Vrd4, Vr3 to Vr127 and Vrd5 to Vrd8.

Levels (0 to 255) in FIG. 21 are the output voltage levels of the interpolating amplifier 30A, and it is possible to output 256 levels of levels 0 to 255 in conformity with the 8-bit digital input signal that is input to the three decoders 41, 42 and 10F. The "Vref" column indicates the correspondence between output levels and reference voltages. FIG. 21 is obtained by omitting reference voltages Vr1, Vr2, Vr128, Vr129 from the reference voltages Vr1 to Vr129 of FIG. 2 and adding on reference voltages Vrd1 to Vrd4, Vrd5 to Vrd8.

Levels 0 to 3 correspond to decoder 41 which always selects identical reference voltages (Vo1=Vo2) as the two voltages [V(T1), V(T2)] of the interpolating amplifier 30A. The block of levels comprising these levels 0 to 3 is designated DBLK1. The reference voltages of DBLK1 comprise Vrd0, Vrd1, Vrd2 and Vrd3 in correspondence with the levels 0 to 3 of the output voltage. The levels 0 to 3 of the output voltage are in 1:1 correspondence with the reference voltages Vrd0 to Vrd3 of DBLK1, and a non-linear characteristic can be supported by the setting of the reference voltages Vrd0 to Vrd3.

Levels 4 to 251 correspond to decoder 10F which selects adjacent reference voltages or identical reference voltages, as the two voltages [V(T1), V(T2)] of the interpolating amplifier 30A. The block of levels comprising the levels 4 to 251 is designated DBLK2. The reference voltages of DBLK2 comprise Vr127, which is of a level higher by one than level 251, in addition to Vr3 to Vr126 corresponding to every other two levels (even-numbered levels 4, 6, . . . , 250) of levels 4 to 251 of the output voltage. Level 251 is generated by interpolating it from Vr127 and Vr126. Since levels 4 to 251 of the output voltage are generated by interpolated outputs of the reference voltages Vr3 to Vr127 of DBLK2, application as a characteristic exhibiting a high degree of linearity is preferred.

Levels 252 to 255 correspond to decoder 42 which always selects identical reference voltages (Vo1=Vo2) as the two voltages [V(T1), V(T2)] of the interpolating amplifier 30A. The block of levels comprising these levels 252 to 255 is designated DBLK3. The reference voltages of DBLK3 comprise Vrd5, Vrd6, Vrd7, and Vrd8 in correspondence with the levels 252 to 255. The reference voltages Vr127 of DBLK2 and the reference voltage Vrd5 of DBLK3 may be made the same voltage. The levels 252 to 255 of the output voltage are in 1:1 correspondence with the reference voltages Vrd5 to Vrd8 of DBLK3, and a non-linear characteristic can be supported by the setting of the reference voltages Vrd5 to Vrd8.

Figure 22A:
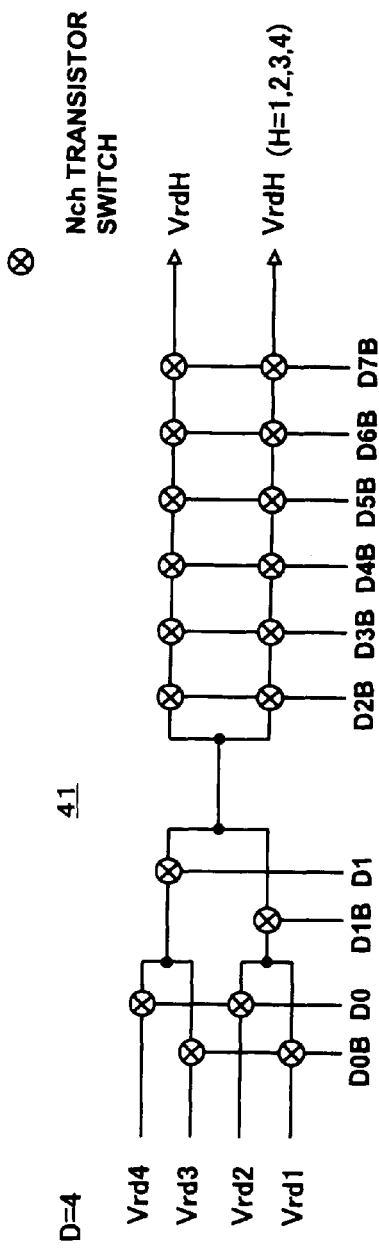
FIGS. 22A and 22B are diagrams illustrating examples of the configuration of decoders 41, 42 in FIG. 19.
Figure 22B:
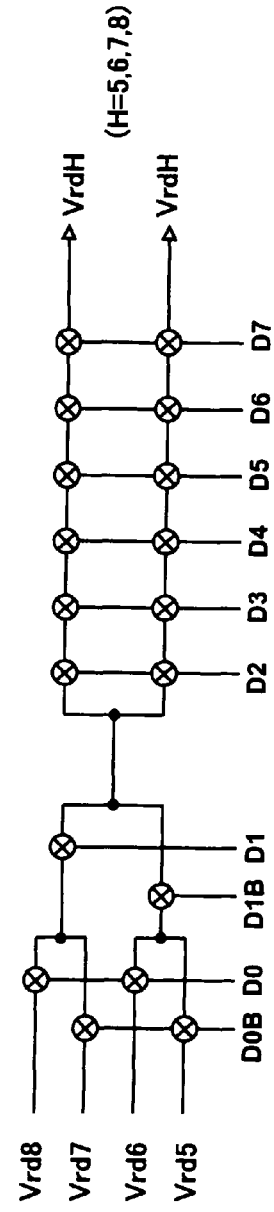

FIGS. 22A and 22B are diagrams illustrating examples of the configuration of decoders 41 and 42 of FIG. 19 that are in accordance with the specifications of FIG. 21. In the decoder 41 of FIG. 22A, in which D=4 holds in FIG. 19 and which receives four reference voltages Vrd1, Vrd2, Vrd3, Vrd4 of reference voltage group 21 as inputs, one of two adjacent reference voltages in each of pairs (Vrd1, Vrd2) and (Vrd3, Vrd4) is selected by Nch transistors (pass transistors, switch transistors) whose on/off operation is controlled by least significant bits (D0, D0B). One of the two reference voltages that have been selected by the Nch transistors connected to the bits (D0, D0B) is selected by Nch transistors connected to upper bits (D1, D1B). Furthermore, one of the two reference voltages that have been selected by the Nch transistors connected to the bits (D1, D1B) diverges into two paths where selection is controlled by Nch transistors connected to D2B to D7B. The voltages are output as VrdH (H=1, 2, 3, 4) to two terminals corresponding to the two paths. Two identical reference voltages are input to the interpolating amplifier 30A at all times.

In the decoder 42 of FIG. 22B, in which U=8, V=8 hold in FIG. 19 and which receives four reference voltages Vrd5, Vrd6, Vrd7, and Vrd8 of reference voltage group 22 as inputs, one reference voltage is selected, by Nch transistors connected to (D0, D0B) and (D1, D1B), in a manner similar to that of FIG. 22A. Furthermore, one of the two reference voltages diverges into two paths where selection is controlled by Nch transistors connected to D2 to D7. The voltages are output as VrdH (H=5, 6, 7, 8) to two terminals. Two identical reference voltages are input to the interpolating amplifier 30A at all times.

Figure 23:
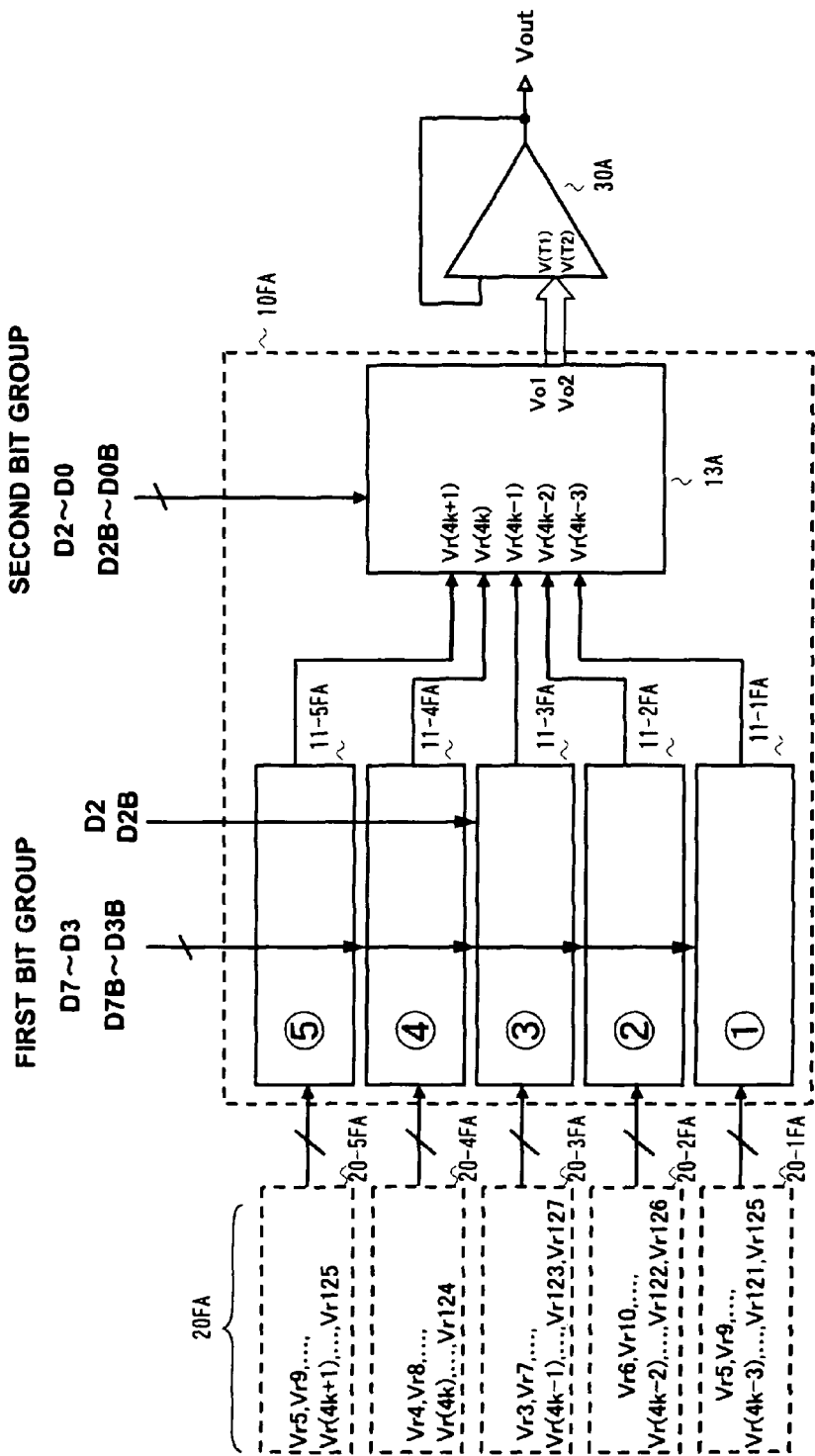
FIG. 23 is a diagram illustrating the configuration of an eighth exemplary embodiment (in a case where S=4 in FIG. 20) of the present invention.

FIG. 23 is a diagram illustrating the configuration of an eighth exemplary embodiment of the present invention. This exemplary embodiment is a diagram illustrating the configuration of the exemplary embodiment of FIG. 20 that is in accordance with the specifications of level block DBLK2 in FIG. 21. Reference voltages for outputting levels 4 to 251 corresponding to DBLK2 are Vr3 to Vr127, and VrX and VrY of FIG. 20 become Vr3 and Vr127, respectively. FIG. 23 is a diagram illustrating the configuration of an exemplary embodiment in a case where the number of reference voltage groups is five (S=4). The reference voltages are divided into five (S=4) reference voltage groups 20-1FA to 20-5FA, and the two-dimensional array in FIG. 34A is an array of five rows and h (=32) columns.

With reference to FIG. 23, the decoder 10FA, in which the number m of bits of the digital signal is m=8 and n=3 holds, includes five subdecoders 11-1FA to 11-5FB for selecting and outputting a maximum of five reference voltages [Vr(4k−3) to Vr(4k+1)], which have been assigned to a corresponding column [e.g., a kth column, where k=any value among 1, 2, . . . , h (h=32)] of the two-dimensional array, in accordance with five upper bits (D7 to D3, D7B to D3B) of the digital signal. When k=1 holds for the kth column, three reference voltages [Vr(4k−1), Vr(4k), Vr(4k+1)] from which Vr(4k−3) and Vr(4k−2) are excluded are selected, and when k=h holds for the kth column, three reference voltages [Vr(4k−3), Vr(4k−2), Vr(4k−1)] from which Vr(4k), Vr(4k+1) are excluded are selected. The decoder 10FA further includes subdecoder 13A for selecting and outputting two adjacent or identical reference voltages (Vo1, Vo2), in accordance with the three lower order bits (D2 to D0, D2B to D0B) of the digital signal, out of the maximum of five voltages [Vr(4k−3) to Vr(4k+1)] that have been selected by the subdecoders 11-1FA to 11-5FB. It should be noted that in the decoder 10FA, at least a signal of one bit from the second bit group [D(n−1) to D0, D(n−1)B to D0B] is input to the subdecoder 11-3FA, and selection of reference voltage Vr3 of the minimum level or reference voltage Vr127 of the maximum level is controlled. Further, the subdecoder 13A may have the configuration of FIG. 5 or FIG. 6 in a manner similar to subdecoder 13A of FIG. 3.

The arrangement of FIG. 23 is such that in level block DBLK2 of FIG. 21, eight consecutive levels in which a level that is a multiple of eight serves as the reference are set as one section, four adjacent reference voltages are assigned to this section, and the level at the end of this section (the eighth level from the lower side) shares the one reference voltage having the lowest level in the adjacent section. Levels 4 to 251 are partitioned into 32 sections. In just two sections, however, namely levels 4 to 7 (the first section) and levels 248 to 251 (the 32nd section), there are four consecutive levels and these sections are adopted as one section. That is, FIG. 23 is similar to an arrangement obtained by excluding reference voltages Vr1, Vr2, Vr128, Vr129 from the arrangement of FIG. 3.

Figure 24:
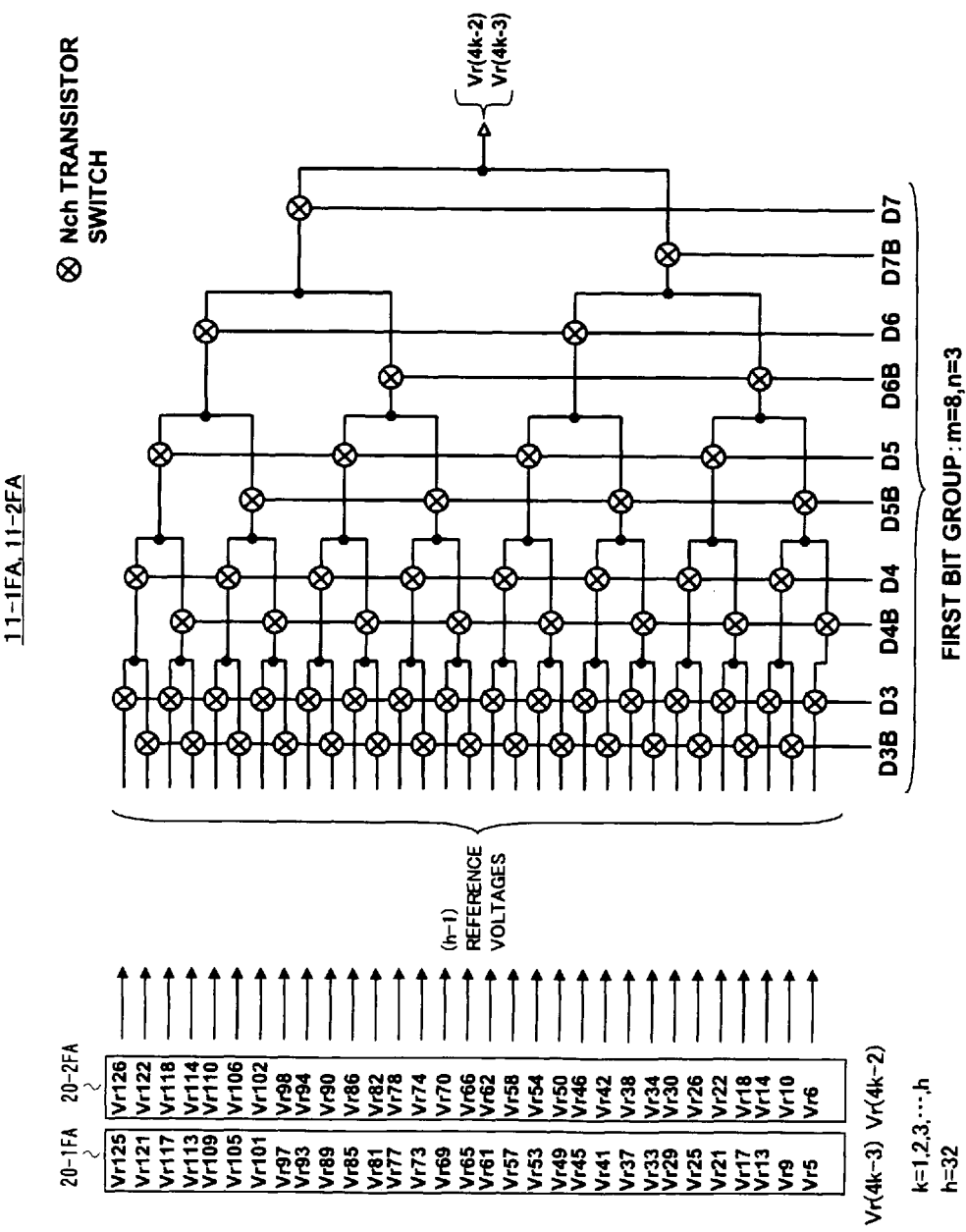
FIG. 24 is a diagram illustrating an example of the configuration of subdecoders 11-1FA, 11-2FA in FIG. 3.

FIG. 24 is a diagram illustrating an example of the configuration of subdecoders 11-1FA and 11-2FA in FIG. 23. In the case of the specifications of FIG. 21, the subdecoders 11-1FA and 11-2FA are identically constructed. Reference voltage group 20-1FA (Vr5, Vr9, . . . , Vr125) and reference voltage group 20-2FA (Vr6, Vr10, . . . , Vr126), which are input to subdecoders 11-1FA and 11-2FA, respectively, each include 31 reference voltages, which is one less than h (h=32). The arrangement of the subdecoders 11-1FA and 11-2FA is such that one Nch transistor switch, which is connected to D3B, for selecting the least significant reference voltage (Vr1 or Vr2) of each subdecoder is deleted from the subdecoder 11-iA (i=1, 2) of FIG. 4.

Figure 25:
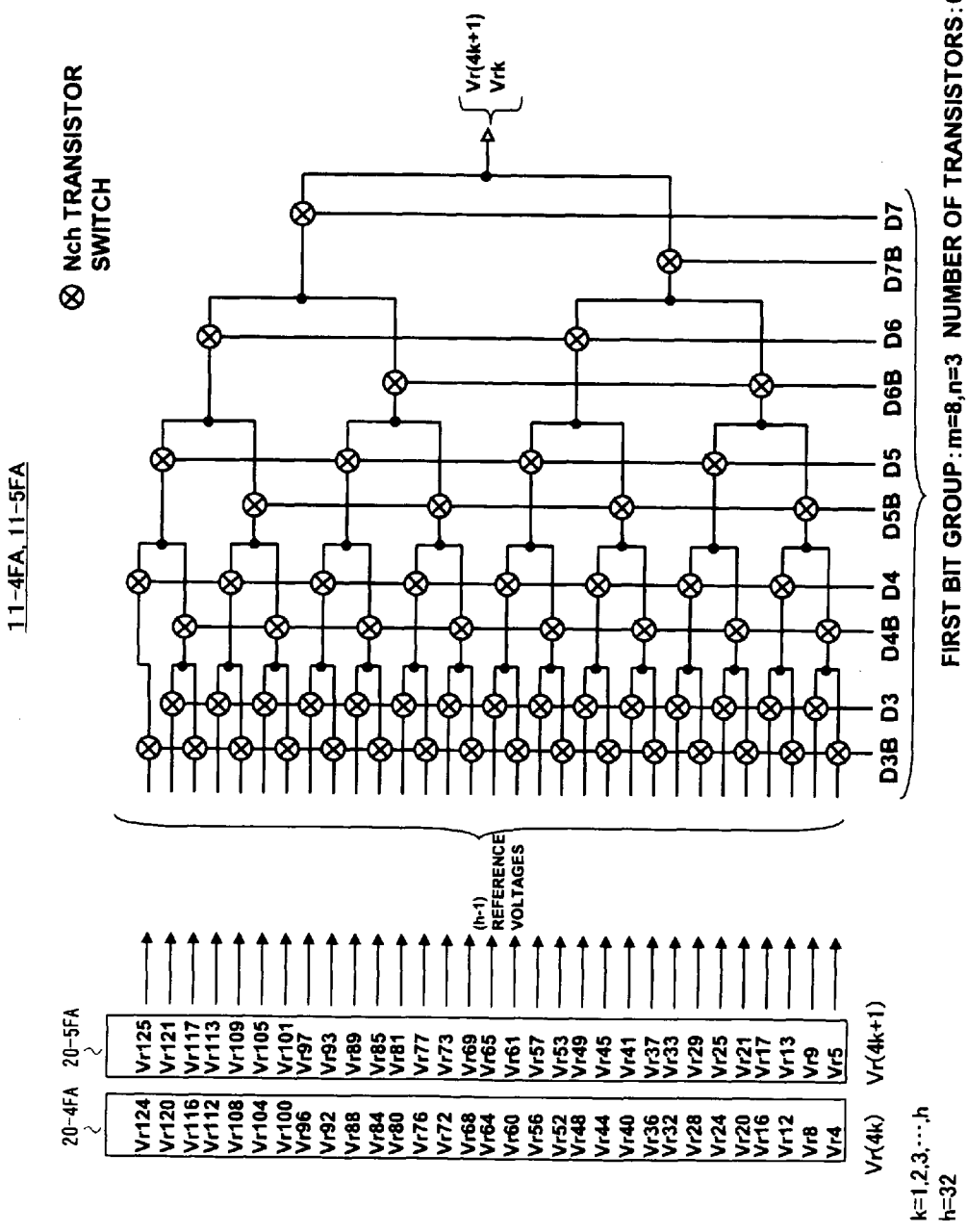
FIG. 25 is a diagram illustrating an example of the configuration of subdecoders 11-1FA, 11-2FA in FIG. 23.

FIG. 25 is a diagram illustrating an example of the configuration of subdecoders 11-4FA and 11-5FA in FIG. 23. In the case of the specifications of FIG. 21, the subdecoders 11-4FA and 11-5FA are identically constructed. Reference voltage group 20-4FA (Vr4, Vr8, . . . , Vr124) and reference voltage group 20-5FA (Vr5, Vr9, . . . , Vr125), which are input to subdecoders 11-4FA and 11-5FA, respectively, each include 31 reference voltages, which is one less than h (h=32). The arrangement of the subdecoders 11-4FA and 11-5FA is such that one Nch transistor switch, which is connected to D3, for selecting the most significant reference voltage (Vr128 or Vr129) of each subdecoder is deleted from the subdecoder 11-iA (i=4, 5) of FIG. 4.

Figure 26:
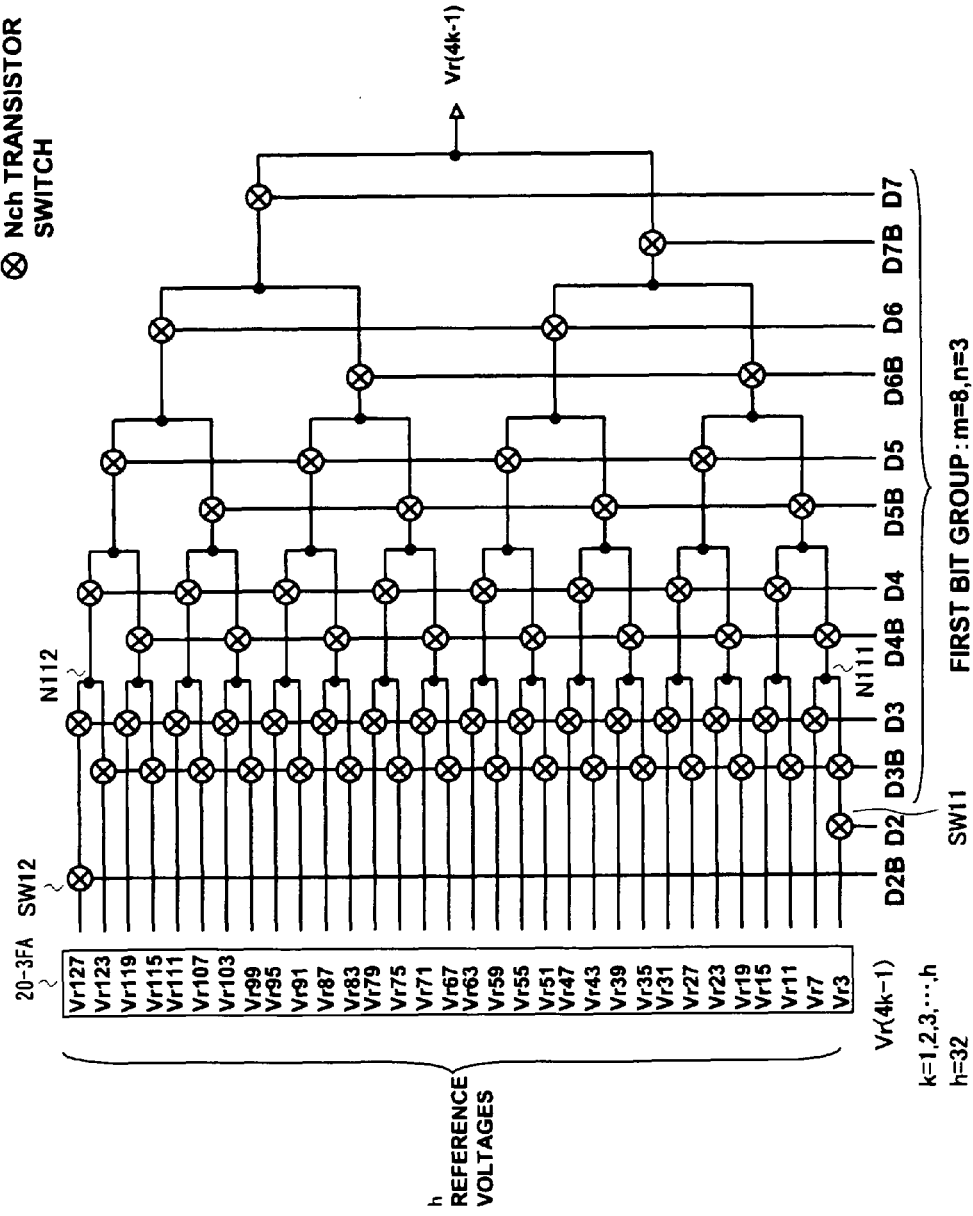
FIG. 26 is a diagram illustrating an example of the configuration of subdecoder 11-3FA in FIG. 23.

FIG. 26 is a diagram illustrating an example of the configuration of subdecoder 11-3FA in FIG. 23. In the case of the specifications of FIG. 21, the reference voltages of reference voltage group 20-3FA (Vr3, Vr7, . . . , Vr127) that is input to the subdecoder 11-3FA are h (=32) in number. The arrangement of subdecoder 11-3FA is such that transistor switches (SW11, SW12) connected to a signal of at least one bit in the second bit group (D2 to D0, D2B to D0B) have been added to the subdecoder 11-iA (i=3) of FIG. 4.

The additional transistor switches will now be described. With regard to levels 3 and 4 at the boundary of level blocks DBLK1 and DBLK2 in the specifications of FIG. 21, level 3 belonging to the level block DBLK1 is generated by two identical reference voltages (Vrd4, Vrd4), and level 4 belonging to the level block DBLK2 is generated by two identical reference voltages (Vr3, Vr3). The condition for selection of levels 3 and 4 is that the values of the first bit group (D3 to D7) be identical and that the values of the second bit group be different from each other, i.e., (D2, D1, D0)=(0,1,1) and (1,0,0). In subdecoder 13A (FIGS. 5 and 6), however, reference voltage Vr3 [when k=1 holds in Vr(4k−1)] selected by subdecoder 11-3FA is selected by both (D2, D1, D0)=(0,1,1) and (1,0,0), and therefore reference voltage Vr3 is selected by the values of the bit signal of level 3. That is, in the specifications of FIG. 21, if the values of the bit signal corresponding to level 3 are input, then an overlapping selection of Vrd4 by DBLK1 and Vr3 by DBLK2 will occur and an abnormal output will be produced. In order to prevent this, a transistor switch connected to a signal of at least one bit of the second bit group (D2 to D0, D2B to D0B) is added on. The condition for not selecting reference voltage Vr3 by level 3 and selecting it by level 4 (and level 5) is D2=1 or D1=0. In FIG. 26, the additional transistor switch is implemented by Nch transistor switch SW11, which is connected between the supply node of reference voltage Vr3 and node N111, in series with the Nch transistor switch connected to D3B on the lower side of the first bit group, and which is also connected to D2. It goes without saying that the switch connected to D3B and the switch SW11 may be interchanged in terms of their connections.

Further, the switch SW11 may be an Nch transistor switch connected to D1B instead of D2.

Further, with regard to levels 251, 252 and 253 at the boundary of level blocks DBLK2 and DBLK3 in the specifications of FIG. 21, levels 252 and 253 belonging to the level block DBLK3 are generated by two identical reference voltages (Vrd4, Vrd4) and (Vrd6, Vrd6) and level 251 belonging to the level block DBLK2 is generated by the interpolated output of two adjacent reference voltages (Vr126, Vr127).

The condition for selection of levels 251, 252 and 253 is that the values of the first bit group (D3 to D7) be identical and that the values of the second bit group be different, i.e., (D2, D1, D0)=(0,1,1) and (1,0,0) and (1,0,1). In subdecoder 13A (FIGS. 5, 6), however, reference voltage Vr127 [when k=32 holds in Vr(4k−1)] selected by subdecoder 11-3FA is selected by all of (D2, D1, D0)=(0,1,1), (1,0,0) and (1,0,1), and therefore reference voltage Vr127 is selected by the levels 252 and 253. That is, in the specifications of FIG. 21, if the values of the bit signal corresponding to levels 252 and 253 are input, then an overlapping selection of Vrd5 or Vrd6 by level DBLK3 and Vr127 by level block DBLK2 will occur and an abnormal output will be produced.

In order to prevent this, a transistor switch connected to a signal of at least one bit of the second bit group (D2 to D0, D2B to D0B) is added on. The condition for selecting reference voltage Vr127 by level 251 and not selecting it by levels 252 and 253 is D2=0 or D1=1. In FIG. 26, the additional transistor switch is implemented by Nch transistor switch SW12, which is connected between the supply node of reference voltage Vr127 and node N112, in series with the Nch transistor switch connected to D3 on the lower side of the first bit group, and which is also connected to D2B. The switch SW12 may be an Nch transistor switch connected to D1 instead of D2B.

Figure 27:
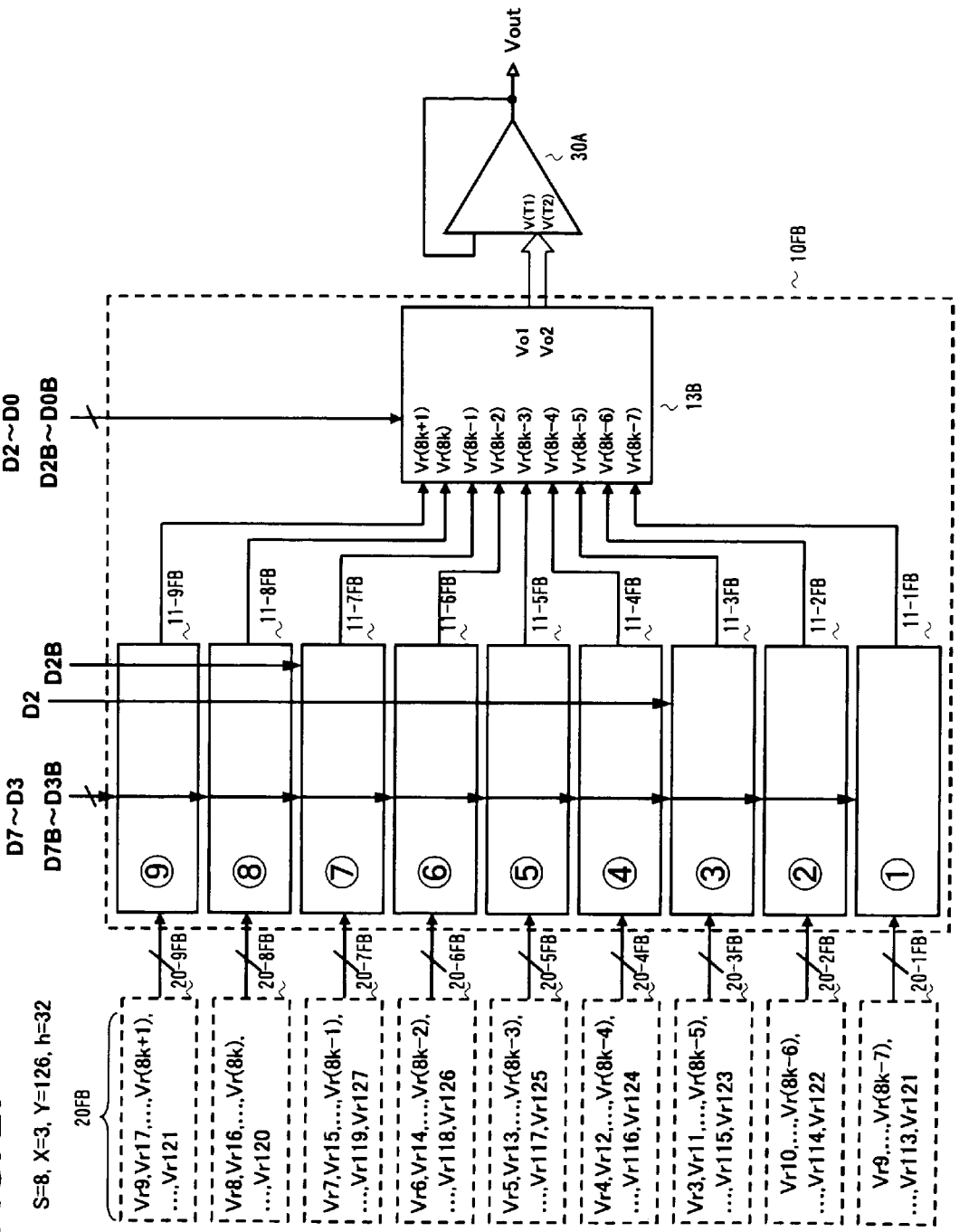
FIG. 27 is a diagram illustrating the configuration of a ninth exemplary embodiment (in a case where S=8 in FIG. 20) of the present invention.

FIG. 27 is a diagram illustrating the configuration of a ninth exemplary embodiment of the present invention. This exemplary embodiment is a diagram illustrating another example of the configuration of FIG. 20 that is in accordance with the specifications of level block DBLK2 in FIG. 21. Reference voltages for outputting levels 4 to 251 corresponding to DBLK2 are Vr3 to Vr127. VrX and VrY of FIG. 20 become Vr3 and Vr127, respectively. FIG. 27 is a diagram illustrating the configuration of an exemplary embodiment in a case where the number of reference voltage groups is nine (S=8). The reference voltages are divided into nine (S=8) reference voltage groups 20-1FB to 20-9FB, and the two-dimensional array in FIG. 34A is an array of nine rows and h (=16) columns.

With reference to FIG. 27, the decoder 10FB, in which the number m of bits of the digital signal is m=8 and n=4 holds, includes nine subdecoders 11-1FB to 11-9FB for selecting and outputting a maximum of nine reference voltages [Vr (8k−7) to Vr(8k+1)], which have been assigned to a corresponding column [e.g., a kth column, where k=any value among 1, 2, . . . , h (h=32)] of the two-dimensional array, in accordance with four upper bits (D7 to D4, D7B to D4B) of the digital signal. When k=1 holds for the kth column, seven reference voltages [Vr(8k−5) to Vr(8k+1)] from which Vr(8k−7), Vr(8k−6) are excluded are selected, and when k=h holds for the kth column, seven reference voltages [Vr(8k−7), to Vr(8k−1)] from which Vr(8k), Vr(8k+1) are excluded are selected. The decoder 10FB further includes subdecoder 13B for selecting and outputting two adjacent or identical reference voltages (Vo1, Vo2), in accordance with the four lower order bits (D3 to D0, D3B to D0B) of the digital signal, out of the maximum of nine voltages [Vr(8k−7) to Vr(8k+1)] that have been selected by the subdecoders 11-1FB to 11-9FB. It should be noted that in the decoder 10FB, at least a signal of one bit from the second bit group [D(n−1) to D0, D(n−1)B to D0B] is input to the subdecoder 11-3FB or 11-7FB, and selection of reference voltage Vr3 of the minimum level or reference voltage Vr127 of the maximum level is controlled. Further, the subdecoder 13B may have the configuration of FIG. 11 or a configuration equivalent to that of FIG. 11 in a manner similar to subdecoder 13B of FIG. 9.

The arrangement of FIG. 27 is such that in level block DBLK2 of FIG. 21, 16 consecutive levels in which a level that is a multiple of 16 serves as the reference are set as one section, eight adjacent reference voltages are assigned to this section, and the level at the end of this section (the 16th level from the lower side) shares the one reference voltage having the lowest level in the adjacent section. Levels 4 to 251 are partitioned into 16 sections. In just two sections, however, namely levels 4 to 15 (the first section) and levels 240 to 251 (the 16th section), there are 12 consecutive levels and these sections are adopted as one section. That is, FIG. 27 is similar to an arrangement obtained by excluding reference voltages Vr1, Vr2, Vr128, and Vr129 from the arrangement of FIG. 9.

The arrangement of the subdecoders 11-1FB and 11-2FB is such that one Nch transistor switch, which is connected to D4B, for selecting the least significant reference voltage (Vr1 or Vr2) of each subdecoder is deleted from the subdecoder 11-iA (i=1, 2) of FIG. 10.

The arrangement of the subdecoders 11-8FB and 11-9FB is such that one Nch transistor switch, which is connected to D4, for selecting the most significant reference voltage (Vr128 or Vr129) of each subdecoder is deleted from the subdecoder 11-iA (i=8, 9) of FIG. 10. The subdecoders 11-4FB to 11-6FB have the same construction as that of subdecoder 11-iA (i=4 to 6) of FIG. 10.

Figure 28:
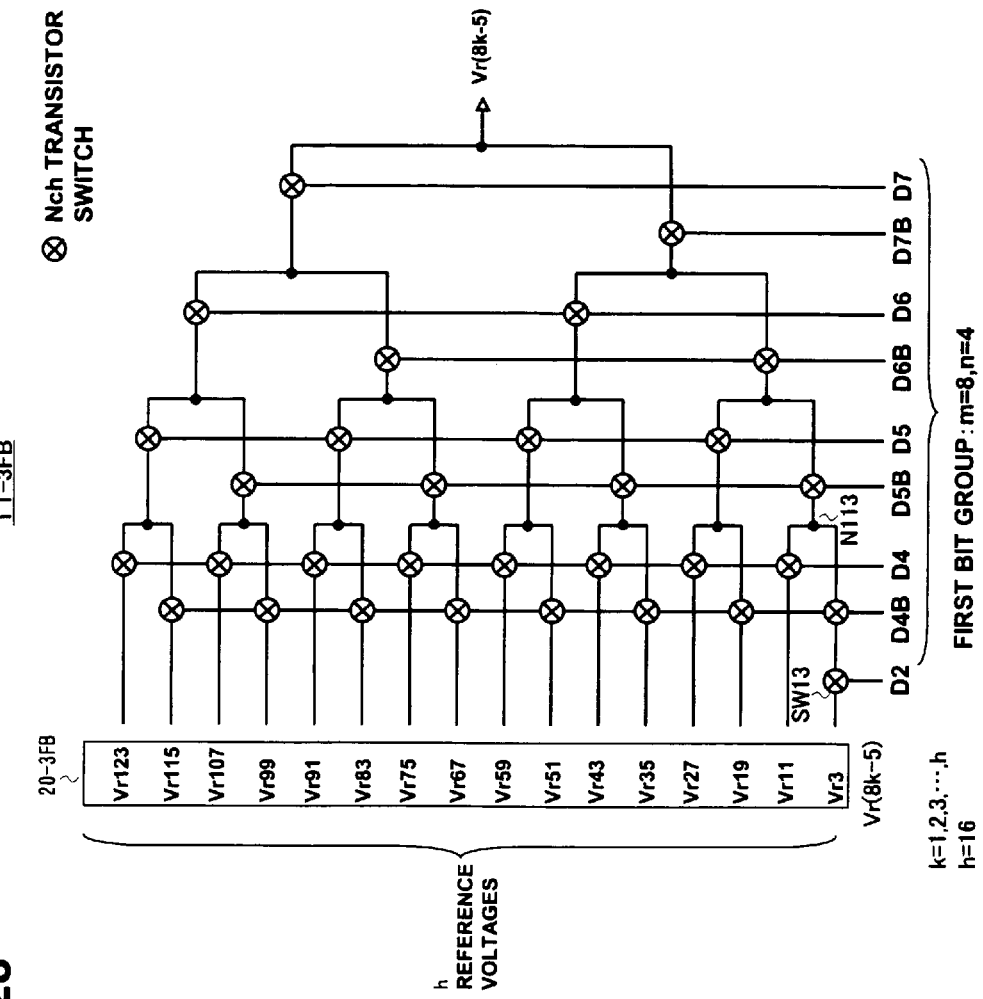
FIG. 28 is a diagram illustrating an example of the configuration of subdecoder 11-3FB in FIG. 27.

FIG. 28 is a diagram illustrating an example of the configuration of subdecoder 11-3FB in FIG. 27. In the case of the specifications of FIG. 21, the arrangement of subdecoder 11-3FB is such that a transistor switch connected to a signal of at least one bit in the second bit group (D3 to D0, D3B to D0B) has been added to the subdecoder 11-iA (i=3) of FIG. 10.

Specifically, the condition for selection of levels 3 and 4 at the boundary of level blocks DBLK1 and DBLK2 is that the values of the first bit group (D4 to D7) be identical and that the values of the second bit group be different from each other, i.e., (D3, D2, D1, D0)=(0,0,1,1) and (0,1,0,0).

In subdecoder 13B (FIG. 11), however, reference voltage Vr3 [when k=1 holds in Vr(8k−5)] selected by subdecoder 11-3FB is selected by both (D3, D2, D1, D0)=(0,0,1,1) and (0,1,0,0), and therefore reference voltage Vr3 is selected by the bit signal of level 3.

That is, in the specifications of FIG. 21, if the values of the bit signal corresponding to level 3 are input, then an overlapping selection of Vrd4 by DBLK1 and Vr3 by DBLK2 will occur and an abnormal output will be produced. In order to prevent this, a transistor switch connected to a signal of at least one bit of the second bit group (D3 to D0, D3B to D0B) is added on. The condition for not selecting reference voltage Vr3 by level 3 and selecting it by level 4 (and level 5) is D2=1 or D1=0. In FIG. 28, the additional transistor switch is implemented by Nch transistor switch SW13, which is connected between the supply node of reference voltage Vr3 and node N113, in series with the Nch transistor switch connected to D4B on the lower side of the first bit group, and which is also connected to D2. The switch SW13 may be an Nch transistor switch connected to D1B instead of D2.

Figure 29:
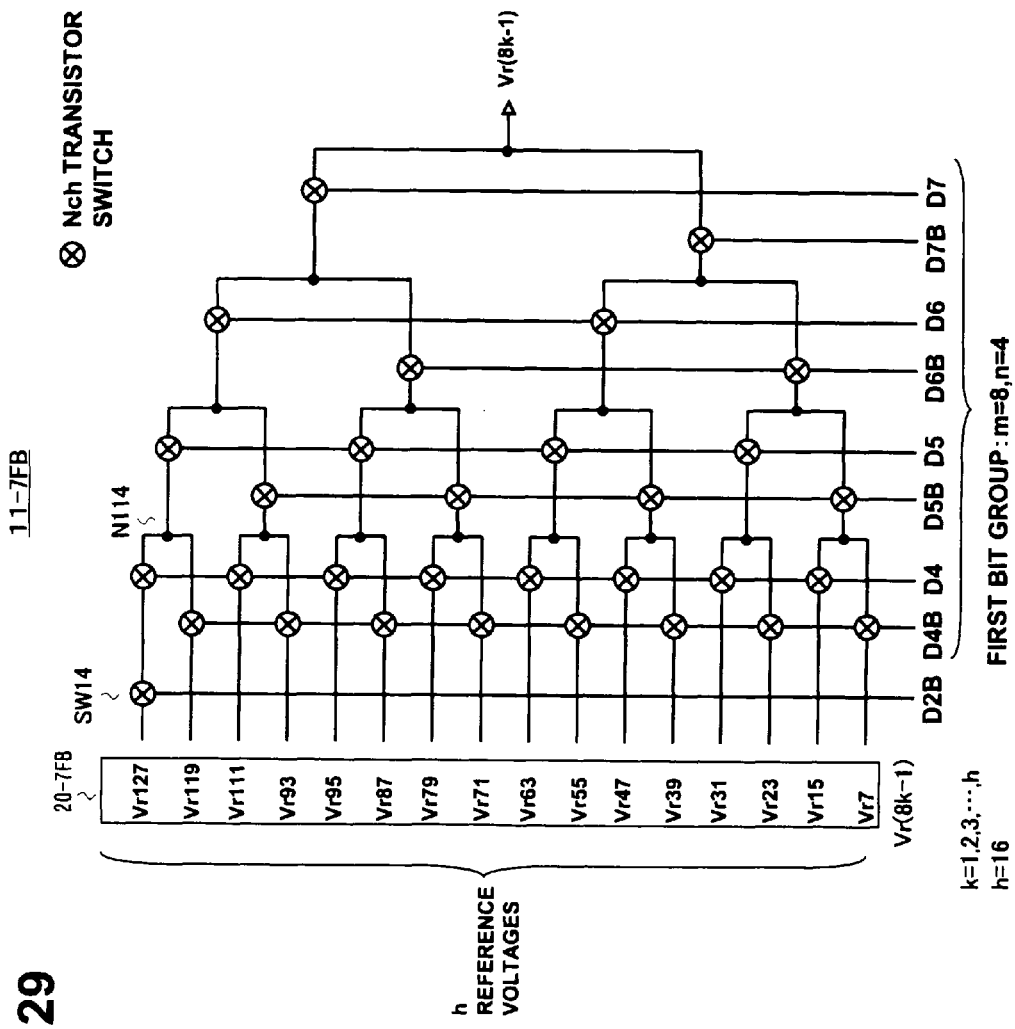
FIG. 29 is a diagram illustrating an example of the configuration of subdecoder 11-7FB in FIG. 27.

FIG. 29 is a diagram illustrating an example of the configuration of subdecoder 11-7FB in FIG. 27. In the case of the specifications of FIG. 21, the arrangement of subdecoder 11-7FB is such that a transistor switch connected to a signal of at least one bit in the second bit group (D3 to D0, D3B to D0B) has been added to the subdecoder 11-iA (i=7) of FIG. 10. Specifically, the condition for selection of levels 251, 252, and 253 at the boundary of level blocks DBLK2 and DBLK3 is that the values of the first bit group (D4 to D7) be identical and that the values of the second bit group be different from each other, i.e., (D3, D2, D1, D0)=(1,0,1,1) and (1,1,0,0) and (1,1,0,1). In subdecoder 13B (FIG. 11), however, reference voltage Vr127 [when k=16 holds in Vr(8k−1)] selected by subdecoder 11-7FB is selected by all of (D3, D2, D1, D0)=(1,0,1,1) and (1,1,0,0) and (1,1,0,1), and therefore reference voltage Vr127 is selected by the values of the bit signals of levels 252 and 253. That is, in the specifications of FIG. 21, if the values of the bit signals corresponding to levels 252 and 253 are input, then an overlapping selection of Vrd5 or Vrd6 by DBLK3 and Vr127 by DBLK2 will occur and an abnormal output will be produced.

In order to prevent this, a transistor switch connected to a signal of at least one bit of the second bit group (D3 to D0, D3B to D0B) is added on. The condition for selecting reference voltage Vr127 by level 251 and not selecting it by levels 252 and 253 is D2=0 or D1=1. In FIG. 29, the additional transistor switch is implemented by Nch transistor switch SW14, which is connected between the supply node of reference voltage Vr127 and node N114, in series with the Nch transistor switch connected to D4 on the lower side of the first bit group, and which is also connected to D2B. The switch SW14 may be an Nch transistor switch connected to D1 instead of D2B.

Examples have been described above with reference to FIGS. 26, 28 and 29 in which additional transistor switches (SW11, SW12, SW13, SW14) are provided for preventing an abnormal error due to overlapping selection between level blocks DBLK1 and DBLK2 or between level blocks DBLK2 and DBLK3. However, this also depends upon the setting of the boundary position between the level blocks. FIG. 23 adopts a section configuration in which a level that is a multiple of eight serves as the standard in the level block DBLK2 of FIG. 21. FIG. 27 adopts a section configuration in which a level that is a multiple of 16 serves as the standard in the level block DBLK2 of FIG. 21. In a case where the position of the boundary between level blocks differs from the level that is the standard of the section, an additional transistor switch for preventing abnormal output due to overlapping selection between level blocks becomes necessary. With the specifications of FIG. 21, the boundary between level blocks is different from the boundary of a level that is a multiple of eight or a level that is a multiple of 16 at both levels 3, 4 and 251, 252. As a consequence, an additional transistor switch for preventing an abnormal output is required.

On the other hand, in a case where the boundary position between level blocks is the level that is the standard of the section, an additional transistor switch is not required because the reference voltage between the levels at the boundary is selected appropriately. For example, in the section configuration in which a level that is a multiple of eight in FIG. 23 is adopted as the standard, if the specifications are such that the position of the boundary between the level blocks DBLK1 and DBLK2 has been set to levels 7, 8, then the condition for selection of levels 7 and 8 is that the values of the first bit group be different from each other, i.e., (D7, D6, D5, D4, D3)=(0,0,0,0,0) and (0,0,0,0,1).

The least significant reference voltage Vr5 of level block DBLK2 is not selected by (D7, D6, D5, D4, D3)=(0,0,0,0,0) and is selected by (D7, D6, D5, D4, D3)=(0,0,0,0,1). When the level is level 7, therefore, reference voltage Vr5 is not selected and overlapping selection between level blocks will not occur.

FIG. 30 is a diagram useful in describing another specific example of specifications (fourth specifications) relating to the exemplary embodiment shown in FIGS. 19 and 20. The specifications of FIG. 30 represent an example in which the corresponding relationship between output levels and reference voltages corresponding to DBLK2 is changed from that shown in FIG. 21. The blocks DBLK1 and DBLK3 are similar to those shown in FIG. 21. Further, the interpolating amplifier 30 of FIG. 10 also employs the interpolating amplifier 30A of FIG. 2B.

In FIG. 30, the reference voltages of DBLK2 comprise, in addition to Vr4 to Vr127 corresponding to every other two levels of levels 4 to 25 (odd-numbered levels 5, 7, . . . , 251) of the output voltages, a reference voltage Vr3 one level lower than level 4. Level 4 is generated by interpolating it from Vr3 and Vr4. The reference voltage Vr3 may be made a voltage identical with the reference voltage Vrd4 of DBLK1.

Figure 31B:
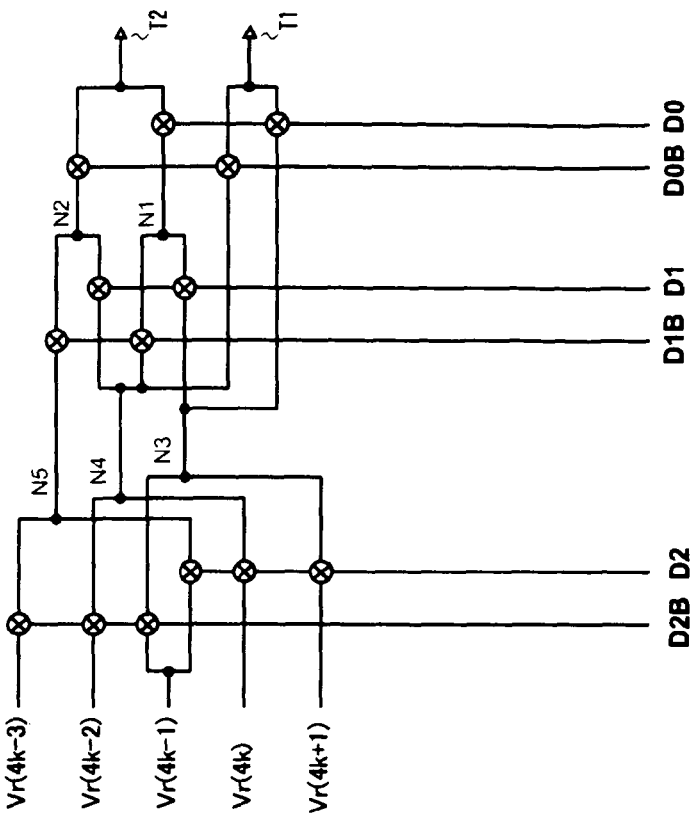
FIG. 31B is a diagram illustrating another example of FIG. 31A.
Figure 31A:
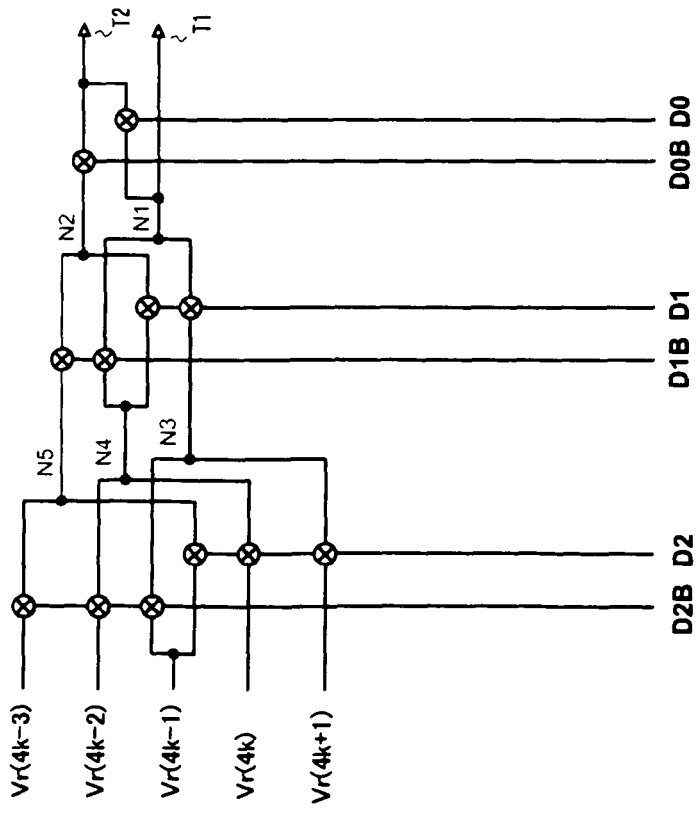
FIG. 31A is a diagram illustrating an example of the configuration of subdecoder 13A in FIG. 23 corresponding to the specifications of FIG. 30.

The reference voltages corresponding to level block DBLK2 in FIG. 30 are set so as to be shifted by one level from the reference voltages corresponding to DBLK2 of FIG. 21. In order to perform a change to decoder 10F (10FA, 10FB) corresponding to the specifications of FIG. 30, it will suffice merely to interchange the normal signal of the second bit group [D(n−1) to D0, D(n−1)B to D0B) and its complementary signal and reverse the order of the reference voltages that are input to the subdecoders 13 (13A, 13B). Specifically, reference will be had to FIGS. 31A and 31B taking the case of subdecoder 13A of FIG. 23 as an example. FIGS. 31A, 31B are two configurations of subdecoder 13A corresponding to the specifications of FIG. 30. FIG. 31A is such that in the subdecoder 13A of FIG. 5, the normal signal (D2, D1, D0) and complementary signal (D2B, D1B, D0B) of the second bit group (D2, D2B) to (D0, D0B) are interchanged and the order of the reference voltages Vr(4k−3) to Vr(4k+1) is reversed to the order Vr(4k+1) to Vr(4k−3). The same is true for FIG. 31B is arranged in the subdecoder 13B of FIG. 6. As a result of this arrangement, the specifications can be changed over from those of FIG. 21 to those of FIG. 30 in simple fashion.

FIG. 32 is a diagram illustrating the configuration of a tenth exemplary embodiment of the present invention and shows the principal portion of the configuration of a data driver in a display device according to the present invention. As shown in FIG. 32, the data driver comprises a reference voltage generating circuit 50, decoders 60, amplifying circuits 30, a latch address selector 70, a latch 80 and a level shifter 90. The reference voltage generating circuit 50, each decoder 60 and each amplifying circuit 30 respectively comprise the reference voltage groups 20, the decoder 10 and the amplifying circuit 30 described in the foregoing exemplary embodiments.

The latch address selector 70 decides the timing of the data latch based upon a clock signal CLK. The latch 80 latches input video digital data based upon the timing decided by the latch address selector 70 and outputs data to the decoders 10 in unison via the level shifter 90 in accordance with an STB signal (strobe signal). The latch address selector 70 and latch 80 are logic circuits and generally operate at low voltages (0 to 3.3. V).

Each decoder 60 is implemented by decoder 10, 10A, 10A', 10B, 10B' and 10C of FIGS. 1, 3, 7, 9, 12 and 16 or by decoder block 10F (10FA, 10FB), 41 and 42 of FIG. 19 (FIGS. 20, 23, 27).

In accordance with this exemplary embodiment, it is possible to realize a data driver and display device in which it is possible to reduce the number of necessary reference voltages and the number of switch transistors in a decoder with respect to the number of output levels and to reduce area. In the data driver, moreover, it is possible to reduce the wiring intersections in the subdecoder 13 of the decoder. This contributes to a reduction in the layout area of the data driver.

The disclosures of Patent Documents 1 and 2 cited above are incorporated by reference in this specification. Within the bounds of the full disclosure of the present invention (inclusive of the scope of the claims), it is possible to modify and adjust the modes and exemplary embodiments of the invention based upon the fundamental technical idea of the invention. Multifarious combinations and selections of the various disclosed elements are possible within the bounds of the scope of the claims of the present invention. That is, it goes without saying that the invention covers various modifications and changes that would be obvious to those skilled in the art within the scope of the claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A digital-to-analog converting circuit comprising:
   a decoder that selects, responsive to an input digital signal, first and second voltages out of a plurality of reference voltages that differ from one another; and
   an amplifying circuit that receives the first and second voltages selected by the decoder and that outputs an output voltage level obtained by interpolating the first and second voltages,
   wherein the plurality of reference voltages are grouped into first to (S+1)th reference voltage groups, where S is an integer that is a power of 2 and greater than or equal to 4,
   wherein the first to (S+1)th reference voltage groups are respectively assigned to rows and orderings of the reference voltages, which belong to each of the reference voltage groups, within the each of the reference voltage groups being respectively assigned to columns, thereby forming a two-dimensional array of (S+1) rows and h columns, where h is an integer greater than or equal to 2,
   wherein an array element of an ith row and jth column in the two-dimensional array, where i is an integer greater than or equal to 1 and less than or equal to (S+1) and j is an integer greater than or equal to 1 and less than or equal to h, corresponding to a [(j−1)−S+i]th reference voltage, and wherein the decoder includes:
first to (S+1)th subdecoders provided in correspondence with the first to (S+1)th reference voltage groups, the first to (S+1)th subdecoders selecting from the reference voltages of the first to (S+1)th reference voltage groups, reference voltages assigned to a column in the two-dimensional array, the column corresponding to a value of a first bit group on an upper bit side of an input digital signal; and an (S+1)-input and 2-output type subdecoder which receives outputs from the first to (S+1)th subdecoders, and which selects and outputs the first and second voltages, out of the reference voltages selected respectively by the first to (S+1)th subdecoders, in accordance with a value of a second bit group on a lower bit side of the input digital signal.

2. The digital-to-analog converting circuit according to claim 1, wherein the first to (S+1)th reference voltage groups each includes reference voltages corresponding to first to hth columns in the first to (S+1)th rows of the two-dimensional array that correspond to respective reference voltages of the first to (S+1)th reference voltage groups.

3. The digital-to-analog converting circuit according to claim 1, wherein first to (X−1)th reference voltage groups, where X is an integer greater than or equal to 2 and less than or equal to (S+1), each includes reference voltages corresponding to respective reference voltages of second to hth columns in first to (X−1)th rows of the two-dimensional array that correspond to respective reference voltages of the first to (X−1)th reference voltage groups.

4. The digital-to-analog converting circuit according to claim 1, wherein (Y+1)th to (S+1)th reference voltage groups, where Y is an integer greater than or equal to 1 and less than or equal to S, each includes reference voltages corresponding to respective reference voltages of first to (h−1)th columns in (Y+1)th to (S+1)th rows of the two-dimensional array that correspond to respective reference voltages of the (Y+1)th to (S+1)th reference voltage groups.

5. The digital-to-analog converting circuit according to claim 1, wherein:
first to (X−1)th reference voltage groups, where X is an integer greater than or equal to 2 and less than or equal to (S+1), each includes reference voltages corresponding to respective reference voltages of second to hth columns in first to (X−1)th rows of the two-dimensional array that correspond to respective reference voltages of the first to (X−1)th reference voltage groups, and
(Y+1)th to (S+1)th reference voltage groups, where Y is an integer greater than or equal to X and less than or equal to S, each includes reference voltages corresponding to respective reference voltages of first to (h−1)th columns in (Y+1)th to (S+1)th rows of the two-dimensional array that correspond to respective reference voltages of the (Y+1)th to (S+1)th reference voltage groups.

6. The digital-to-analog converting circuit according to claim 1, wherein:
first to Yth reference voltage groups, where Y is an integer greater than or equal to 1 and less than or equal to S, each includes reference voltages corresponding to respective reference voltages of second to hth columns in first to Yth rows of the two-dimensional array that correspond to respective reference voltages of the first to Yth reference voltage groups, (Y+1)th to (X−1)th reference voltage groups, where X is greater than Y and less than or equal to (S+1), each includes reference voltages corresponding to respective reference voltages of second to (h−1)th columns in (Y+1)th to (X−1)th rows of the two-dimensional array that correspond to respective reference voltages of the (Y+1)th to (X−1)th reference voltage groups, and Xth to (S+1)th reference voltage groups each includes reference voltages corresponding to respective reference voltages of first to (h−1)th columns in Xth to (S+1)th rows of the two-dimensional array that correspond to respective reference voltages of the Xth to (S+1)th reference voltage groups.

7. The digital-to-analog converting circuit according to claim 1, wherein the first to (S+1)th subdecoders receive the first bit group of (m−n) bits on an upper side of m-bit digital data as an input, where m is a prescribed positive integer and m>n holds, and select the reference voltages that are assigned to a column in the two-dimensional array which corresponds to a value of the first bit group, and the first to (S+1)th subdecoders output (S+1) or a smaller number of reference voltages, and
wherein the (S+1)-input and 2-output type subdecoder selects and outputs the first and second voltages out of the reference voltages selected by the first to (S+1)th subdecoders, in accordance with a value of the second bit group of n lower order bits of the m-bit digital data.

8. The digital-to-analog converting circuit according to claim 7, wherein the first to (S+1)th subdecoders decode the (m−n) bits on the upper side in order from a lower bit side toward an upper bit side thereof.

9. The digital-to-analog converting circuit according to claim 7, wherein the (S+1)-input and 2-output type subdecoder decodes lower n-bits in order from the most significant bit thereof.

10. The digital-to-analog converting circuit according to claim 1, wherein the amplifying circuit includes first and second input terminals for receiving the first and second voltages selected by the decoder and outputs an output voltage level that is a result of taking a weighted mean of the first and second voltages received at the first and second input terminals.

11. The digital-to-analog converting circuit according to claim 1, wherein the amplifying circuit includes at least first, second and third input terminals for receiving the first and second voltages selected by the decoder and outputs an output voltage level that is a result of taking a weighted mean of the first and second voltages received at the at least first, second and third input terminals.

12. The digital-to-analog converting circuit according to claim 1, further comprising:
at least one separate reference voltage group that includes a plurality of reference voltages having a range different from a range of output voltage levels defined by the first to (S+1)th reference voltage groups; and
a separate decoder that receives the reference voltages of the separate reference voltage group as inputs and that selects third and fourth voltages in accordance with the input digital signal, the separate decoder having an output coupled with the output of the decoder, the amplifying circuit outputting an output voltage level obtained by interpolating the third and fourth voltages.

13. The digital-to-analog converting circuit according to claim 12, wherein among the first to (S+1)th subdecoders, a subdecoder which receives a reference voltage of a maximum level or minimum level among the plurality of reference voltages included in the first to (S+1)th reference voltage groups, receives as an input at least a single-bit signal of the second bit group together with the first bit group.

14. The digital-to-analog converting circuit according to claim 13, wherein the subdecoder which receives the maximum level or minimum reference voltage makes a selection by values of the first bit group after making a selection by the value of the at least single-bit signal of the second bit group.

15. The digital-to-analog converting circuit according to claim 12, wherein the separate reference voltage group includes:
  a plurality of reference voltages corresponding to output levels over a voltage range on a higher side and/or lower side of the voltage range of the output levels defined by the first to (S+1)th reference voltage groups; and
  reference voltages having a 1:1 correspondence with respective reference voltages of the output levels,
  wherein the separate decoder corresponding to the separate reference voltage group selects and outputs the third and fourth voltages of identical levels in accordance with the input digital signal.

16. The digital-to-analog converting circuit according to claim 1, wherein:
  S is made equal to 4 and the plurality of reference voltages are grouped into first to fifth reference voltage groups,
  first to fifth subdecoders are provided in a correspondence with respective reference voltages of the first to fifth reference voltage groups, the third subdecoder is placed adjacent to both of the first and fifth subdecoders, the second and fourth subdecoders are placed adjacent to each other, and
  the (S+1)-input and 2-output type subdecoder comprises a subdecoder for selecting and outputting the first and second voltages out of the reference voltages selected by the first to fifth subdecoders, in accordance with a value of a second bit group on a lower side of the input digital signal.

17. The digital-to-analog converting circuit according to claim 1, wherein:
  S is made equal to 8 and the plurality of reference voltages are grouped into first to ninth reference voltage groups,
  first to ninth subdecoders are provided in correspondence with respective reference voltages of the first to ninth reference voltage groups, the fifth subdecoder is placed adjacent to both of the first and ninth subdecoders, the third and seventh subdecoders are placed adjacent to each other and are placed adjacent to at least one of the first, fifth and ninth subdecoders, the fourth and eighth subdecoders are placed adjacent to each other, the second and sixth subdecoders are placed adjacent to each other and are placed adjacent to at least the fourth or ninth subdecoder, and
  the (S+1)-input and 2-output type subdecoder comprises a subdecoder for selecting and outputting the first and second voltages out of the reference voltages selected by the first to ninth subdecoders, in accordance with a value of a second bit group on a lower side of the input digital signal.

18. A data driver comprising:
the digital-to-analog converting circuit, which is set forth in claim 1, for receiving an input digital signal conforming to an input video signal and outputting a voltage conforming to the input digital signal, the data driver driving data lines by voltages conforming to the input digital signal.

19. A display device comprising:
unit pixels, each of which includes a pixel switch and a display element, provided at intersections of data lines and scan lines, wherein signals on the data lines are written to the display elements via pixel switches that have been turned on by the scan lines; and
the data driver, which is set forth in claim 18, as a data driver for driving the data lines.

20. A display device comprising:
a plurality of data lines extending in parallel with one another along a first direction;
a plurality of scan lines extending in parallel with one another in a direction perpendicular to the first direction;
a plurality of pixel electrodes arranged in a matrix form at intersections of the plurality of data lines and the plurality of scan lines;
a plurality of transistors corresponding to respective ones of the plurality of pixel electrodes, each transistor having a drain and a source, one of which is connected to the corresponding pixel electrode and the other of which is connected to a corresponding data line, and a gate connected to a corresponding scan line;
a gate driver for supplying scan signals to respective ones of the plurality of scan lines; and
a data driver for supplying gray-level signals, which correspond to input data, to respective ones of the plurality of data lines, the data driver comprising the data driver set forth in claim 18.

* * * * *